United States Patent
Kim et al.

(10) Patent No.: US 7,612,573 B2
(45) Date of Patent: Nov. 3, 2009

(54) PROBE SENSING PADS AND METHODS OF DETECTING POSITIONS OF PROBE NEEDLES RELATIVE TO PROBE SENSING PADS

(75) Inventors: Kun-Up Kim, Gyeonggi-do (KR); Chang-Sik Kim, Gyeonggi-do (KR); Doo-Seon Lee, Gyeonggi-do (KR); Jong-Hyoung Lim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 414 days.

(21) Appl. No.: 11/565,471

(22) Filed: Nov. 30, 2006

(65) Prior Publication Data

US 2007/0090851 A1 Apr. 26, 2007

Related U.S. Application Data

(63) Continuation-in-part of application No. 11/131,767, filed on May 17, 2005.

(30) Foreign Application Priority Data

Dec. 2, 2005 (KR) .................. 10-2005-0116768

(51) Int. Cl.
*G01R 31/02* (2006.01)
(52) U.S. Cl. ..................................... 324/763
(58) Field of Classification Search ............. 324/158.1, 324/750–755, 760–765; 439/67, 357, 763, 439/650; 257/797
See application file for complete search history.

(56) References Cited

U.S. PATENT DOCUMENTS 5,065,092 A 11/1991 Sigler (Continued)

FOREIGN PATENT DOCUMENTS

JP 56-114349 9/1981

(Continued)

OTHER PUBLICATIONS

English language abstract of Korean Publication 1996-0043062.

(Continued)

*Primary Examiner*—Ha Tran T Nguyen
*Assistant Examiner*—Trung Q Nguyen
(74) *Attorney, Agent, or Firm*—Marger Johnson & McCollom, P.C.

(57) ABSTRACT

A probe sensing pad used to detect a position of a probe needle includes a probe area, at least two sensing regions contacting peripheral portions of the probe area, sensing elements of different electrical characteristics connected to corresponding sensing regions, and at least one isolation region for electrically insulting the sensing regions. The position of the probe needle relative to the probe sensing pad may be rapidly detected and automatically corrected toward a desired contact site of the probe sensing pad depending upon the voltage measured by a probe needle contacting the probe sensing pad. That is, the measured voltage will have a first value if deflected in a first direction, a second value (different from the first) if deflected in a second direction, and so on. The position of the probe needle can be corrected based on this measurement.

48 Claims, 40 Drawing Sheets

U.S. PATENT DOCUMENTS

| | | | |
|---|---|---|---|
| 5,187,020 A | 2/1993 | Kwon et al. | |
| 5,554,940 A | 9/1996 | Hubacher | |
| 5,969,530 A | 10/1999 | Yamashita | |
| 7,170,189 B2 | 1/2007 | Takahashi et al. | |
| 7,282,940 B2 * | 10/2007 | Hirai | 324/765 |
| 7,492,173 B2 * | 2/2009 | LaMeres et al. | 324/754 |

FOREIGN PATENT DOCUMENTS

| | | |
|---|---|---|
| JP | 08-111431 | 4/1996 |
| JP | 10-189671 | 7/1998 |
| JP | 2002-176140 | 6/2002 |
| KR | 1996-0043062 | 12/1996 |
| KR | 1999-0071141 | 9/1999 |
| KR | 2000-0009264 | 2/2000 |
| KR | 2004-0013255 | 2/2004 |
| KR | 2005-0023706 | 3/2005 |
| KR | 10-2005-0110304 | 11/2005 |

OTHER PUBLICATIONS

English language abstract of Korean Publication No. 1999-0071141.
English language abstract of Korean Publication No. 2000-0009264.
English language abstract of Korean Publication No. 2004-0013255.
English language abstract of Korean Publication No. 2005-0023706.
English language abstract of Japanese Publication No. 08-111431.
English language abstract of Japanese Publication No. 10-189671.
English language abstract of Japanese Publication No. 2002-176140.

* cited by examiner

PROBE SENSING PADS AND METHODS OF DETECTING POSITIONS OF PROBE NEEDLES RELATIVE TO PROBE SENSING PADS

CROSS REFERENCE TO RELATED APPLICATIONS

This application is a continuation-in-part of U.S. patent application Ser. No. 11/131,767, filed on May 17, 2005 the contents of which are incorporated herein by reference in their entirety. This application also claims priority under 35 USC § 119 to Korean Patent Application No. 2005-116768 filed on Dec. 2, 2005, the contents of which are incorporated herein by reference in their entirety.

BACKGROUND OF THE INVENTION

1. Field of the Invention

Example embodiments of the present invention relate to probe sensing pads and methods of detecting contact sites for probe needles using the same. More particularly, example embodiments of the present invention relate to probe sensing pads for detecting whether probe needles making contact with desired contact sites or not, and methods of detecting and correcting positions of probe needles relative to the probe sensing pads.

2. Description of the Related Art

Modern semiconductor devices (or chips) are characterized by increasingly dense circuitry. After forming such chips on a substrate, an electric die sorting (EDS) process is carried out on the chips to electrically inspect for accurate construction of chip structures. Incorrectly formed structures are repaired, if possible, or removed from use.

During the EDS process, probe needles of a probe card are aligned with respective pads on the semiconductor device. Electrical signals are then generated by the chips and transmitted through the pads to respective probe needles. If all signals are received accurately, then the chip has been properly structured, otherwise a problem is detected.

More complex chips require greatly increased pads. Accordingly, to reduce a testing, a plurality of pads of the chips may be simultaneously contacted with probe needles of a probe card during one EDS process. The chance of misalignment increases as the number of simultaneous tests increases. Furthermore, the needles may be required to make contact with the pads several times if multiple tests are required. Therefore, the possibility that the probe needles make precise contact with desired normal contact sites of the pads may be considerably lowered.

When the probe needles of the probe card make contact with edge portions of the pads instead of the desired normal contact sites of the pads, the pads may be damaged by the probe needles and the EDS process may not properly carrier out. Further, abnormal contacts between the probe needles and the edge portions of the pads may not be easily detected by electrical open/short test steps so that probe failures may be continuously generated in successive EDS processes for other chips formed on substrates. When probe failures occur in the EDS processes, normal chips may be damaged. This damage lowers the yield of semiconductor manufacturing processes. Furthermore, misalignment of the probe needles has been traditionally difficult to detect accurately, further decreasing the efficiency of probing and EDS operations.

Accordingly, the need remains for embodiments that more easily and rapidly identifying, and later correcting, probe failures between probe sensing pads and respective probe needles.

SUMMARY OF THE INVENTION

According to one aspect of the present invention, there is provided a probe sensing pad including a probe area, at least two sensing regions and at least one isolation region. The sensing regions make contact with peripheral portions of the probe area. The sensing regions are electrically connected to corresponding sensing elements having different electrical characteristics. The isolation region is positioned between the sensing regions to electrically insulate the sensing regions.

According to another aspect of the present invention, there is provided a probe sensing pad including a probe area, a first sensing member, a second sensing member, a third sensing member, a fourth sensing member, and an isolation member. The probe area makes contact with a probe needle. The probe area has a rectangular shape including a first side, a second side, a third side and a forth side. The first sensing member is provided for detecting whether the probe needle contacts a desired contact site of the probe area or the probe needle deviates from the desired contact site along a first direction. The first sensing member includes a first sensing region making contact with the first side of the probe area, and a first sensing element electrically connected to the first sensing region. The second sensing member is provided for detecting whether the probe needle contacts the desired contact site of the probe area or deviates from the desired contact site along a second direction. The second sensing member includes a second sensing region making contact with the second side of the probe area, and a second sensing element electrically connected to the second sensing region. The third sensing member is provided for detecting whether the probe needle contacts the desired contact site of the probe area or deviates from the desired contact site along a third direction. The third sensing member includes a third sensing region making contact with the third side of the probe area, and a third sensing element electrically connected to the third sensing region. The fourth sensing member is provided for detecting whether the probe needle contacts the desired contact site of the probe area or deviates from the desired contact site along a fourth direction. The fourth sensing member includes a fourth sensing region making contact with the fourth side of the probe area, and a fourth sensing element electrically connected to the fourth sensing region. The isolation member is provided for electrically insulating adjacent sensing regions.

According to still another aspect of the present invention, there is provided a probe sensing pad in a semiconductor device. The probe sensing pad includes a probe area and a sensing member. The probe area makes contact with a probe needle. The probe area has a rectangular shape including a first side, a second side, a third side and a forth side. The sensing member includes sensing regions making contact with the first to the fourth sides of the probe area, and sensing elements electrically connected to the sensing regions. The sensing regions include conductive materials. One of the sensing regions contacting one of the first to the fourth sides is substantially wider than the probe area.

According to a still another aspect of the present invention, there is provided a method of detecting a position of a probe needle relative to a probe sensing pad in a semiconductor device. In the method, a probe needle makes contact with the probe sensing pad. The probe sensing pad includes a probe area, at least two sensing regions making contact with peripheral portions of the probe are, sensing elements having different electrical characteristics and being electrically connected to sensing regions, and an isolation member for electrically insulating adjacent sensing regions. An electrical signal is applied to the probe needle along a forward direction from the probe needle toward a ground end portion of the probe sensing pad. A voltage between the probe needle and the grounded end portion of the probe sensing pad is measured. A position of the probe needle is determined using the measured voltage. The position of the probe needle may be corrected toward a desired contact site of the probe sensing pad.

According to example embodiments of the present invention, after detecting whether a probe needle contacts a desired normal contact site of a probe sensing pad or deviates from the normal contact site, operations and electrical characteristics of chips on a substrate may be advantageously checked in an EDS process. When the probe needle is deflected from the normal contact site of the probe sensing pad along an arbitrary direction, a direction of the probe needle may be detected and may be automatically corrected. Thus, damage to an edge portion of the probe sensing pad caused by the probe needle may be effectively prevented, thereby reducing a failure of the probe sensing pad.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE EMBODIMENTS

Figure 1:
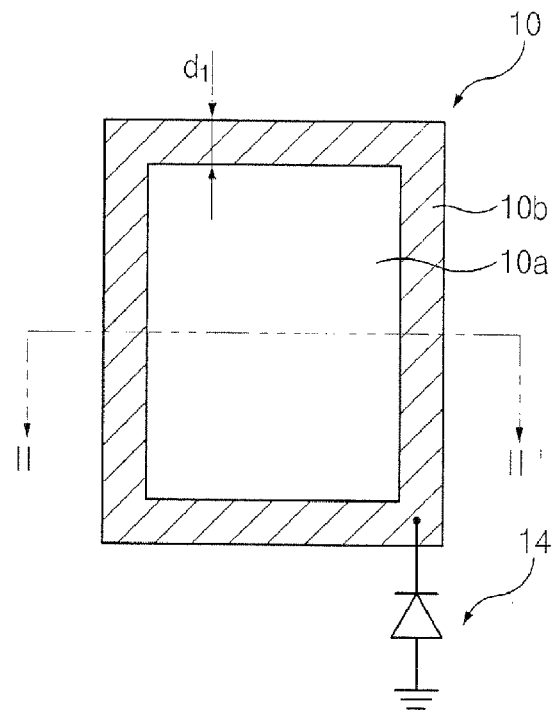
FIG. 1 is a plan view illustrating a probe sensing pad in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skilled in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
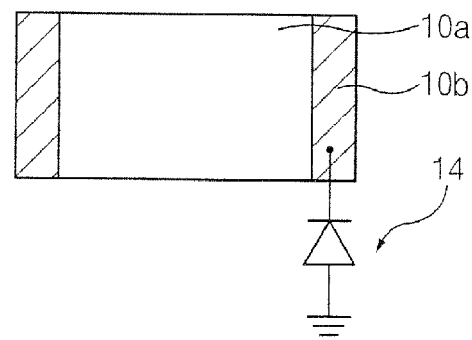
FIG. 2 is a cross sectional view taken along line II-II' in FIG. 1.

FIG. 1 is a plan view illustrating a probe sensing pad 10 in accordance with example embodiments of the present invention. FIG. 2 is a cross-sectional view taken along line II-II' in FIG. 1.

The probe sensing pad 10 includes a rectangular probe area 10*a*. The probe area 10*a* may correspond to an area with which a probe needle normally makes contact. The probe area 10*a* has first sides and second sides substantially shorter than the first sides. The second sides may be substantially perpendicular to the first sides. Particularly, the second sides may be substantially parallel to a sliding direction of a probe needle.

The probe area 10*a* includes an insulation material. The insulation material may include silicon oxide, silicon nitride, etc. When the probe needle makes strongly contact with the probe area 10*a* including silicon nitride, the probe area 10*a* of the probe sensing pad 10 may be broken. Thus, the probe area 10*a* may include silicon oxide.

A sensing region 10*b* borders an edge portion of the probe area 10*a*. Namely, the sensing region 10*b* encloses the edge portion of the probe area 10*a*. The sensing region 10*b* is used for detecting whether the probe needle makes contact with a region beyond the probe area 10*a*. The sensing region 10*b* may include a conductive material such as metal.

The sensing region 10*b* may have a width d1 extending the first and the second sides of the probe area 10*a*. Accordingly, the probe sensing pad 10 including the probe area 10a and the sensing region 10b may have a rectangular shape.

When the probe needle makes contact with the sensing region 10b, a position failure of the probe needle is detected. Thus, when the width d1 of the sensing region 10b is too narrow, the position failure of the probe needle may be insufficiently detected. On the contrary, when the width d1 of the sensing region 10b is too wide, the position failure of the probe needle may be excessively detected. Accordingly, the width d1 of the sensing region 10b may be in a range of about 2 µm to about 20 µm.

Referring to FIG. 2, the probe area 10a and the sensing region 10b have upper faces, respectively, that may be positioned on substantially the same plane.

Figure 3:
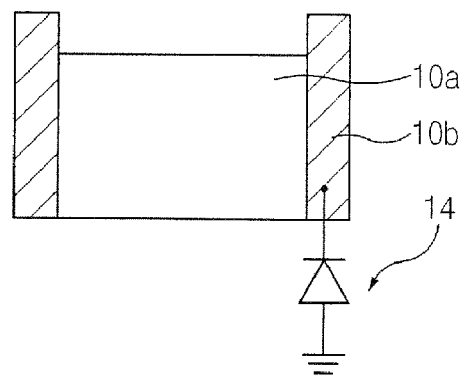
FIGS. 3 and 4 are cross sectional views illustrating the probe sensing pad in FIG. 1 in accordance with other variations.
Figure 4:
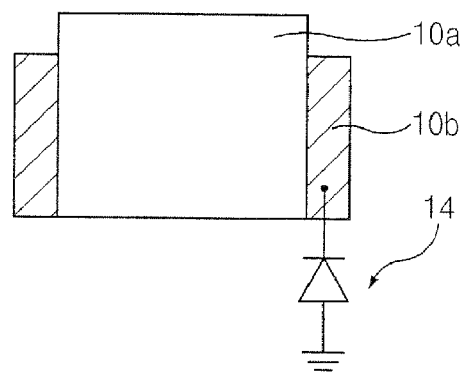

FIGS. 3 and 4 are cross sectional views illustrating the probe sensing pad in FIG. 1 in accordance with other variations.

Referring to FIGS. 3 and 4, stepped portions are formed between the probe area 10a and the sensing region 10b. Namely, as shown in FIG. 3, the sensing region 10b has an upper face higher than that of the probe area 10a. Also, as shown in FIG. 4, the sensing region 10b may have an upper face lower than that of the probe area 10a. Here, the difference between heights of the probe area 10a and the sensing region 10b is restricted within a depth allowing a contact between the probe needle and the probe area 10a or the sensing region 10b.

The sensing region 10b is electrically connected to a sensing circuit 14. The sensing circuit 14 may include a resistor electrically connected to the sensing region 10b and a ground, respectively. Examples of the resistor may be a resistance, a diode, etc. Alternatively, the sensing region 10b may be electrically connected to a ground without being electrically connected to a resistor.

As described above, the sensing region 10b encloses the probe area 10a so that each part of the sensing region 10b is entirely connected to each other part. Therefore, one sensing circuit 14 is electrically connected to the sensing region 10b.

Figure 5:
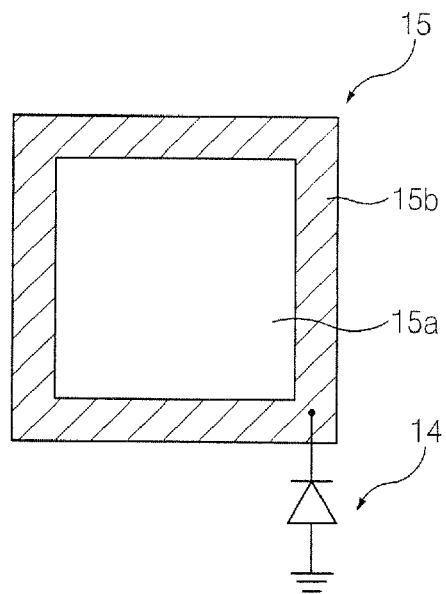
FIG. 5 is a plan view illustrating a probe sensing pad in accordance with example embodiments of the present invention.

FIG. 5 is a plan view illustrating a probe sensing pad 15 in accordance with example embodiments of the present invention. In FIG. 5, the probe sensing pad 15 includes elements substantially the same as those of the probe sensing pad 10 shown in FIG. 1 except for configurations.

The probe sensing pad 15 includes a square probe area 15a. The probe area 15a may correspond to a region with which a probe needle normally makes contact. The probe area 15a includes an insulation material. The insulation material may include silicon oxide, silicon nitride, etc. For example, the probe area 15a may include silicon oxide.

A sensing region 15b borders an edge portion of the probe area 15a. Namely, the sensing region 15b encloses the edge of the probe area 15a. The sensing region 15b is used for sensing whether the probe needle makes contact with a region beyond the probe area 15a. The sensing region 15b may include a conductive material such as metal.

The sensing region 15b may have one or more widths that extend the sides of the probe area 15a. The widths of the sensing region 15b may be substantially the same as, or different from, each other. Namely, the sensing region 15b may have a square shape, as shown in FIG. 5, or a rectangular shape. That is, the sensing region 15b may either form a square periphery about the square probe area 15a, or a rectangular periphery (not shown) about the square probe area 15a.

Figure 6:
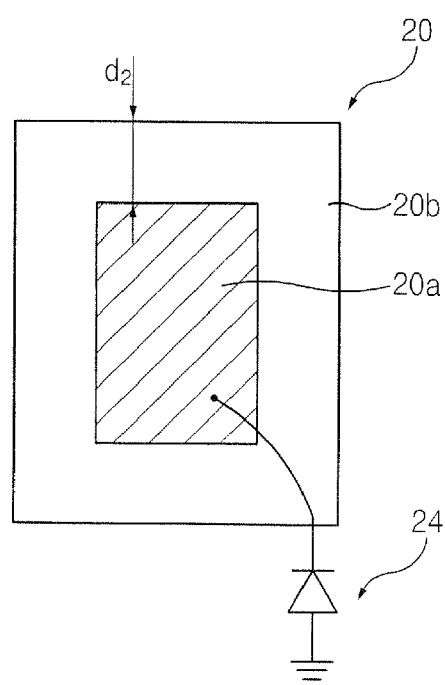
FIG. 6 is a plan view illustrating a probe sensing pad in accordance with example embodiments of the present invention.

FIG. 6 is a plan view illustrating a probe sensing pad 20 in accordance with example embodiments of the present invention.

The probe sensing pad 20 includes a rectangular probe area 20a. Alternatively, the probe sensing pad 20 may have a square shape. The probe area 20a may correspond to a region with which a probe needle normally makes contact. The probe area 20a may include a conductive material such as metal.

A sensing region 20b borders an edge portion of the probe area 20a. Namely, the sensing region 20b encloses the edge portion of the probe area 20a. The sensing region 20b is used for sensing whether the probe needle makes contact with a region beyond the probe area 20a. The sensing region 20b includes an insulation material such as silicon oxide, silicon nitride, etc.

The probe area 20a is electrically connected to a sensing circuit 24. The sensing circuit 24 may include a resistor electrically connected to the probe area 20a and a ground, respectively. Examples of the resistor may be a resistance, a diode, etc. Alternatively, the probe area 20a may be electrically connected to a ground without being electrically connected to a resistor.

When the probe needle makes contact with the sensing region 20b, a position failure of the probe needle is detected. On the contrary, when the probe needle makes contact with the probe area 20a and the sensing region 20b together, the position failure of the probe needle is not detected. Therefore, the sensing region 20b may have a width wider than that of the sensing region 10b shown in FIG. 1.

When the width d2 of the sensing region 20b is too narrow, the position failure of the probe needle may be insufficiently detected. On the contrary, when the width d2 of the sensing region 20b is too wide, the position failure of the probe needle may be excessively detected. Accordingly, the width d2 of the sensing region 20b may be in a range of about 2 µm to about 20 µm.

Figure 7:
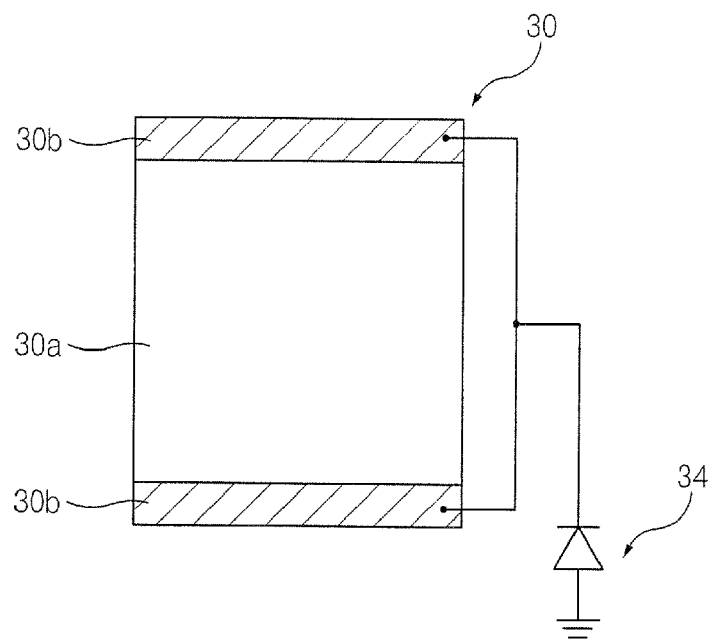
FIG. 7 is a plan view illustrating a probe sensing pad in accordance with example embodiments of the present invention.

FIG. 7 is a plan view illustrating a probe sensing pad 30 in accordance with example embodiments of the present invention.

Referring to FIG. 7, the probe sensing pad 30 includes a rectangular probe area 30a. Alternatively, the probe sensing pad 30 may have a square shape. The probe area 30a has first sides and second sides shorter than the first sides. The second sides are substantially perpendicular to the first sides. Particularly, the second sides may be substantially parallel to a sliding direction of a probe needle.

Two sensing regions 30b border the second sides of the probe area 30a. Alternatively, one sensing region 30b may border any one of the second sides. Also, the sensing regions 30b may border the first sides of the probe area 30a. The sensing regions 30b may have widths of about 2 µm to about 20 µm. Here, a position failure of the probe needle may be frequently generated at the second sides substantially parallel to the sliding direction of the probe needle. Thus, the sensing regions 30b may border the second sides of the probe area 30a. Hereinafter, the sliding direction of the probe needle is referred to as a Y-direction and a direction substantially perpendicular to the Y-direction is referred to as an X-direction.

As shown in FIG. 7, when the sensing regions 30b are formed at the second sides of the probe area 30a, the sensing regions 30b are separated from each other. Thus, after the separated sensing regions 30b are electrically connected to each other, the sensing regions 30b are electrically connected to a sensing circuit 34. Alternatively, the sensing regions 30b may be electrically connected to two separate sensing circuits 34, respectively.

Figure 8:
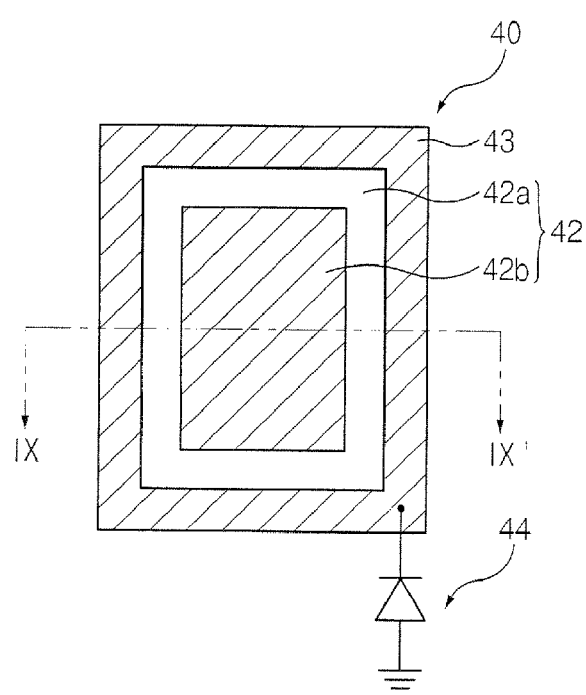
FIG. 8 is a plan view illustrating a probe sensing pad in accordance with example embodiments of the present invention.
Figure 9:
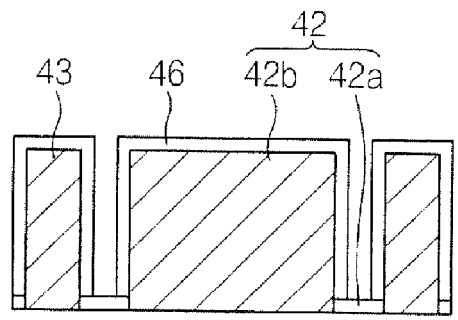
FIG. 9 is a cross sectional view taken along line IX-IX' in FIG. 8.

FIG. 8 is a plan view illustrating a probe sensing pad 40 in accordance with example embodiments of the present invention. FIG. 9 is a cross sectional view taken along line IX-IX' in FIG. 8.

Referring to FIGS. 8 and 9, the probe sensing pad 40 includes a rectangular probe area 42. Alternatively, the probe area 42 may have a square shape. To sense whether a probe needle makes contact with a region beyond the probe area 42, a sensing region 43 borders an edge portion of the probe area 42.

The probe area 42 includes a first region 42a including a first material and a second region 42b including a second material substantially different from, and harder than, the first material. The first material may include an insulation material such as silicon oxide or silicon nitride. The second material may include a metal. The first region 42a borders the sensing region 43. The second region 42b is placed in the first region 42a. Thus, the second region 42b is not contiguous with the sensing region 43. The second region 42b prevents a structure from being damaged under the probe sensing pad 40 due to a contact of the probe needle.

The sensing region 43 may include a conductive material such as metal. The sensing region 43 has a width that extends sides of the probe area 42. The width of the sensing region 43 may be about 2 μm to about 20 cm. The sensing region 43 is electrically connected to a sensing circuit 44.

Referring to FIG. 9, the first region 42a has an upper face lower than that of the second region 42b. A step difference between the upper faces of the first and second regions 42a and 42b may be about 3,000 Å to about 8,000 Å.

The first region 42a has a width that extends sides of the sensing region 43. When the width of the first region 42a is too narrow, the second region 42b is partially detached due to the contact of the probe needle so that a short between the second region 42b and the sensing region 43 may be generated. On the contrary, when the width of the first region 42a is too wide, the probe needle may be damaged. Accordingly, the width of the first region 42a may be in a range of about 2 μm to about 20 μm. Additionally, the upper face of the second region 42b and an upper face of the sensing region 43 may be positioned on a substantially same plane. Furthermore, a protection layer 46 including an insulation material may be formed on the second region 42b and the sensing region 43. The protection layer 46 may have a thickness to be removed by a pressure applied from the probe needle. The thickness of the protection layer 46 may be about 100 Å to about 2,000 Å. The protection layer 46 may include the insulation material substantially the same as that of the first region 42a.

Figure 10:
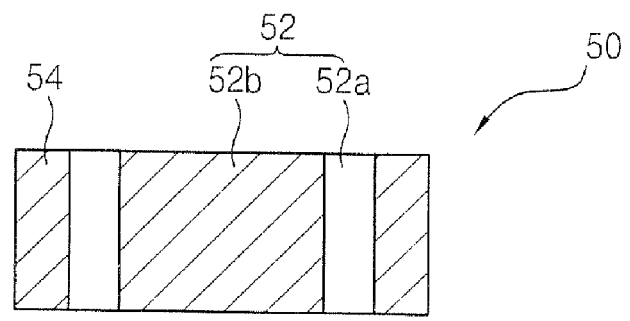
FIG. 10 is a cross sectional view illustrating a probe sensing pad in accordance with example embodiments of the present invention.

FIG. 10 is a cross-sectional view illustrating a probe sensing pad 50 in accordance with example embodiments of the present invention.

The probe sensing pad 50 includes a rectangular probe area 52. Alternatively, the probe area 52 may have a square shape. To sense whether a probe needle makes contact with a region beyond the probe area 52, a sensing region 54 borders an edge portion of the probe area 52.

The probe area 52 has a first region 52a including a first material, and a second region 52b including a second material substantially different from, and harder than, the first material. The first material may include insulation material and the second material may include metal. The first region 52a borders the sensing region 54. The second region 52b is placed in the first region 52a. Thus, the second region 52b is not connected to the sensing region 54.

The first and the second regions 52a and 52b have upper faces that are positioned on a substantially same plane. Namely, a step difference between the upper faces of the first and the second regions 52a and 52b does not exist. Additionally, a protection layer (not shown) including an insulation material may be formed on the first and the second regions 52a and 52b and the sensing region 54. The protection layer may have a thickness to be removed by a pressure applied from the probe needle.

Figure 11:
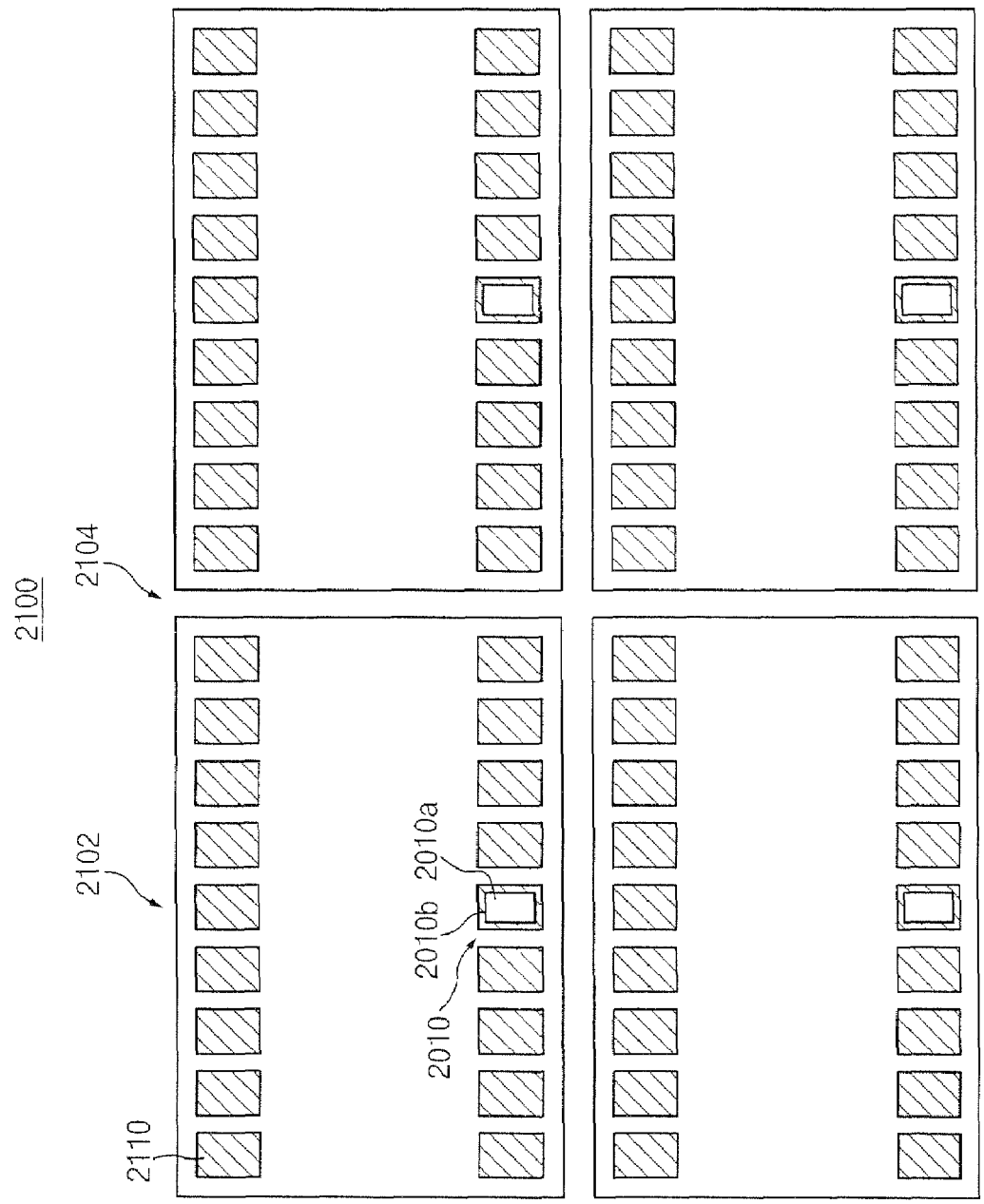
FIGS. 11 to 13 are plan views illustrating a substrate having a semiconductor device in accordance with example embodiments of the present invention.
Figure 12:
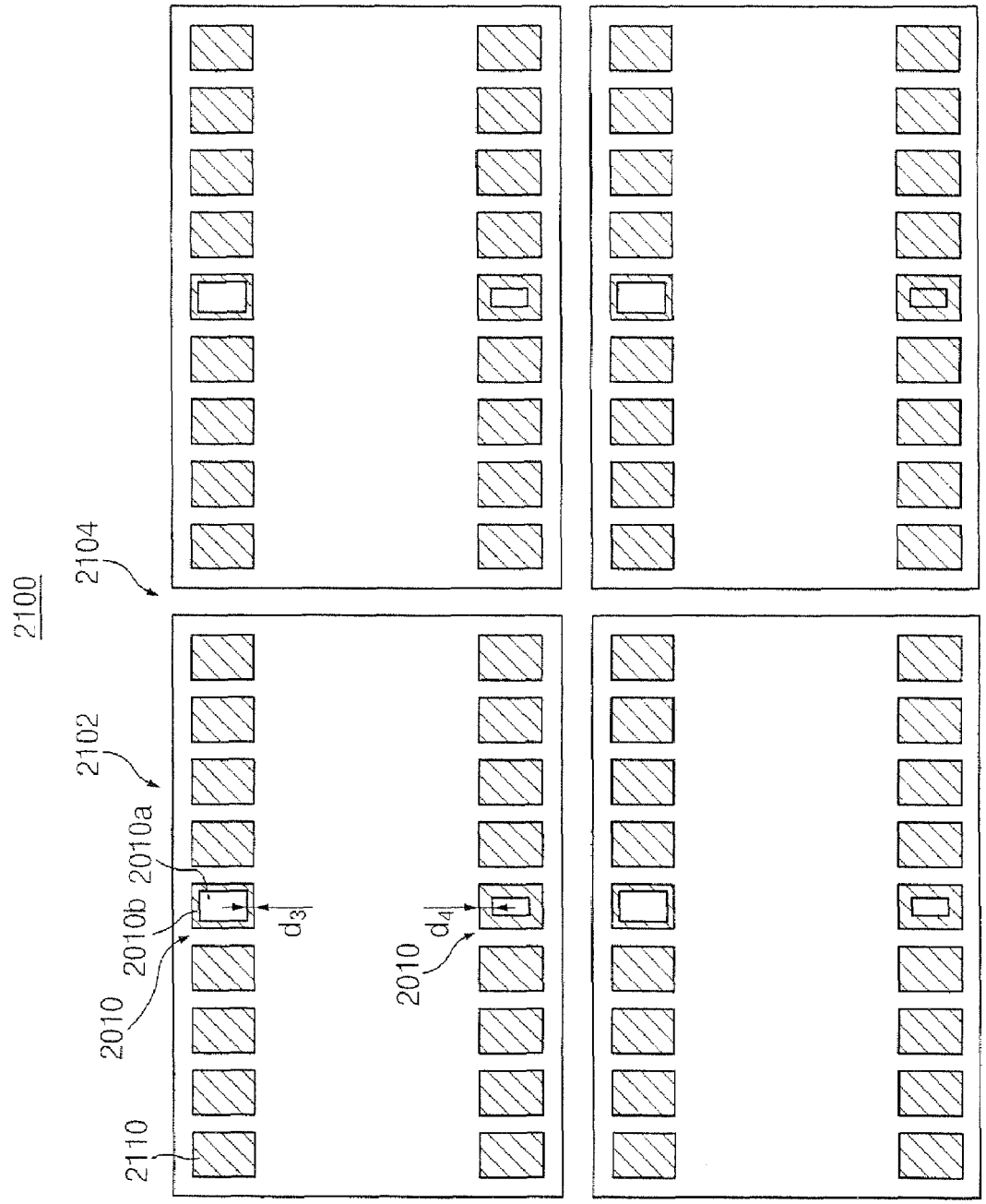
Figure 13:
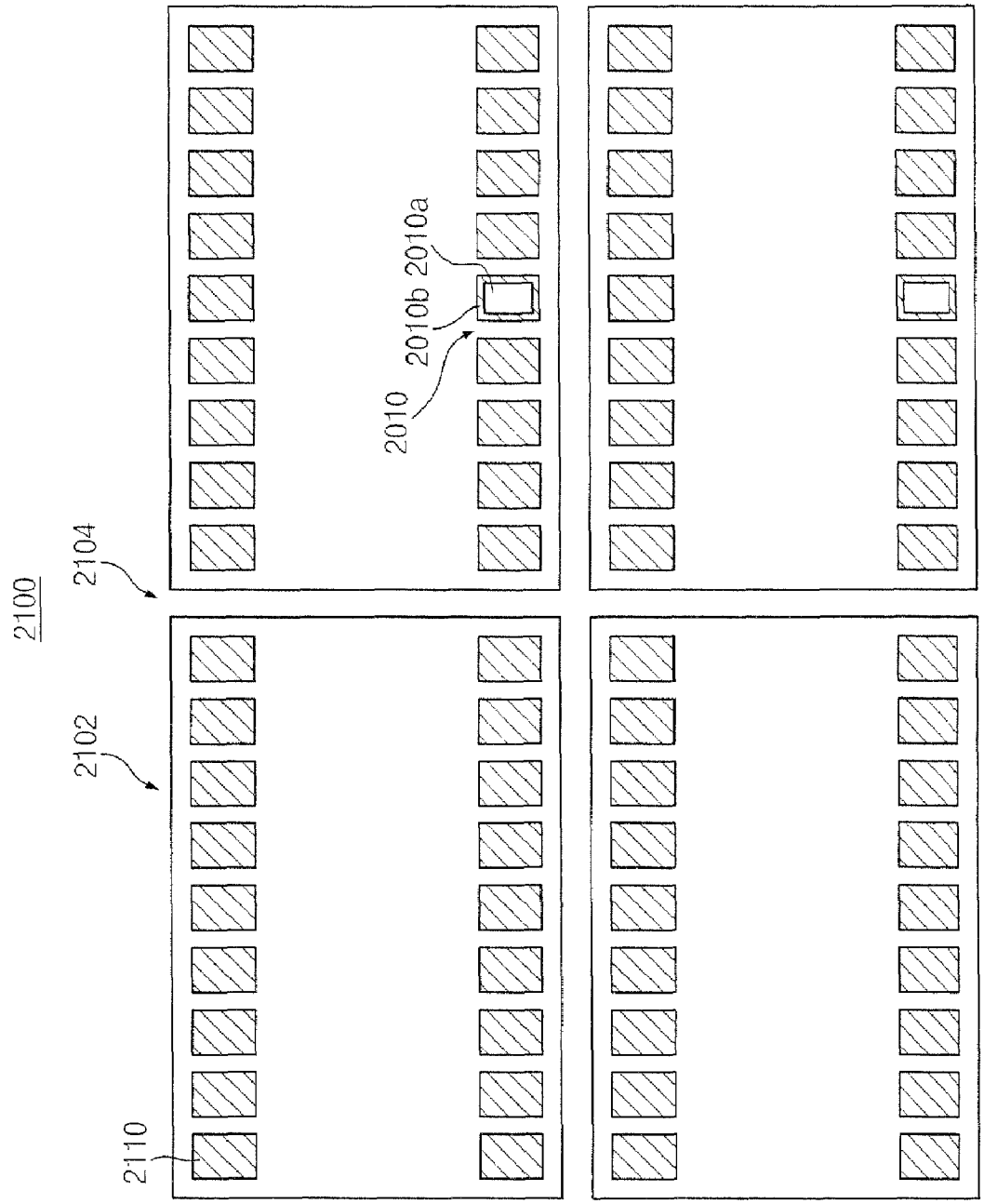
Figure 14:
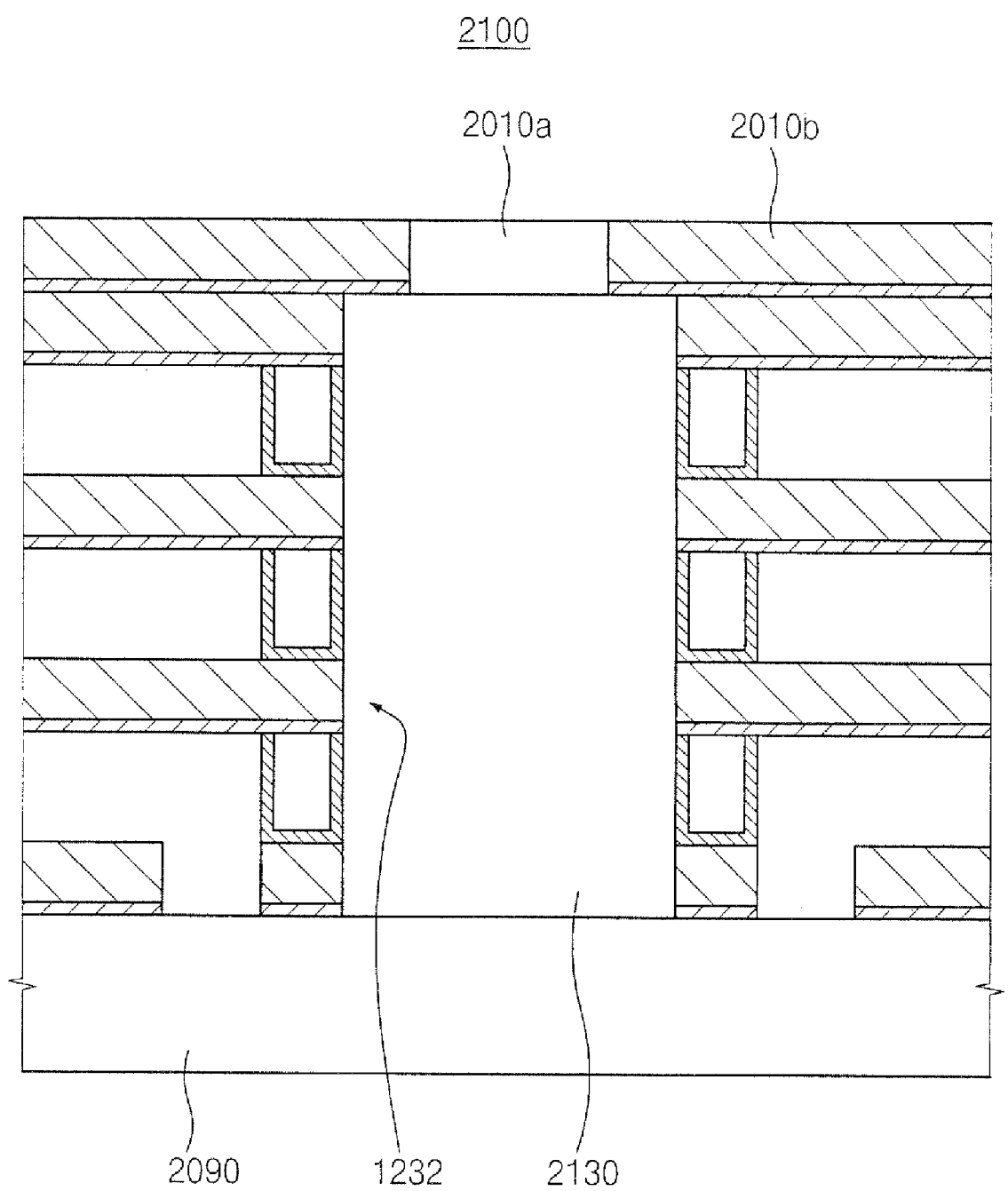
FIG. 14 is a cross sectional view illustrating a second pad of the semiconductor device in FIGS. 11 to 13.

FIGS. 11 to 13 are plan views illustrating a substrate having a semiconductor device in accordance with example embodiments of the present invention. FIG. 14 is a cross sectional view illustrating a second pad of the semiconductor device in FIGS. 11 to 13.

Referring to FIGS. 11 to 14, a substrate 2100 is divided into chip regions 2102 and scribe lanes 2104 between the chip regions 2102. A plurality of semiconductor devices may be formed in the chip regions 2102, respectively.

Structures in each semiconductor device may be formed in the chip regions 2102, respectively. A plurality of first pads 2110 for inputting/outputting data signals into/from the unitary semiconductor device is provided on the structures. The first pads 2110 may include conductive materials. A passivation layer (not shown) for protecting the first pads 2110 may be formed at a periphery of the first pads 2110. Additionally, a protection circuit (not shown) for electrically protecting the first pads 2110 may be electrically connected to the first pads 2110. The protection circuit may include a resistor connected to a ground. Examples of the resistor may be a resistance, a diode, etc.

A second pad 2010, which was introduced in FIG. 1, is formed on the chip region 2102. The second pad 2010 is used for recognizing a normal contact between the first pad 2110 and a probe needle. Particularly, the second pad 2010 includes a probe area 2010a with which the probe needle makes contact, and a sensing region 2010b bordering an edge portion of the probe area 2010a. The sensing region 2010b is used for sensing whether the probe needle makes contact with a region beyond the probe area 2010a. The second pad 2010 is substantially the same as the probe sensing pad in FIG. 1. Thus, any further illustrations of the second pad 2010 are omitted.

A resistor including a sensing circuit that is electrically connected to the second pad 2010 may have a resistance value substantially lower than that of the resistor in the protection circuit. The second pad 2010 does not participate in operations of the semiconductor device. However, the second pad 2010 may be used for recognizing the normal contact of the probe needle. The resistor of the sensing circuit, with the relatively low resistance value, increases measurement sensitivity with respect to any position failure of the probe needle.

The first and the second pads 2110 and 2010 may have substantially the same configurations. The second pad 2010 may be arranged parallel to the first pad 2110. The second pad 2010 may be provided to only a single semiconductor device, respectively, as shown in FIG. 11. Alternatively, the second pad 2010 may be provided to a group including at least two semiconductor devices.

As shown in FIG. 12, two or more second pads 2010 are provided to the single semiconductor device. When a plurality of second pads 2010 is provided to the single semiconductor device, the second pads 2010 may occupy a large area on the semiconductor device, although capacity for sensing an electrical signal is increased. Additionally, any one of the second pads 2010 may have a width d3. The rest of the second pads 10 may have a width d4 substantially wider than the width d3. Therefore, an accurate position on the first and the second pads 2110 and 2010 with which the probe needle makes contact may be obtained. Particularly, when the second pads 2010 including the sensing regions 2010b that have different widths are provided to the single semiconductor device, the probe needles make contact with the second pads 2010, respectively. Here, the probe needles may make contact with the probe areas 2010a or the sensing regions 2010b. Alternatively, any one of the probe needles may make contact with the sensing region 2010b having the width d4 in the second pad 2010 having the width d4 and the rest of the probe needles may make contact with the probe area 2010a of the second pad 2010 that includes the sensing region 2010b having the width d3. Therefore, the position on the first and second pads 2110 and 2010 with which the probe needle makes contact may be indirectly recognized by using the contact between the probe needle and the probe area 2010a or the sensing region 2010b in accordance with the different widths.

As shown in FIG. 13, only single second pad 2010 is provided to the group, including two semiconductor devices. Therefore, the number of the second pads 2010 provided to the substrate is reduced. As a result, the number of signal channels of a tester, which is configured to be electrically connected to the second pads 2010, may be decreased.

Referring to FIG. 14, only an insulation layer pattern 2130 including silicon oxide is formed between a lower face of the probe area 2010a in the second pad 2010 and a lower bulk substrate 2090. When a structure is formed under the lower face of the probe area 2010a, the structure may be damaged by the contact between the second pad 2010 and the probe needle.

A barrier pattern 2132 is formed at sides of the insulation layer pattern. The barrier pattern 2132 prevents the probe needles from inserting into structures at a periphery of the insulation layer pattern 2130. Thus, the barrier pattern 2132 may include a material such as metal substantially harder than the insulation layer pattern 2130.

Figure 15:
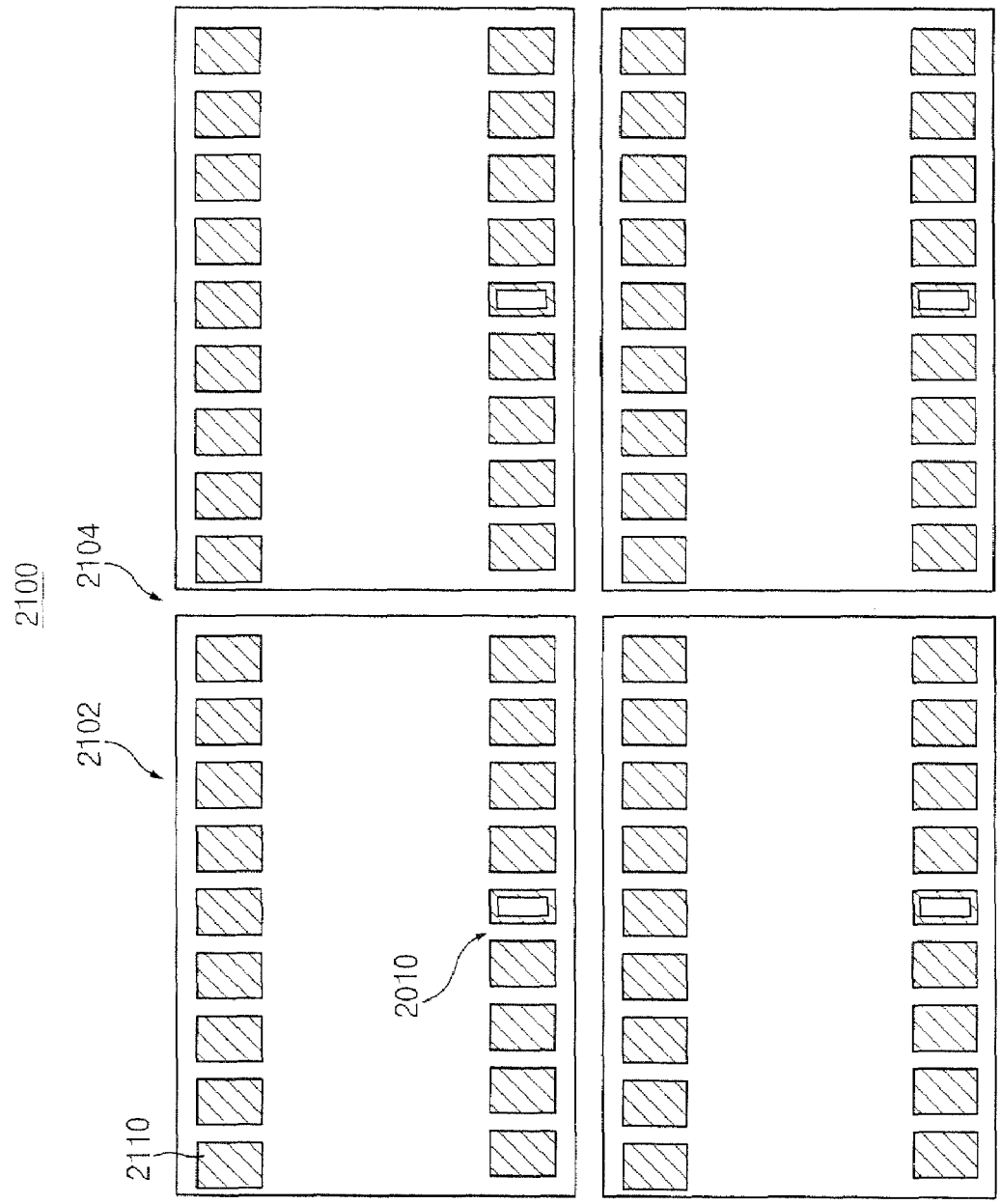
FIG. 15 is a plan view illustrating a substrate having a semiconductor device in accordance with example embodiments of the present invention.

FIG. 15 is plan view illustrating a substrate having a semiconductor device in accordance with example embodiments of the present invention. In FIG. 15, the substrate may include elements substantially the same as to those of the substrate shown in FIG. 13 except sizes of a second pad 2010. Thus, the same reference numerals refer to same elements and any further illustrations of the same elements are omitted.

Referring to FIG. 15, the second pad 2010 includes second sides that are substantially parallel to a sliding direction of a probe needle. The second sides of the second pad 2010 may have a length substantially the same as that of second sides of the first pad 2110. Additionally, first sides of the second pad 2010 substantially perpendicular to the second sides may have a length substantially shorter than that of first sides of the first pad 2110. The second pad 2010 may occupy a relatively small area on the substrate.

Figure 16:
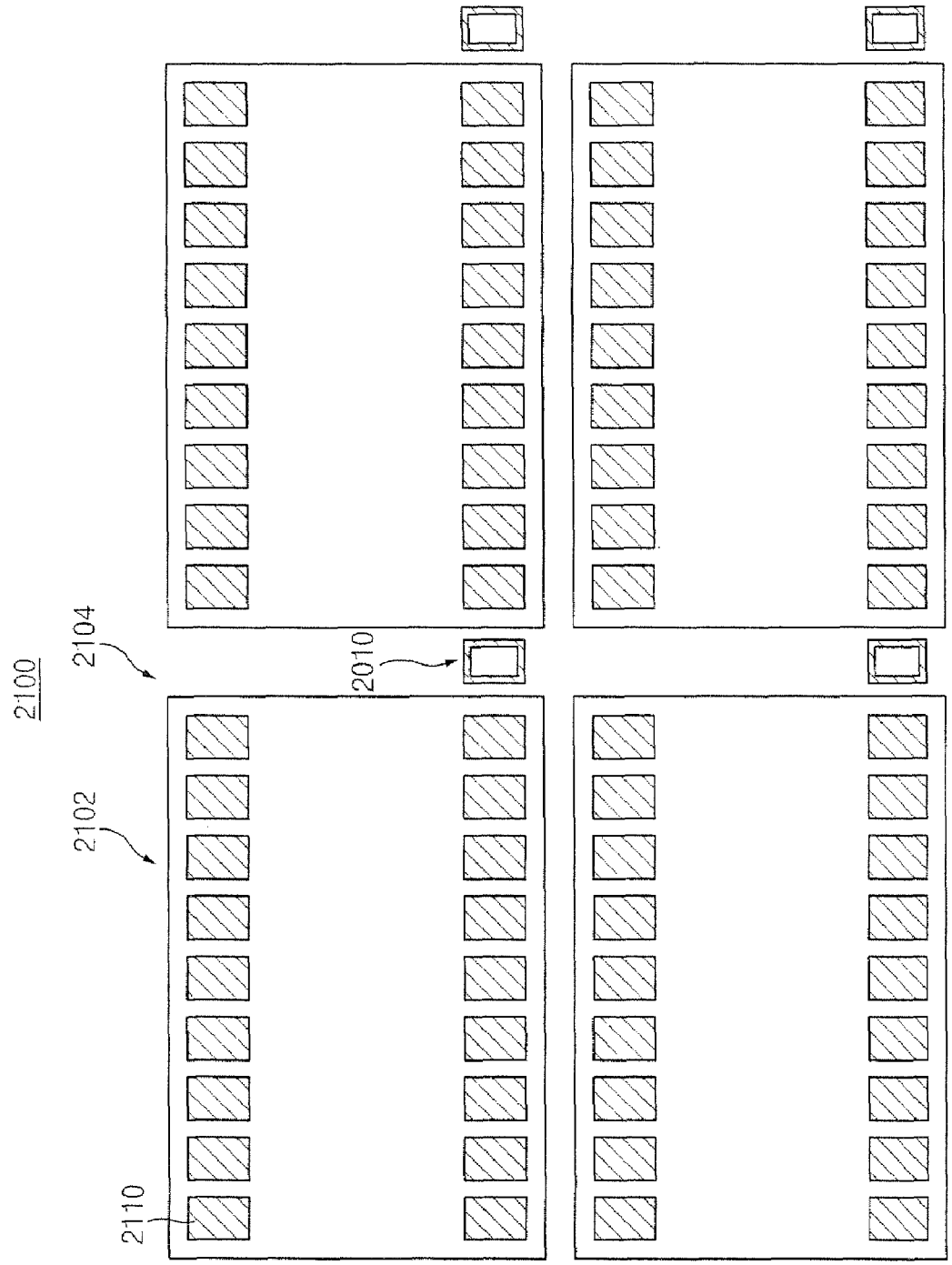
FIGS. 16 to 18 are plan views illustrating a substrate having a semiconductor device in accordance with example embodiments of the present invention.
Figure 17:
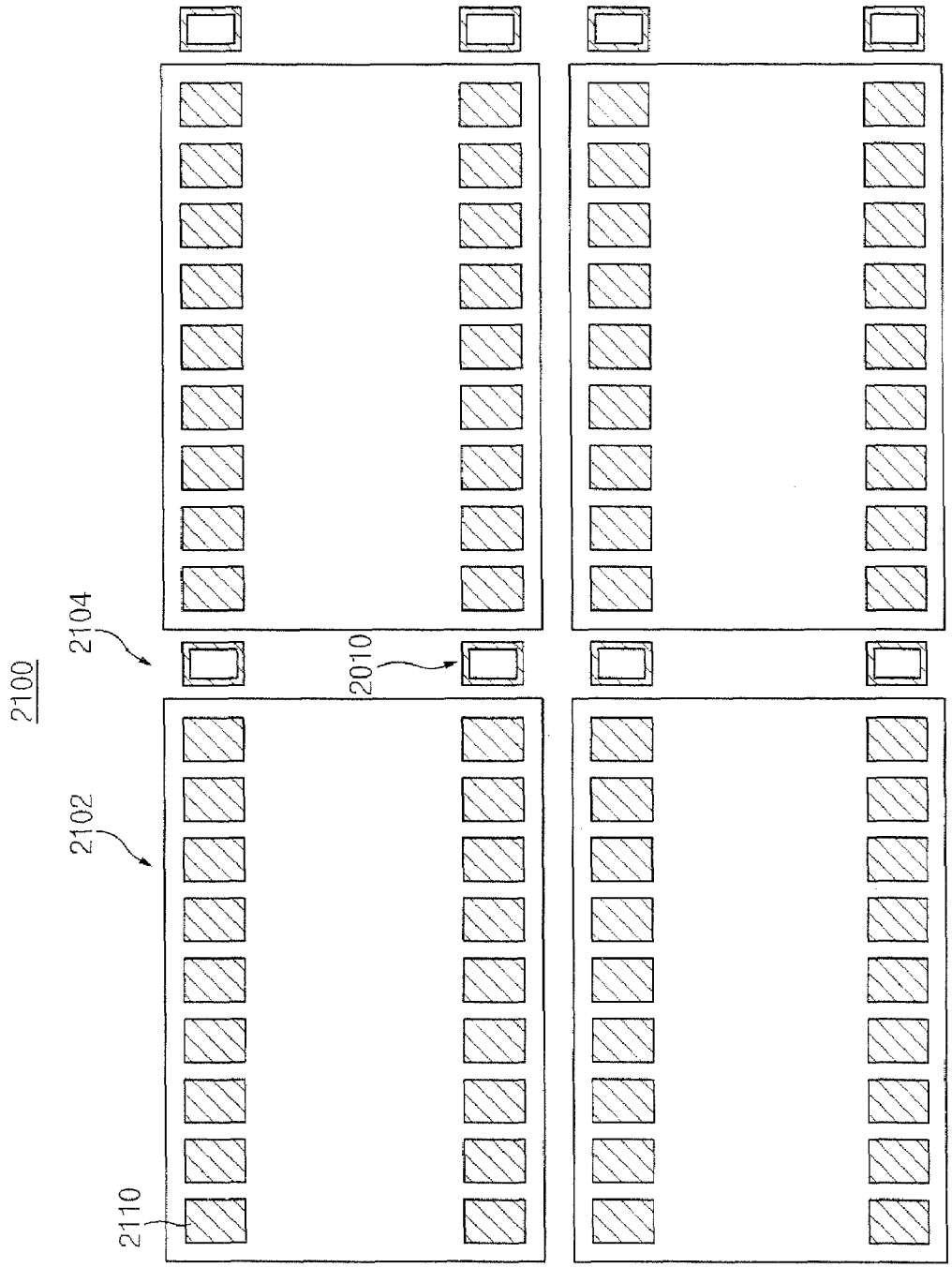
Figure 18:
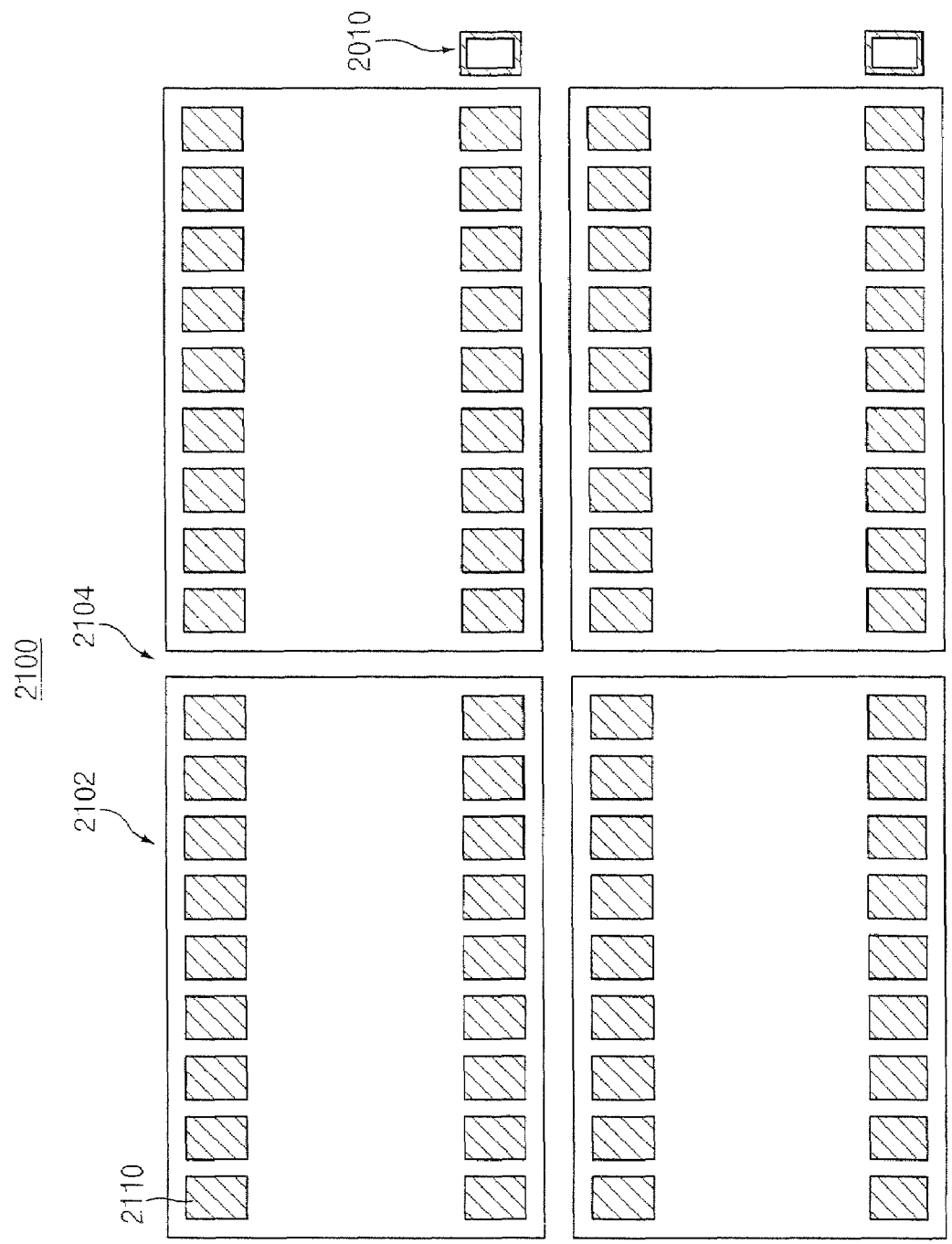

FIGS. 16 to 18 are plan views illustrating a substrate having a semiconductor device in accordance with example embodiments of the present invention. In FIGS. 16 to 18, the substrate may include elements substantially the same as those of the substrate shown in FIG. 13 except for position of a second pad 2010. Thus, same reference numerals refer to same elements and any further illustrations of the same elements are omitted.

A substrate 2100 is divided into chip regions 2102 and scribe lanes 2104 between the chips regions 2102. A plurality of semiconductor devices (not shown) is formed in the chip regions 2102, respectively.

A plurality of first pads 2110 for inputting/outputting data signals into/from each of the semiconductor devices is provided on the semiconductor devices. The first pads 2110 include a conductive material. A protection circuit (not shown) for electrically protecting the first pads 2110 may be electrically connected to the first pads 2110. The protection circuit includes a resistor connected to a ground.

The second pad 2010 is formed on the scribe lanes 2104. The second pad 2010 is used for recognizing a normal contact between the first pad 2110 and a probe needle. The second pad 2010 includes a probe area 2010a with which the probe needle makes contact, and a sensing region 2010b bordering an edge portion of the probe area 2010a. The sensing region 2010b is used for sensing whether the probe needle makes contact with a region beyond the probe area 2010a. The second pad 2010 may be substantially the same as that of the probe sensing pad shown in FIG. 1. Thus, any further illustrations of the second pad 2010 are omitted.

The second pad 2010 may be arranged parallel to the first pads 2110. The second pad 2010 may have a configuration and a size substantially the same as those of the first pads 2110. Single second pad 2010 may be arranged on the scribe lane 2104 that is positioned between adjacent two semiconductor devices. Alternatively, a single second pad 2010 may be arranged on the scribe lane 2104 that is positioned between groups including at least one semiconductor device.

Referring to FIG. 16, a single second pad 2010 is arranged on the scribe lane 2104 between two semiconductor devices.

As shown in FIG. 17, a plurality of second pads 2010 is arranged on the scribe lane 2104 between two semiconductor devices.

Referring to FIG. 18, a pair of second pads 2010 is arranged on the scribe lane 2104 between the groups including one semiconductor device.

In some example embodiments of the present embodiment, when the second pad 2010 is arranged on the scribe lane 2104, an area of the chip region is not reduced due to the second pad 2010. Additionally, the substrate may be sawed along the scribe lane 2104 so that a final semiconductor device may have an original configuration.

Figure 19:
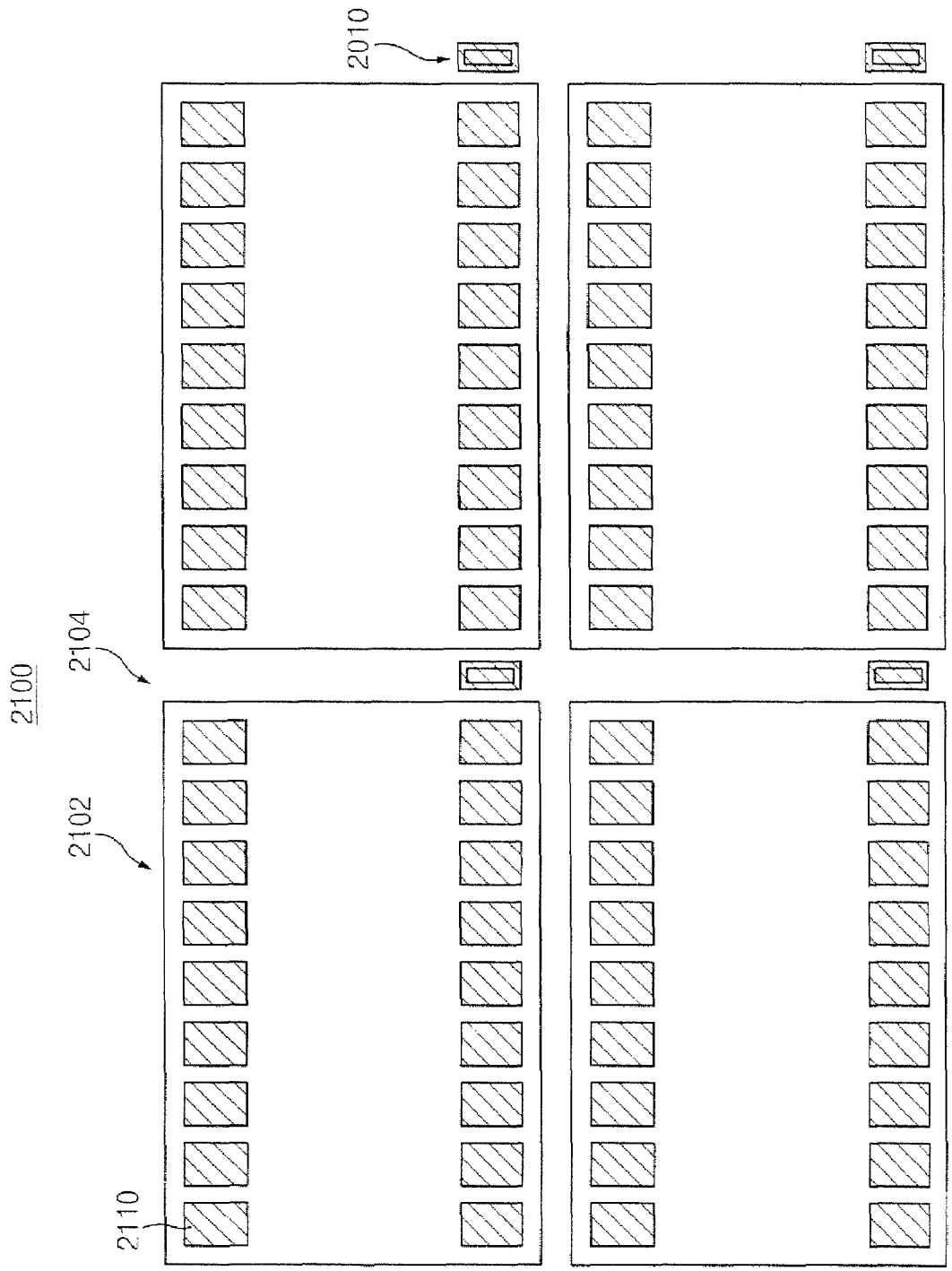
FIG. 19 is a plan view illustrating a substrate having a semiconductor device in accordance with example embodiments of the present invention.

FIG. 19 is plan view illustrating a substrate having a semiconductor device in accordance with example embodiments of the present invention. In FIG. 19, the substrate may include elements substantially the same as those of the substrate shown in FIGS. 16 to 18 except for sizes of a second pad 2010. Thus, same reference numerals refer to same elements and any further illustrations of the same elements are omitted.

Referring to FIG. 19, the second pad 2010 includes second sides that are substantially parallel to a sliding direction (Y-direction) of a probe needle. The second sides of the second pad 2010 have a length substantially identical to that of second sides of the first pad 2110. Additionally, first sides of the second pad 2010 that are substantially parallel to an X-direction that is substantially perpendicular to the Y-direction may have a length shorter than that of first sides of the first pad 2110.

The substrate in FIG. 19 may be employed if a length of the scribe lane 2104 in the X-direction is shorter than that of first sides of the first pad 2110.

Figure 20:
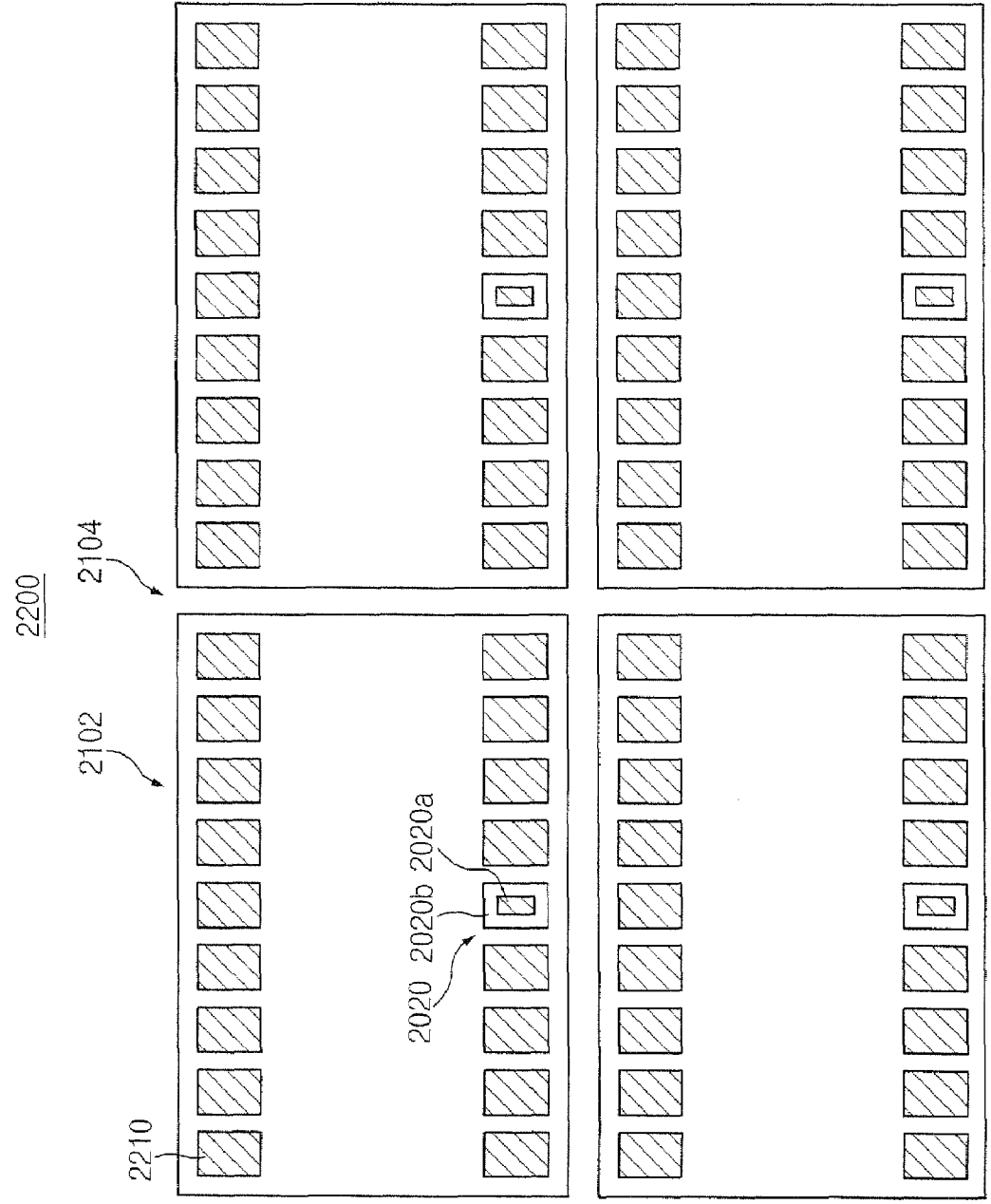
FIG. 20 is a plan view illustrating a substrate having a semiconductor device in accordance with example embodiments of the present invention.
Figure 21:
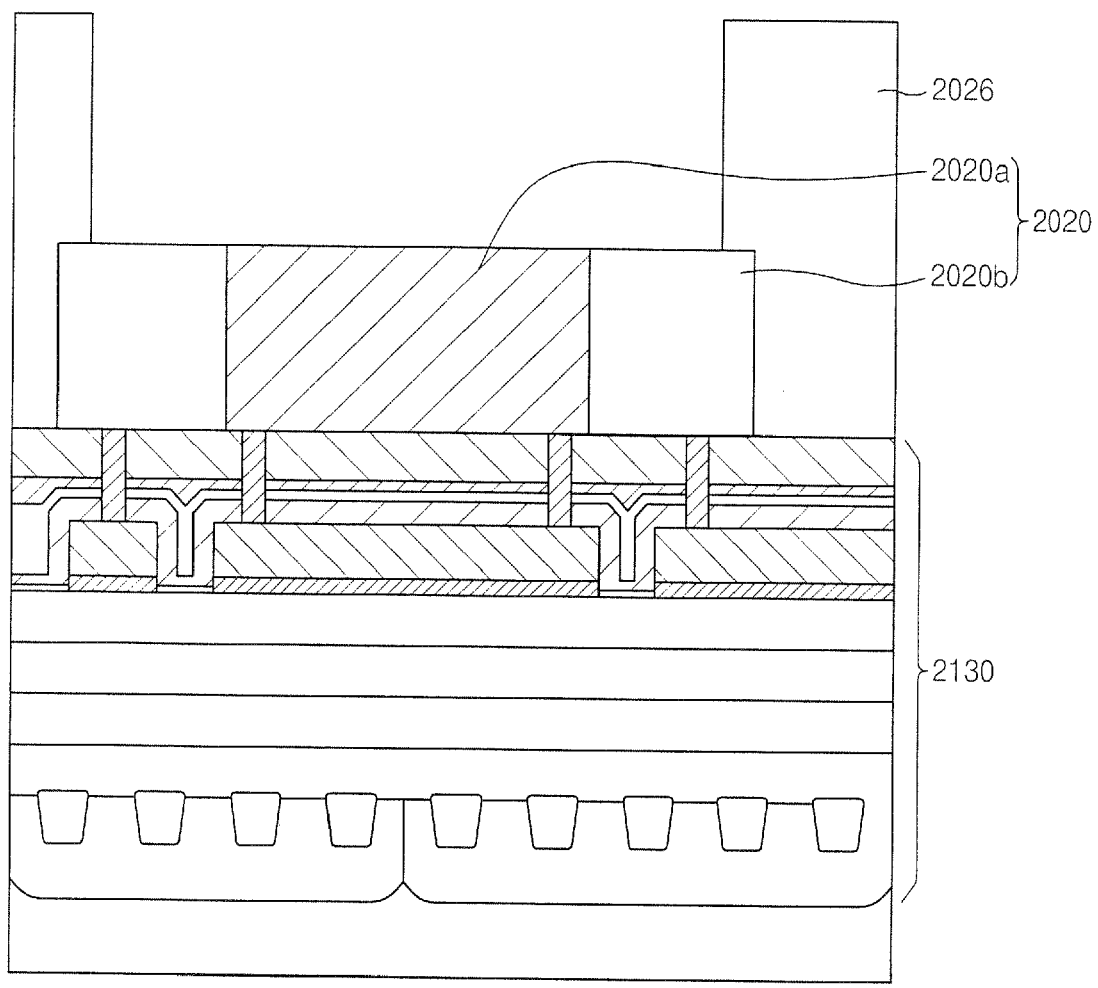
FIG. 21 is a cross sectional view illustrating a second pad of the semiconductor device in FIG. 20.

FIG. 20 is a plan view illustrating a substrate having a semiconductor device in accordance with example embodiments of the present invention. FIG. 21 is a cross-sectional view illustrating a second pad of the semiconductor device in FIG. 20.

Referring to FIGS. 20 and 21, a substrate 2100 is divided into chip regions 2102 and scribe lanes 2104 between the chip regions 2102. A plurality of semiconductor devices is formed in the chip regions 2102, respectively.

Structures 2130 in the single semiconductor device are formed in the chip regions 2102, respectively. A plurality of first pads 2210 for inputting/outputting data signals into/from the single semiconductor device is provided on the structures.

The first pads 2210 may include conductive materials. A passivation layer (not shown) for protecting the first pads 2210 is formed at a periphery of the first pads 2210. Additionally, a protection circuit (not shown) for electrically protecting the first pads 2210 may be electrically connected to the first pads 2210. The protection circuit may include a resistor connected to a ground. Examples of the resistor may be a resistance, a diode, etc.

A second pad 2020 is formed on the chip region 2102. The second pad 2020 is used for recognizing a normal contact between the first pad 2210 and a probe needle. Particularly, the second pad 2020 includes a probe area 2020a with which the probe needle makes contact, and a sensing region 2020b bordering an edge portion of the probe area 2020a. The sensing region 2020b is used for sensing whether the probe needle makes contact with a region beyond the probe area 2020a. The second pad 2020 may be substantially the same as that of the probe sensing pad shown in FIG. 6. Thus, any further illustrations of the second pad 2020 are omitted.

Referring to FIG. 21, the structures 2130 are formed between a lower face of the probe area 2020a and the substrate 2100. Since the probe area 2020a may include conductive material harder than an insulation material, the structures 2130 may not be damaged by the probe needle. A passivation layer 2026 including polyimide is formed at peripheries of the first and the second pads 2210 and 2020. Alternatively, a conductive pattern (not shown) or an insulation pattern (not shown) in place of the structures 2130 may be formed between the probe area 2020a and the substrate 2100.

The first and the second pads 2210 and 2020 may have substantially the same configurations and sizes. Alternatively, the second pad 2020 may have sides in the Y-direction substantially the same as those of the first pad 2210.

The second pad 2020 is arranged on the chip region 2102. Each second pad 2020 may be arranged on each of the semiconductor devices. Alternatively, the second pad 2020 may be arranged on a group including at least one semiconductor device.

The second pad 2020 may be arranged on the scribe lane 2104. A single second pad 2020 is arranged on the scribe lane 2104 between two semiconductor devices. The second pad 2020 may be arranged on the scribe lane 2104 between groups including at least one semiconductor device.

Figure 22:
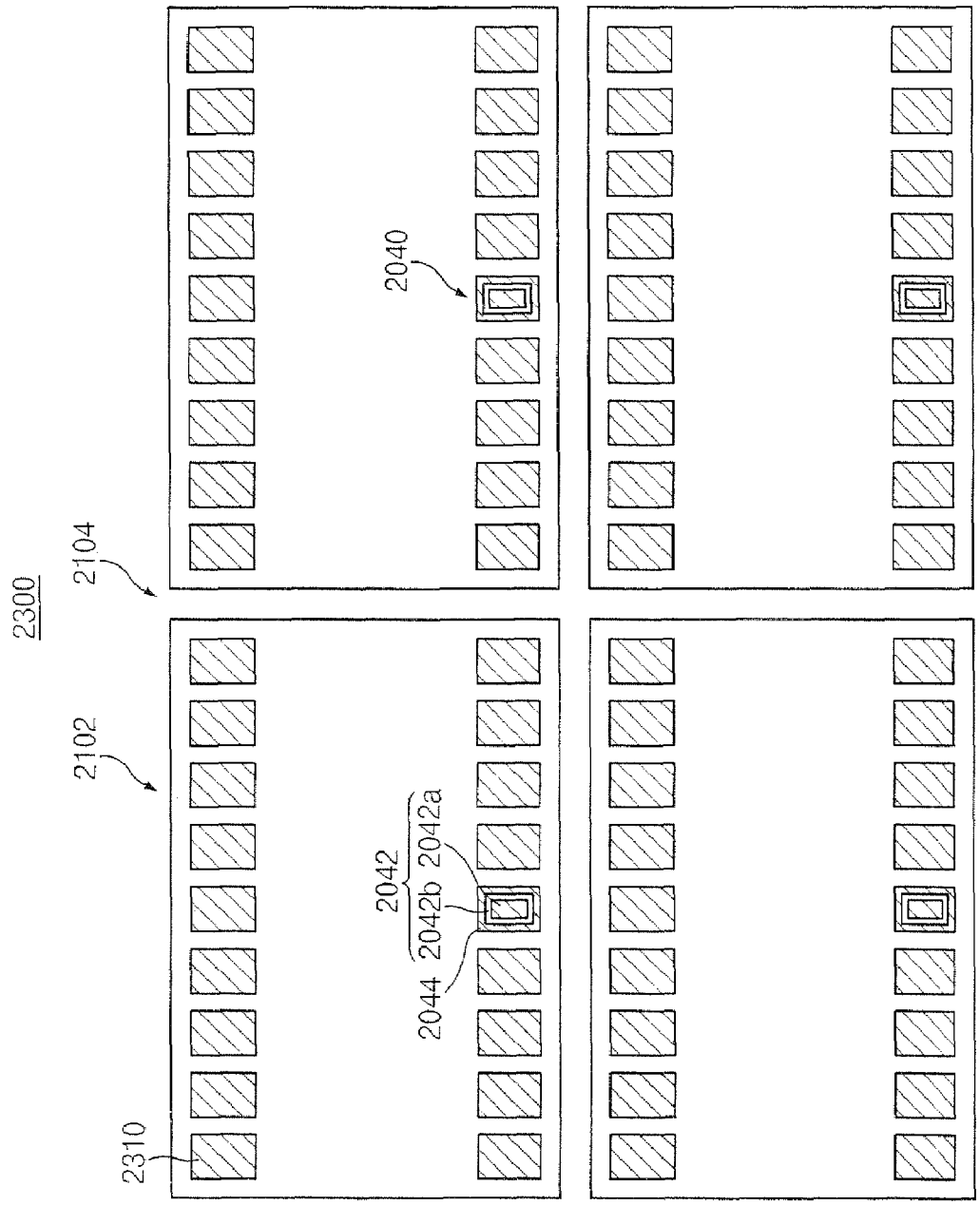
FIG. 22 is a plan view illustrating a substrate having a semiconductor device in accordance with example embodiments of the present invention.
Figure 23:
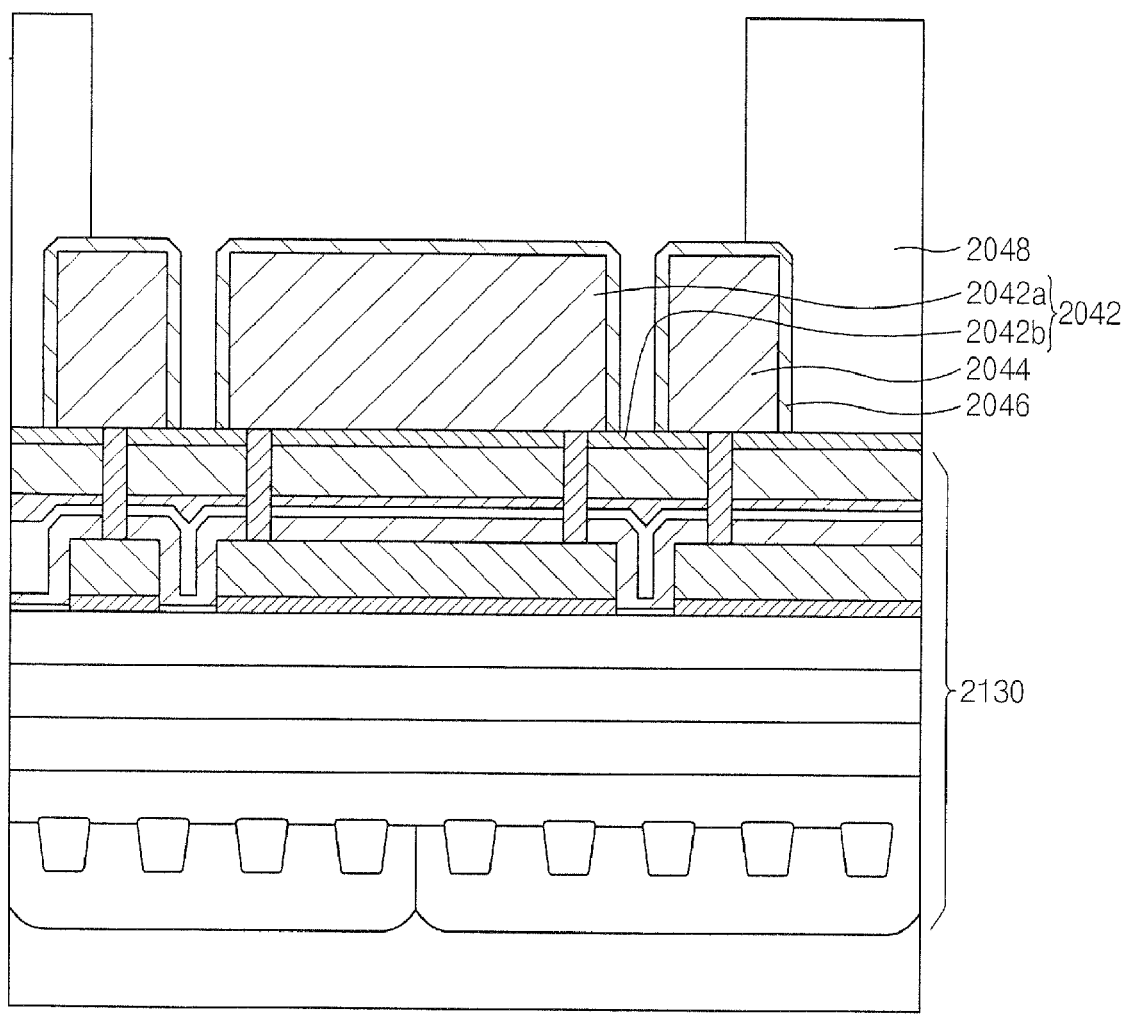
FIG. 23 is a cross sectional view illustrating a second pad of the semiconductor device in FIG. 22.

FIG. 22 is a plan view illustrating a substrate having a semiconductor device in accordance with example embodiments of the present invention. FIG. 23 is a cross-sectional view illustrating a second pad of the semiconductor device in FIG. 22.

Referring to FIGS. 22 and 23, a substrate 2100 is divided into chip regions 2102 and scribe lanes 2104 between the chip regions 2102. A plurality of semiconductor devices is formed in the chip regions 2102, respectively.

A plurality of first pads 2310 for inputting/outputting data signals into/from each of the semiconductor devices is provided on the chip regions 2102, respectively. The first pads 2310 include conductive materials. Additionally, a protection circuit (not shown) for electrically protecting the first pads 2310 may be electrically connected to the first pads 2310. The protection circuit may include a resistor connected to a ground.

A second pad 2040 for recognizing a normal contact between the first pad 2310 and a probe needle includes a probe area 2042 with which the probe needle makes contact, and a sensing region 2044 bordering an edge portion of the probe area 2042. The sensing region 2044 is used for sensing whether the probe needle makes contact with a region beyond the probe area 2042. The second pad 2040 may be substantially the same as the probe sensing pad shown in FIG. 8. Thus, any further illustrations of the second pad 40 are omitted.

Referring to FIG. 23, structures 2130 are formed between a lower face of the probe area 2042 and the substrate 2100. Since the probe area 2042 may include a conductive material substantially harder than an insulation material, the structures 2130 may not be damaged due to the probe needle. A passivation layer 2048 including polyimide is formed at peripheries of the first and the second pads 2310 and 2040.

Alternatively, a conductive pattern (not shown) or an insulation pattern (not shown) in place of the structures 2130 may be formed between the probe area 2042 and the substrate 2100.

The first and the second pads 2310 and 2040 may have substantially the same configurations and sizes. Alternatively, the second pad 2040 may have sides in the Y-direction substantially the same as to those of the first pad 2210.

The second pad 2040 is arranged on the chip region 2102. Each second pad 2040 is arranged on each of the semiconductor devices. Alternatively, the second pad 2040 may be arranged on a group including at least one semiconductor device.

The second pad 2040 may be arranged on the scribe lane 2104. A single second pad 2040 may be arranged on the scribe lane 2104 between two semiconductor devices. Additionally, the second pad 2040 may be arranged on the scribe lane 2104 between groups including at least one semiconductor device.

Figure 24:
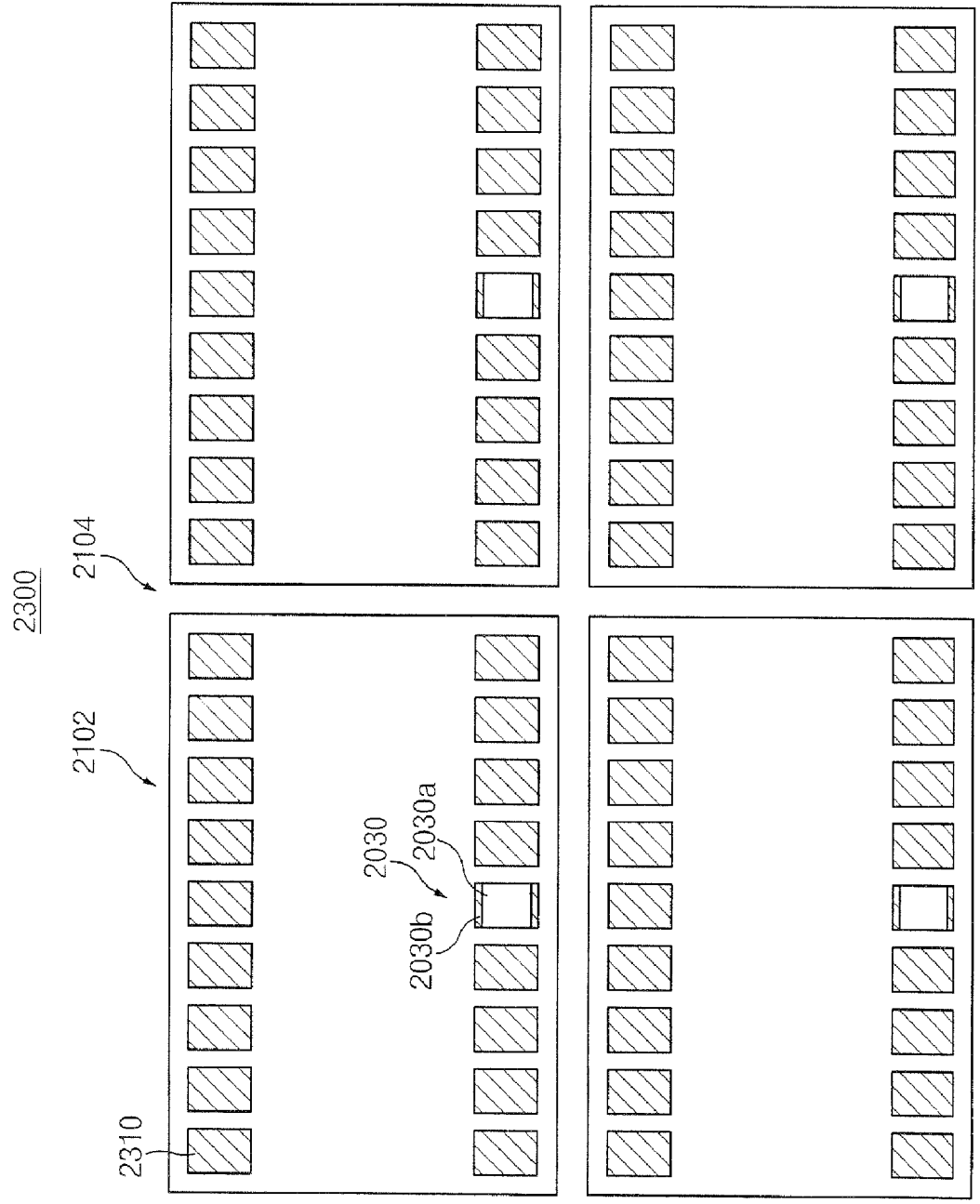
FIG. 24 is a plan view illustrating a substrate having a semiconductor device in accordance with example embodiments of the present invention.

FIG. 24 is a plan view illustrating a substrate having a semiconductor device in accordance with example embodiments of the present invention. In FIG. 24, a second pad 2030 may be substantially the same as that described with reference to FIG. 7. Thus, same reference numerals refer to same elements and any further illustrations of the same elements are omitted.

The second pad 2030 is arranged on the chip region 2102. Each second pad 2030 is arranged on each of the semiconductor devices. Alternatively, the second pad 2030 may be arranged on a group including at least one semiconductor device.

The second pad 2030 may be arranged on the scribe lane 2104. A single second pad 2030 may be arranged on the scribe lane 2104 between two semiconductor devices. Additionally, the second pad 2030 may be arranged on the scribe lane 2104 between groups including at least one semiconductor device.

Hereinafter, methods of testing a semiconductor device on the substrates according to example embodiments will be illustrated in detail.

When semiconductor devices are constituted on a semiconductor substrate, the semiconductor devices are electrically tested by an EDS process. In the EDS process, probe needles make contact with pads on each of the semiconductor devices to input/output a signal into/from the pads.

Generally, the probe needle has a tip making contact with the pad. The tip may have an "L" shape. Thus, a contact area between the probe needle and the pad may vary in accordance with an inclined angle of the tip. Here, when the inclined angle of the tip is relatively small or when the probe needle is not aligned with the probe sensing pad, the probe sensing pad may be damaged if the probe needle makes contact with an edge of the probe sensing pad that is parallel to a sliding direction of the probe needle. Therefore, a process for determining whether the probe needle normally makes contact with the probe sensing pad is included in a process for testing the semiconductor device.

Figure 25:
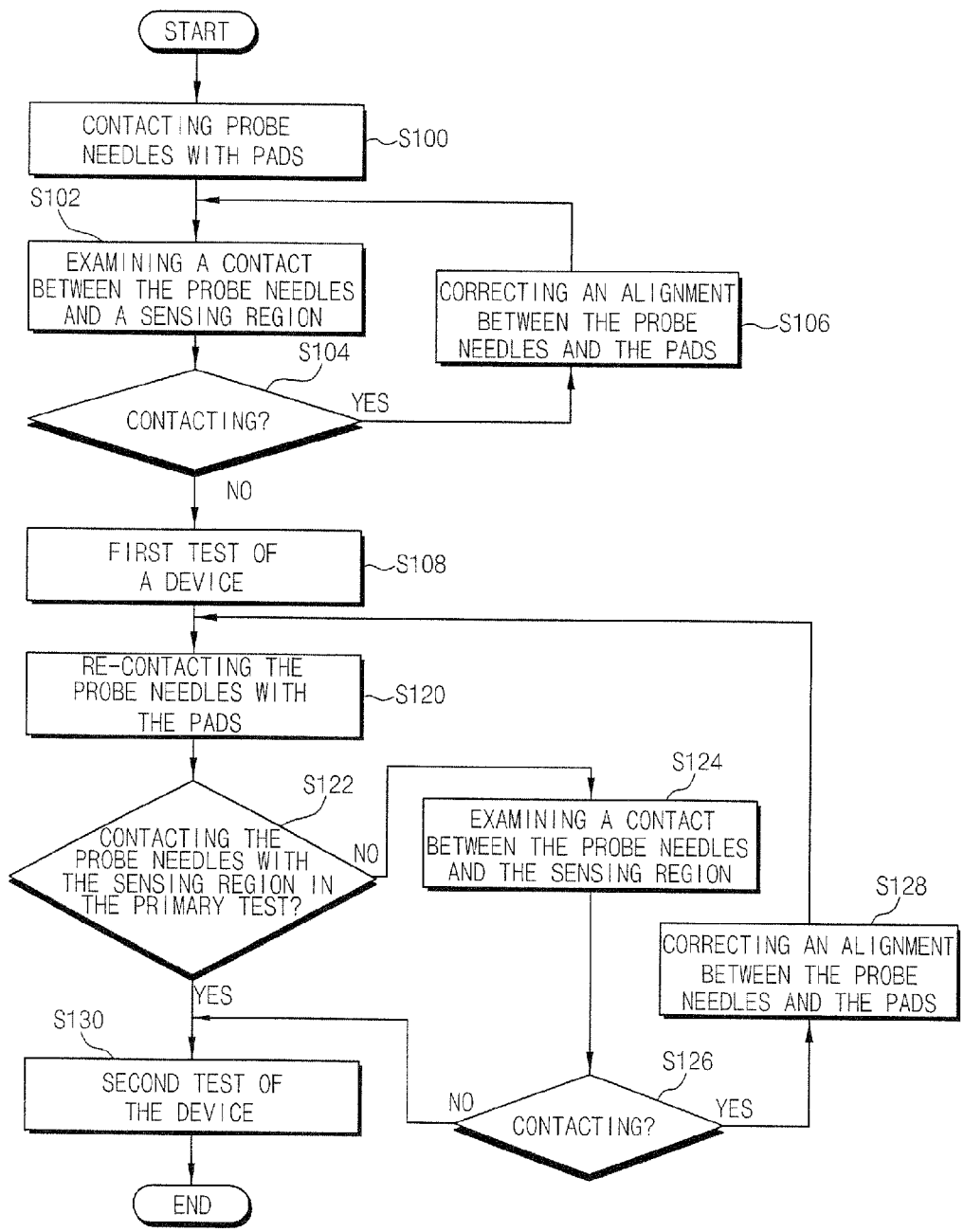
FIG. 25 is a flow chart illustrating a method of testing a semiconductor device in accordance with example embodiments of the present invention.
Figure 27:
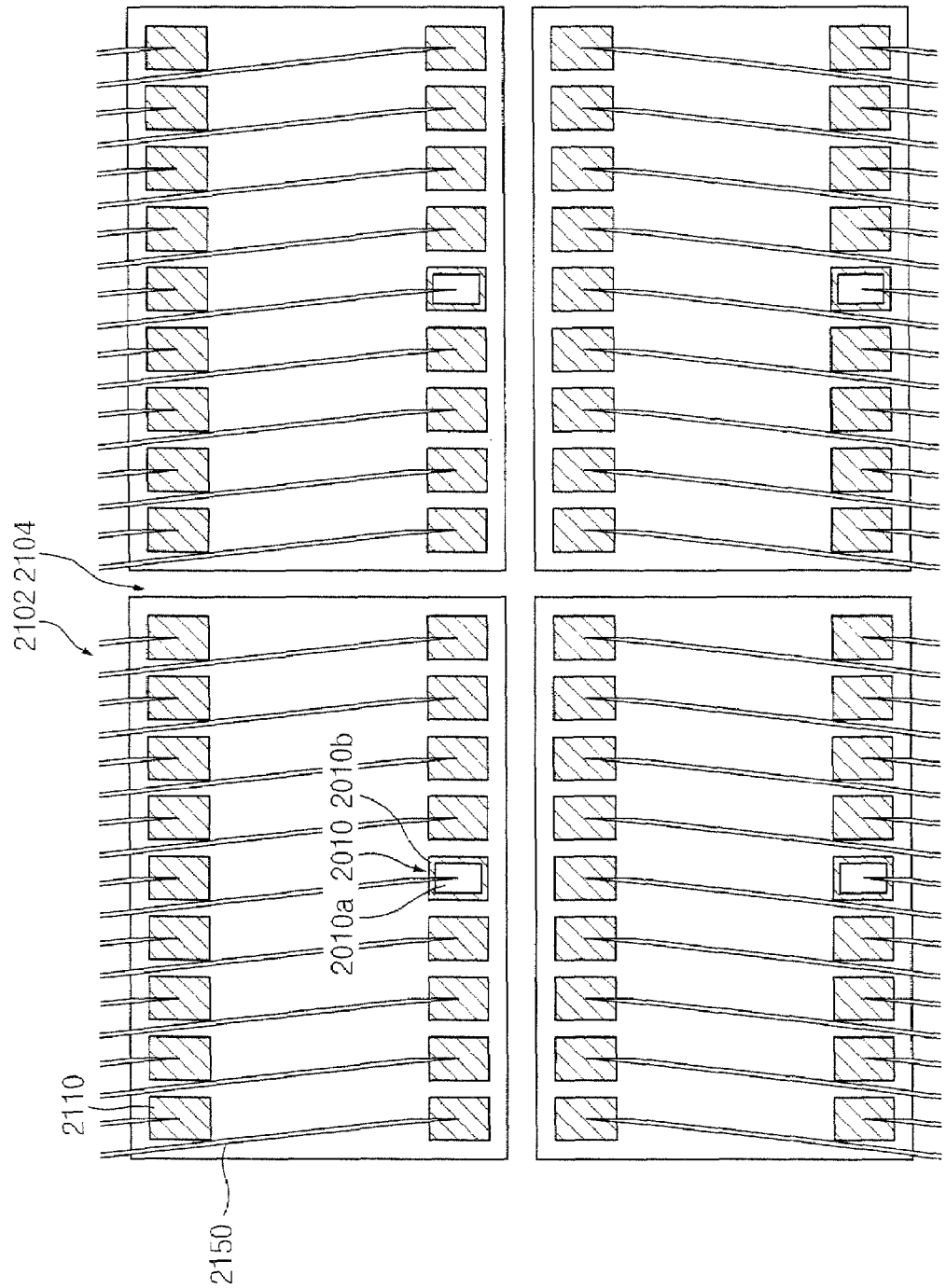
FIG. 27 is a plan view illustrating a contact between a semiconductor device and a probe card.

FIG. 25 is a flow chart illustrating a method of testing a semiconductor device in accordance with example embodiments of the present invention. FIG. 27 is a plan view illustrating a contact between a semiconductor device and a probe card.

Referring to FIGS. 25 and 27, in step S100, the probe needles 2150 make contact with the first pads 2110 for inputting/outputting data signals into/from the semiconductor device and the second pads 2010, including the probe area 2010a and the sensing region 2010b at the edge portion of the probe area 2010a, respectively. Particularly, a probe card having the probe needles 2150 is aligned with the substrate. The probe needles 2150 then make contact with the first and second pads 2110 and 2010, respectively. Here, the probe needles 2150 simultaneously make contact with the first and the second pads 2110 and 2010 in each of the semiconductor devices, so that each of the semiconductor devices is simultaneously tested by a following process.

In step S102, a determination is made as to whether or not there is a contact between the probe needles 2150 and the sensing region 2010b. Particularly, a current is selectively provided to the second pad 2010 through the probe needles 2150. A voltage at the second pad 2010 is then measured. Here, a voltage due to the probe needles 2150 making contact with the probe area 2010a is quite different from a voltage due to the probe needles 2150 making contact with the sensing region 2010b. A voltage range to be measured when the probe needles 2150 make contact with the probe area 2010a is set. When a measured voltage is beyond the voltage range, the contact between the probe needles 2150 and the sensing region 2010b is recognized. Here, when any one among the measured voltages is beyond the voltage range, the contact between the probe needles 2150 and the probe sensing pad is determined to be abnormal.

When the current is selectively provided to the second pad 2010 through the probe needles 2150, the current may be provided to the second pad using separate channels for inputting/outputting an electrical signal. However, if the number of channels is less than the number of second pads 2010, then a channel for inputting/outputting the electrical signal into/from any one among the first pads 2110 may be commonly used for providing the current to more than one second pad 2010.

In an example embodiment of the present invention, the voltage may be measured after the current is provided. On the contrary, the current may be measured after the voltage is applied to test the position failure of the probe needle.

If an abnormal contact between the probe needles 2150 and the sensing region 210b is determined in step S104, then an alignment between the probe card and the first and the second pads 2110 and 2010 is corrected in step S106. To correct the alignment, the probe needles 2150 are separated from the first and the second pads 2110 and 2010. The probe needles 2150 are again aligned with the first and the second pads 2110 and 2010. On the contrary, if it is determined that the probe needles 2150 make a normal contact with the probe area 2010a, and not the sensing region 2010b, then a first test is performed on the semiconductor in step S108. Here, the first test may include a wafer burn-in test, a pre-laser test, a post-laser test, etc.

When the first test is completed, the probe needles 2150 are separated from the first and the second pads 2110 and 2010. Additionally, after the first test is completed, a laser repair process or a second test may be further performed. To perform the laser repair process or the second test, the probe card is aligned with the first and the second pads 2110 and 2010. In step S120, the probe needles 2150 again make contact with the first and the second pads 2110 and 2010.

In step S122, it's determined if there is a contact between the probe needles 2150 and the sensing region 2010b during the first test. When the probe needles 2150 make contact with the sensing region 2010b, the sensing region 2010b may be damaged or deformed. Thus, when the probe needles 2150 make contact with the sensing region 2010b in the first test, the result of testing the positions of the probe needles 2150 may not be reliable.

When the probe needles 2150 make contact with the sensing region 2010b in the first test, the process for determining the contact between the probe needles 2150 and the sensing region 2010b may be omitted. In step S130, a second test is carried out. On the contrary, when the probe needles 2150 normally make contact with the probe area 2010a, in step S124, the probe needles 2150 making contact with the sensing region 2010b is examined.

In the step S130, when the contact between the probe needles 2150 and the probe area 2010a is recognized, the second test is carried out. However, when the contact between the probe needles 2150 and the sensing region 2010b is recognized, in step S128, an alignment between the probe card and the pads 2110 and 2010 is corrected. In steps S120 and S122, the probe needles 2150 again make contact with the pads 2110 and 2010 and then the tests are repeatedly performed.

Figure 26:
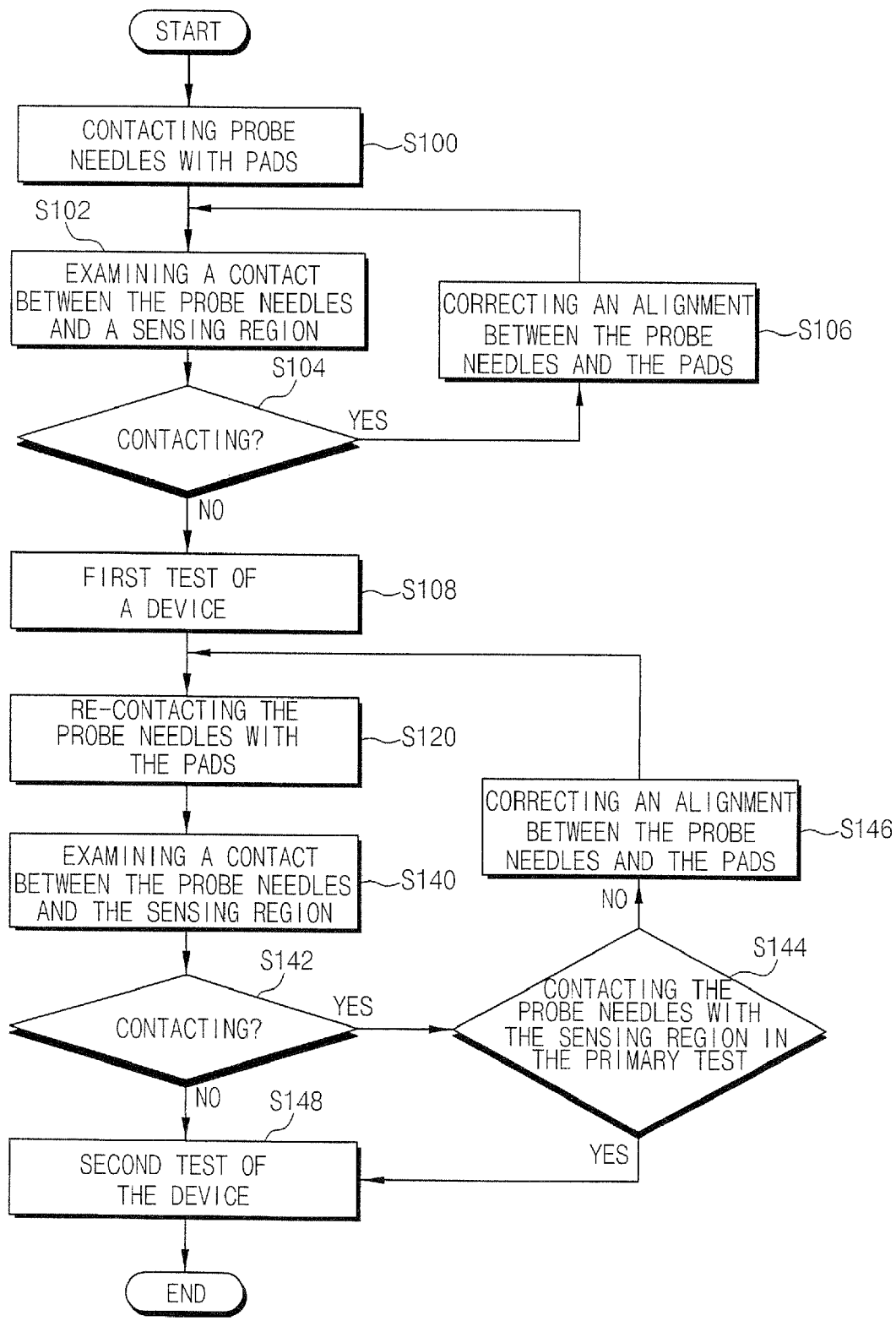
FIG. 26 is a flow chart illustrating a method of testing a semiconductor device in accordance with example embodiments of the present invention.

FIG. 26 is a flow chart illustrating a method of testing a semiconductor device in accordance with example embodiments of the present invention. In FIG. 26, the method may include processes substantially the same as those until the first test, illustrated with reference to FIG. 25, is completed.

When the first test illustrated with reference to FIG. 25 is completed, the probe needles 2150 are separated from the first and second pads 2110 and 2010. Additionally, after the first test is completed, the laser repair process or the second test may be performed. To perform the laser repair process or the second test, the probe card is aligned with the first and the second pads 2110 and 2010. In step S120, the probe needles 2150 again make contact with the first and the second pads 2110 and 2010.

In step S140, a contact between the probe needles 2150 and the sensing region 2010b in the first test is recognized. In step S142, when the probe needles 2150 do not make contact with the sensing region 2010b in the first test, a second test is directly carried out in step S148. On the contrary, in step S142, when the probe needles 2150 make contact with the sensing region 2010b, the probe needles 2150 making contact with the sensing region 2010b in the first test is examined.

In step S144, when the probe needles 2150 make contact with the sensing region 2010b in the first test, the process for recognizing the contact between the probe needles 2150 and the sensing region 2010b is omitted. In step S148, the second test is directly carried out. On the contrary, when the probe needles 2150 normally make contact with the probe area 2010a, in step S144, an alignment between the probe card and the pads 2110 and 2010 is corrected in step S146. In steps S120 and S122, the probe needles 2150 again make contact with the pads 2110 and 2010 and then the tests are repeatedly performed.

Figure 28:
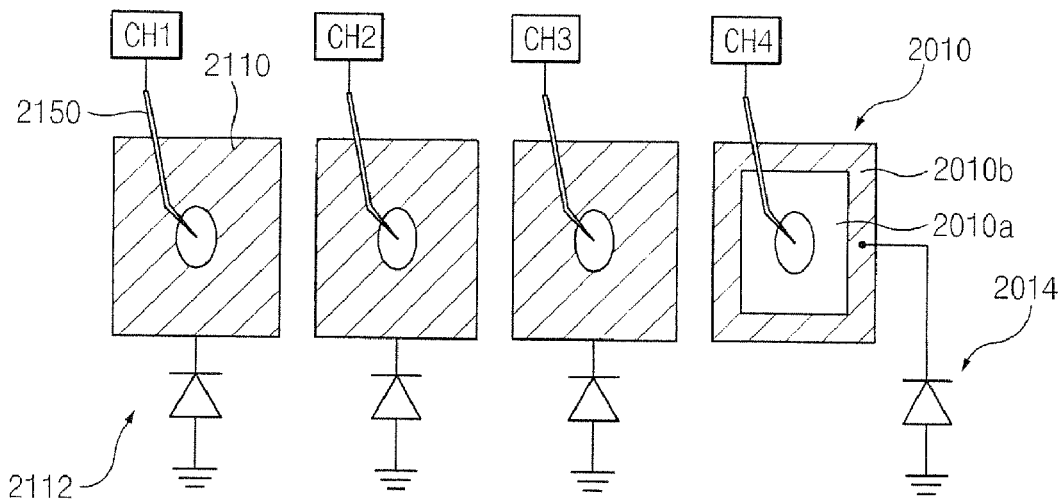
FIGS. 28 and 29 are cross sectional views illustrating a method of testing a semiconductor device in accordance with example embodiments of the present invention.
Figure 29:
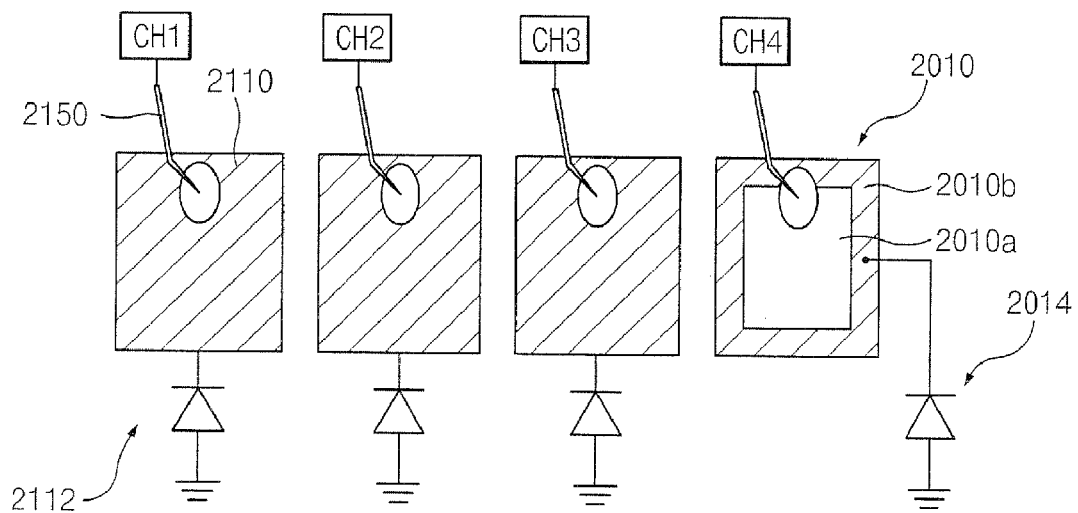

FIGS. 28 and 29 are cross-sectional views illustrating a method of testing a semiconductor device in accordance with example embodiments of the present invention. In FIGS. 28 and 29, the method may be employed in testing the semiconductor devices shown in FIGS. 13 to 23.

A pre-laser test in the method according to example embodiments will be illustrated in detail.

The probe needles make contact with the first pads for inputting/outputting data signals into/from the semiconductor device and the second pads including the probe area and the sensing region at the edge portion of the probe area, respectively. Particularly, a probe card having the probe needles is aligned with the substrate. The probe needles then make contact with the first and second pads, respectively. Here, the probe needles simultaneously make contact with the first and second pads in each semiconductor device so that the semiconductor device is simultaneously tested by a following process.

An open/short test for recognizing an electrical connection between the first pads and the probe needles is carried out. When a failure in the open/short test is not generated, a contact between the probe needles and the sensing region is examined. When the probe needles make contact with the sensing region, a contact between the probe card and the first and second pads is determined to be abnormal.

Referring to FIGS. 28 and 29, a current of about −10 μA to −500 μA may be selectively provided to the second pad 2010 through the probe needles 2150. A voltage range may be set in providing the current. The voltage range may be about −3V to about −5V. Here, the current may be provided to the second pad 2010 through the probe needles 2150 using four separate channels for inputting/outputting an electrical signal.

A voltage of the second pad 2010 is then measured. Here, as shown in FIG. 28, when the probe needles 2150 make contact with the probe area 2010a, the contact between the probe needles 2150 and the first and second pads 2110 and 2010 is determined to be normal. Since the probe area 2010a is not electrically connected to anything, the probe area 2010a is in floating state. Thus, when the current of about −10 μA to −500μ is provided to the second pad 2010, the voltage is decreased by a minus voltage to the vicinity of the voltage range. On the contrary, as shown in FIG. 29, when the probe needles 2150 make contact with the sensing region 2010b, the contact between the probe needles 2150 and the pads 2110 and 2010 is determined to be abnormal. Since the sensing region 2010b includes the conductive material, the current flows through the sensing circuit 2014. Thus, when the sensing circuit 2014 has a low resistance, the voltage is increased to a vicinity of about 0V. Moreover, when the sensing region 2010b is directly connected to the ground without the resistor, the measured voltage is about 0V.

When the measured voltage is beyond the voltage range, it is determined that the probe needles 2150 make contact with the sensing region 2010b. For example, if the measured voltage is about −200 mV to about −6,000 mV, it is determined that the probe needles 2150 do not make contact with the sensing region 2010b. However, the voltage range as a standard of judgment may vary in accordance with the current, the resistor in the sensing circuit 2014, etc., so that the voltage range is not limited within the above-mentioned range.

When the probe needles 2150 do not make contact with the sensing region 2010b, the contact between the probe needles 2150 and the probe sensing pad is determined to be normal. A first test is then carried out on the semiconductor device. Here, the first test may include a standby current test, an operation current test, a leakage current test, etc.

When the probe needles 2150 make contact with the sensing region 2010b, an alignment between the probe card and the first and the second pads 2110 and 2010 is corrected before initially testing the semiconductor device. To correct the alignment, the probe needles 2150 are separated from the first and the second pads 2110 and 2010. The probe card is realigned with the first and the second pads 2110 and 2010. The probe needles 2150 again make contact with the first and the second pads 2110 and 2010. The first test is carried out on the semiconductor device.

After the first test is completed, the probe needles 2150 are separated from the first and the second pads 2110 and 2010.

When the above-mentioned pre-laser test is completed, the laser repair process for repairing repairable chips among chips that are classified to be abnormal is performed.

When the laser repair process is completed, the post-laser test for recognizing whether or not the repair process is normally carried out is executed. Here, the repaired chips are determined to be normal or abnormal by the post-laser test. The post-laser test is substantially similar to the pre-laser test. Thus, any further illustrations of the post-laser test are omitted.

An open/short test for recognizing an electrical connection between the first pads and the probe needles is carried out. When a failure in the open/short test is not generated, a contact between the probe needles 2150 and the sensing region 2010b in the previous processes is examined.

When the probe needles 2150 make contact with the sensing region 2010b in the pre-laser test, a second test is directly carried out. The second test is substantially identical to the first test in the pre-laser test. On the contrary, when the probe needles 2150 normally make contact with the probe area 2010a, in step S124, a contact between the probe needles 2150 and the sensing region 2010b is examined.

When the probe needles 2150 do not make contact with the sensing region 2010b, the contact between the probe needles 2150 and the probe sensing pad is determined to be normal. However, when the probe needles 2150 make contact with the sensing region 2010b, an alignment between the probe card and the pads 2110 and 2010 is corrected. After the probe needles 2150 again make contact with the first and the second pads 2110 and 2010, the second test is repeatedly performed.

Chips determined to be normal in the pre-laser and the post-laser tests are finally tested.

The final test may be substantially the same as the post-laser test. Particularly, the final test includes the open/short test and the test for examining the alignment of the probe card substantially identical to the post-laser test. After the above processes are performed, a third test corresponding to an actually electrical test is carried out. The third test is carried out under conditions that are different from those of the first and second tests. The EDS process is completed by the above-mentioned processes.

Figure 30:
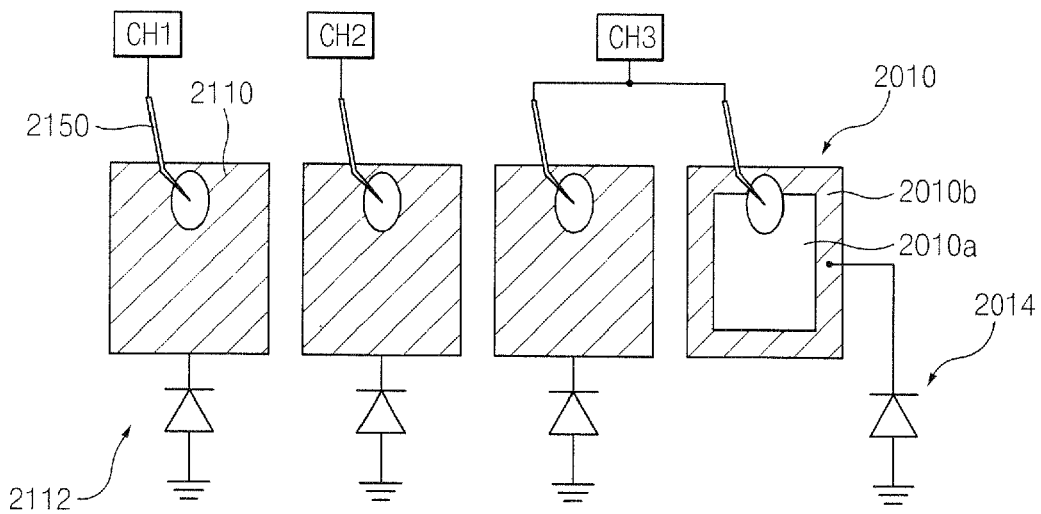
FIG. 30 is a cross sectional view illustrating a method of testing a semiconductor device in accordance with example embodiments of the present invention.

FIG. 30 is a cross-sectional view illustrating a method of testing a semiconductor device in accordance with example embodiments of the present invention. In FIG. 30, the method may be employed in testing the semiconductor devices in shown FIGS. 13 to 23. Additionally, the method in FIG. 30 may be substantially the same as that described with reference to FIGS. 28 and 29 except for a process for examining contact positions between probe sensing pads and probe needles. Therefore, only the process for examining the contact position between the probe sensing pads and the probe needles is illustrated herein.

As described above with reference to FIGS. 28 and 29, the probe needles make contact with the first pads for inputting/outputting data signals into/from the semiconductor device and the second pads including the probe area and the sensing region at the edge of the probe area, respectively.

Referring to FIG. 30, first, second and third channels CH1, CH2, and CH3 for inputting/outputting electrical signals into/from the first pads 2110 through the probe needles 2150 are provided. The channels CH1, CH2, and CH3 are electrically connected to the first pads 2110, respectively. The third channel CH3 electrically connected to the first pad 2110 is commonly coupled to the probe needle 2150 making contact with the second pad 2010. Thus, the third channel CH3 is referred to as a common channel.

A current of about −10 μA to −500 μA is selectively provided to the second pad 2010 through the probe needles 2150 using the common channel CH3 that is electrically connected to the second pad 2010. A voltage range is set in providing the current. The voltage range may be about −3V to about −5V. When the current is provided to the second pad 2010 using the channels, the current is provided to the first pad 2110 coupled to the channels as well as the second pad 2010.

A voltage of the second pad 2010 is then measured. The current provided to the first pad 2110 flows to the ground through the protection circuit 2112. Here, since the probe area 2010a is not electrically connected to anything, the probe area 2010a is in a floating state. On the contrary, when the probe needles 2150 make contact with the sensing region 2010b, the current flows to the ground through the sensing circuit so that current paths are formed in the first and the second pads 2110 and 2010, respectively. Thus, the voltage is closer to about 0V compared to that in the contact between the probe needles 2150 and the probe area 2010a.

A voltage range for conditions with the probe needles 2150 normally making contact with the probe area 2010a is set using the voltage difference. When the measured voltage is beyond the voltage range, the contact between the probe needles 2150 and the sensing region 2010b is determined.

When the contact positions of the probe needles 2150 are examined using the above-described method, a resistor in the sensing circuit may have a resistance substantially lower than that of a resistor in the protection circuit.

Hereinafter, a method of testing a semiconductor device according to example embodiments will be illustrated. The method may be employed in testing the semiconductor devices shown in FIG. 20. Additionally, the method may be substantially the same as that described with reference to FIGS. 28 and 29 except for a process for examining contact positions between probe sensing pads and probe needles. Therefore, only the process for examining the contact position between the probe sensing pads and the probe needles is illustrated herein.

Referring to FIG. 20, the probe needles make contact with the first pads 2210 for inputting/outputting data signals into/from the semiconductor device and the second pads 2020 including the probe area and the sensing region at the edge of the probe area, respectively.

A current of about −10 μA to about −500 μA is selectively provided to the second pad 2020 through the probe needles. A voltage range is set in providing the current. The voltage range may be about −3V to about −5V. When the current is provided to the second pad 2020 using the channels, the current is provided to the second pad 2020 using separated channels.

A voltage of the second pad 2020 is then measured. When the probe needles make contact with the probe area 2020a, the current flows to the ground through the sensing circuit 2024 (see FIG. 6) electrically connected to the probe area 2020a because the probe area 2020a includes a conductive material. Thus, when the sensing circuit 2024 has a low resistance, the voltage is increased to about 0V. Moreover, when the sensing region 2020b is directly connected to the ground without the resistor, the measured voltage is closely about 0V. On the contrary, when the probe needles make contact with the sensing region 2020b, the sensing region 2020b is in a floating state because the sensing region 2020b is not electrically connected to anything and includes an insulation material. Thus, when the current of about −10 μA to about −500 μA is provided to the second pad 2010, the voltage is decreased by a minus voltage to the vicinity of the voltage range.

A voltage range for conditions with the probe needles normally making contact with the probe area 2020a is set using the voltage difference. When the measured voltage is beyond the voltage range, the contact between the probe needles and the sensing region 2020b is determined. Alternatively, a channel electrically connected to the first pad 2210 may be coupled to the probe needle making contact with the second pad 2020. The channel may be commonly used. The normal contact between the probe card and the substrate is examined using the above-mentioned methods.

Figure 31:
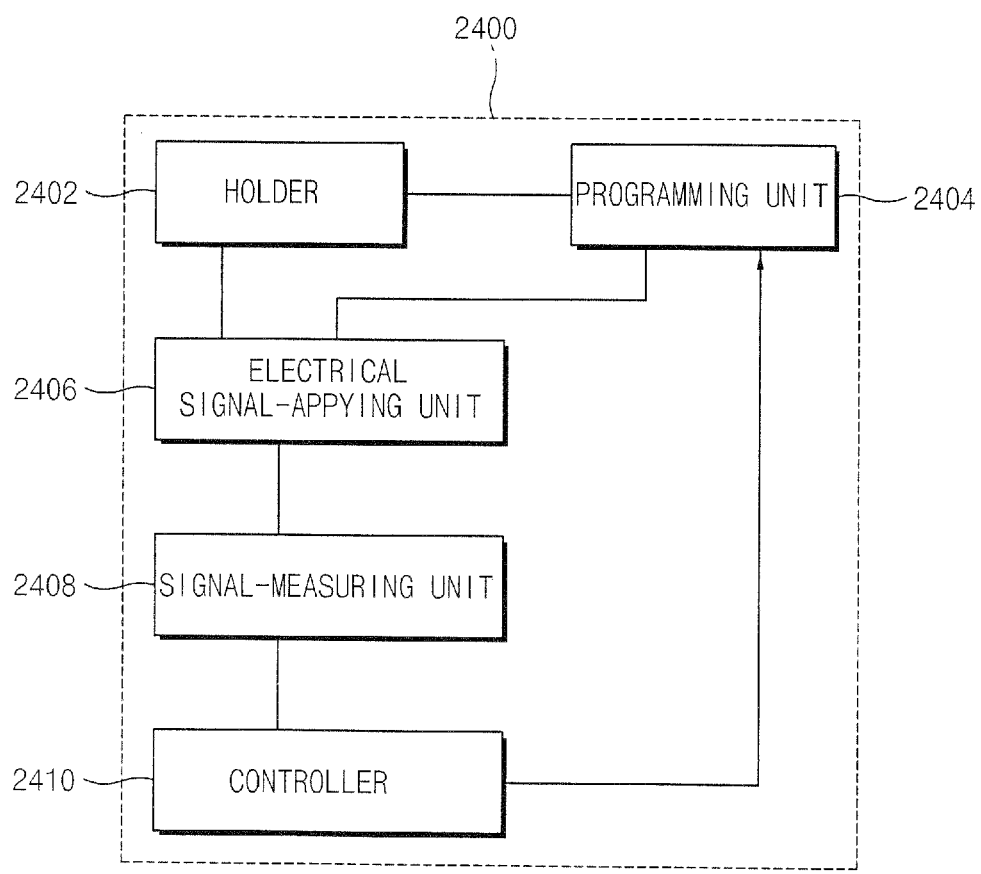
FIG. 31 is a block diagram illustrating a tester for testing a semiconductor device in accordance with example embodiments of the present invention.

FIG. 31 is a block diagram illustrating a tester for testing a semiconductor device in accordance with example embodiments of the present invention.

A tester 2400 in accordance with the present embodiment includes a holder 2402 for holding a probe card. The probe card includes probe needles making contact with first and second pads formed on a semiconductor device. When the semiconductor device is replaced with another one, positions and sizes of the pads on the semiconductor device may be changed. Thus, the holder 2402 is configured so that the probe card corresponding to the replaced semiconductor device is to be remounted.

Test conditions are stored in a test-programming unit 2404 by test items of the semiconductor device. The semiconductor device is tested using a program in the test-programming unit 2404 that is feasible for testing the semiconductor device.

An electrical signal-applying unit 2406 applies an electrical signal to the first pad for inputting/outputting data signals into/from the semiconductor device and the second pad for examining an alignment between the probe needles and the first pad. The electrical signal-applying unit 2406 applies the electrical signal, which corresponds to each of the test conditions in the test-programming unit 2404, to the first and second pads. The electrical signal-applying unit 2406 includes a plurality of channels for inputting/outputting the electrical signal into/from the first and second pads. The numbers of the channels correspond to effective numbers of the first pads. Here, the effective numbers of the first pads are numbers of the first pads into/from which at least one electrical signal is inputted/outputted in processing the test items.

A signal-measuring unit 2408 measures the electrical signal outputted from the first and second pads. A controller 2410 receives a measured signal from the signal-measuring unit 2408 and orders the test of the semiconductor device. For example, to recognize the normal contact of the probe needles, the signal-measuring unit 2408 may measure a voltage in the second pad. When the measured voltage is within a voltage range, the controller 2410 orders the test of the semiconductor device.

After the normal contact of the probe needles is recognized using the tester, the semiconductor device is substantively tested using the current.

According to example embodiments of the present invention, after the normal contact of the probe needles is recognized using the probe sensing pad in the EDS process, the semiconductor device is substantively tested using the current. Thus, when the probe needles abnormally make contact with the probe sensing pads, the alignment between the probe sensing pads and the probe needles is immediately corrected. As a result, the edge of the probe sensing pad may not be damaged with the probe needles so that the possibility of a failure of the probe sensing pads may be suppressed.

Figure 32:
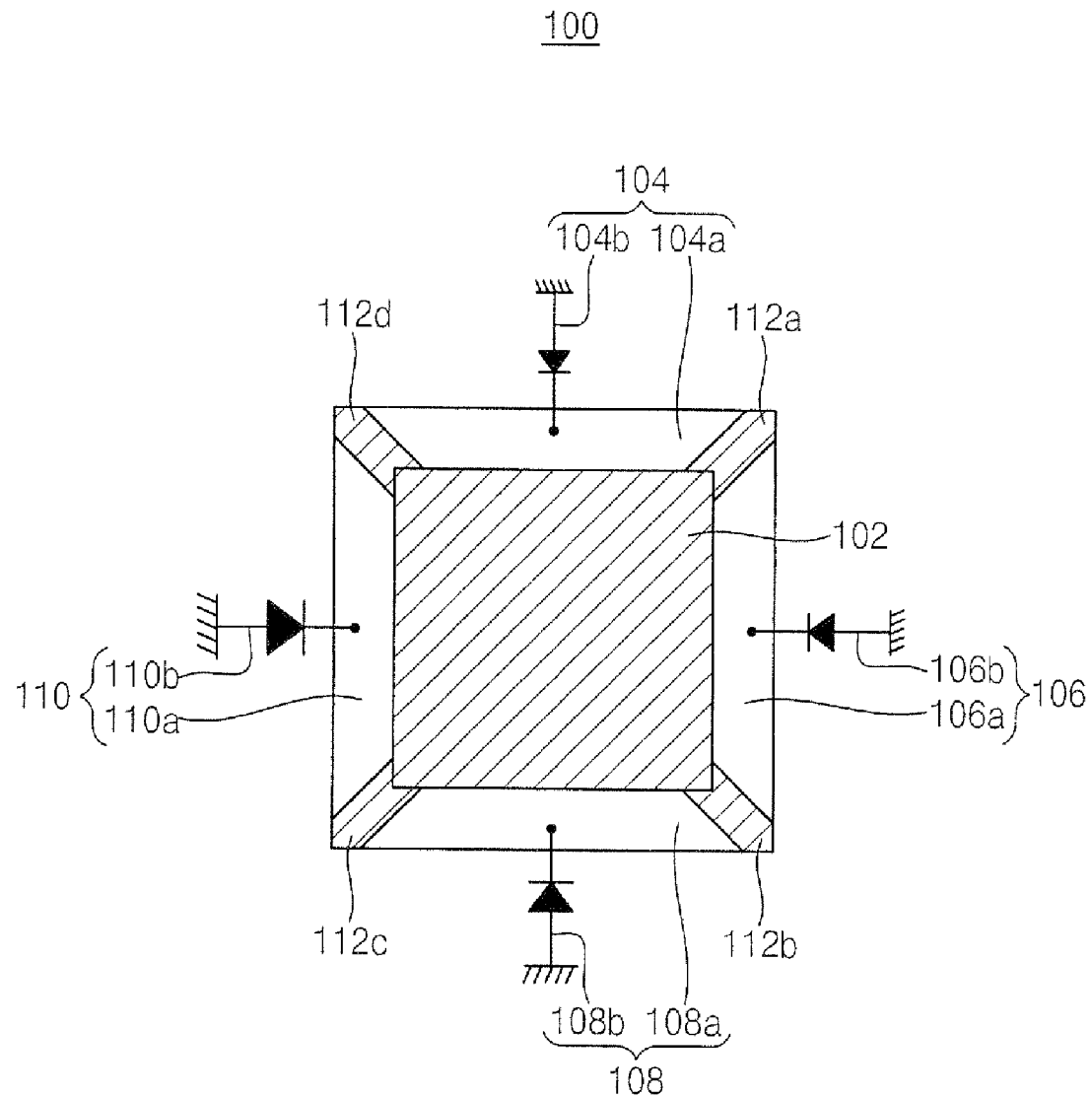
FIG. 32 is a plan view illustrating a probe sensing pad in accordance with example embodiments of the present invention.

FIG. 32 is a plan view illustrating a probe sensing pad in accordance with example embodiments of the present invention.

Referring to FIG. 32, a probe sensing pad 100 includes a probe area 102. The probe area 102 may have a rectangular shape that includes a first side, a second side, a third side and a fourth side. When a probe needle locates on a desired normal contact site of the probe sensing pad 100, the probe needle may properly make contact with the probe area 102 of the probe sensing pad 100.

In an example embodiment of the prevent invention, the probe area 102 may include an insulation material. For example, the probe area 102 may include an oxide such as silicon oxide or a nitride such as silicon nitride. The probe area 102 of the probe sensing pad 100 may advantageously include silicon oxide because the probe area 102 of silicon nitride may be broken when the probe needle makes strongly contact with the probe area 102.

Since silicon oxide or silicon nitride is not harder than metal, unit elements and/or wirings of a semiconductor device positioned under the probe area 102 may be damaged when the probe needle makes strongly contact with the probe area 102 of the probe sensing pad 100. Thus, the unit elements and/or the wiring may not be directly formed under the probe area 102.

The probe sensing pad 100 includes a first sensing member 104 having a first sensing region 104a and a first sensing element 104b. The first sensing member 104 may detect whether the probe needle makes accurately contact with a contact site of the probe area 102 or deviates from the contact site of the probe area 102 along a first direction. The first sensing region 104a contacts the first side of the probe area 102. The first sensing region 104a may include a first conductive material. The first sensing element 104b is electrically connected to the first sensing region 104a.

The probe sensing pad 100 includes a second sensing member 106 having a second sensing region 106a and a second sensing element 106b. The second sensing member 106 may inspect whether the probe needle makes properly contact with the contact site of the probe area 102 or deviates from the contact site of the probe area 102 in a second direction substantially different from the first direction. The second sensing region 106a may include a second conductive material and may contact the second side of the probe area 102. The second sensing element 106b is electrically coupled to the second sensing region 106a.

The probe sensing pad 100 further includes a third sensing member 108 and a fourth sensing member 110. The third sensing member 108 includes a third sensing region 108a and a third sensing element 108b so as to detect whether the probe needle makes good contact with the contact site of the probe area 102 or deviates from the contact site of the probe area 102 along a third direction substantially different from the first and the second directions. The third sensing region 108a may face with the third side of the probe area 102, and the third sensing element 108b is electrically connected to the third sensing region 108a. The third sensing region 108a may include a third conductive material. The fourth sensing member 110 includes a fourth sensing region 110a and a fourth sensing element 110b in order to inspect whether the probe needle makes properly contact with the contact site of the probe area 102 or deviates from the contact site of the probe area 102 along a fourth direction substantially different from the first to the third directions. The fourth sensing region 110a may contact the fourth side of the probe area 102a, and the fourth sensing element 110b is electrically coupled to the fourth sensing region 110a. The fourth sensing region 110a may include a fourth conductive material.

As for the first to the fourth sensing members 104, 106, 108 and 110, each of the first to the fourth sensing regions 104a, 106a, 108a and 110a may include a metal. Corresponding two of the first to the fourth sensing regions 104a, 106a, 108a and 110a may have substantially the same sizes and shapes, respectively. For example, the first sensing region 104a may have a size and a shape substantially the same as those of the third sensing region 108a. Further, the second sensing region 106a may have a size and a shape substantially the same as a size and a shape of the fourth sensing region 110a. Each of the first to the fourth sensing elements 104b, 106b, 108b and 110b may have a grounded end portion.

In some example embodiments of the present invention, the first to the fourth sensing elements 104b, 106b, 108b and 110b may include semiconductor devices through which currents may uni-directionally pass. That is, the current may pass through each of the first to the fourth sensing elements 104b, 106b, 108b and 110b along one direction, whereas the current may not flow through each of the first to the fourth sensing elements 104b, 106b, 108b and 110b along an opposite direction. For example, each of the first to the fourth sensing elements 104b, 106b, 108b and 110b may include a diode or a metal oxide semiconductor (MOS) transistor having a grounded gate. In an example embodiment, the first to the fourth sensing elements 104b, 106b, 108b and 110b may include diodes having grounded end portions, respectively.

The first sensing element 104b is electrically connected to the first sensing region 104a along a backward direction from a first grounded end portion thereof toward the first sensing region 104a. In other words, a current may pass through the first sensing element 104b along a forward direction from the first grounded end portion to the first sensing region 104a whereas the current may not flow alone the backward direction from the first sensing region 104a to the first grounded end portion of the first sensing element 104b. The first sensing element 104b may include a first diode that has a first resistance when a forward bias is applied to the first sensing element 104b.

The second sensing element 106b makes electrically contact with the second sensing region 106a so that the second sensing element 106b may have a backward direction from the second sensing region 106a to a second grounded end portion thereof. That is, a current may forwardly flow from the second grounded end portion to the second sensing region 106a through the second sensing element 106b. When a forward bias is applied to the second sensing element 106b, the second sensing element 106b may have a second resistance substantially different from the first resistance of the first sensing element 104b. For example, the second sensing element 106b may include a second diode having the second resistance. When diodes have sizes different from each other, forward resistances and backward resistances of the diodes may be generally different from each other. Thus, the second diode of the second sensing element 106b may have a size substantially different from that of the first diode of the first sensing element 104b.

The third sensing element 108b is electrically coupled to the third sensing region 108a such that the third sensing element 108b may have a backward direction from the third sensing region 108a to a third grounded end portion thereof. In other words, a current may forwardly pass from the third grounded end portion to the third sensing region 108a through the third sensing element 108b. When a forward bias is applied to the third sensing element 108b, the third sensing element 108b may have a third resistance substantially different from those of the first and the second sensing elements 104b and 106b. For example, the third sensing element 108b may include a third diode having the third resistance. Here, the third diode of the third sensing element 108b may have a size substantially different from those of the first diode of the first sensing elements 104b and the second diode of the second sensing elements 106b.

The fourth sensing element 110b makes electrically contact with the fourth sensing region 110a so that the fourth sensing element 110b may have a backward direction from the fourth sensing region 110a to a fourth grounded end portion thereof. Namely, a current may forwardly flow from the fourth grounded end portion toward the fourth sensing region 110a through the fourth sensing element 110b. When a forward bias is applied to the fourth sensing element 110b, the fourth sensing element 110b may have a fourth resistance substantially different from those of the first to the third sensing elements 104b, 106b and 108b. For example, the fourth sensing element 110b may include a fourth diode having the fourth resistance. The fourth diode may have a size substantially different from those of the first to the third diodes.

To electrically separate the first to the fourth sensing regions 104a, 106a, 108a and 110a from one another, isolation regions are provided between adjacent sensing regions. Particularly, a first isolation region 112a is positioned between the first sensing region 104a and the second sensing region 106a, and a second isolation region 112b is formed between the second sensing region 106a and the third sensing region 108a. Further, a third isolation region 112c is provided between the third sensing region 108a and the fourth sensing region 110a, and a fourth isolation region 112d is formed between the fourth sensing region 110a and the first sensing region 104a. Each of the first to the fourth isolation regions 112a, 112b, 112c and 112d may include an insulation material so as to electrically isolate the adjacent sensing regions. For example, the first to the fourth isolation regions 112a, 112b, 112c and 112d may include oxides such as silicon oxide or nitrides such as silicon nitride. In an example embodiment, the first to the fourth isolation regions 112a, 112b, 112c and 112d may include silicon oxide.

As described above, the resistances of the first to the forth sensing elements 104b, 106b, 108b and 110b may be substantially different from one another. Thus, measured voltages and currents may be different from one another in accordance with electrical connections of the probe needle relative to the first to the forth sensing regions 104a, 106a, 108a and 110a.

In some example embodiments of the present invention, a probe needle may make contact with a probe sensing pad, and then voltages may be measured from sensing regions of the probe sensing pad after negative currents are applied to the probe sensing pad through the probe needle, thereby detecting whether the probe needle may make contact with a desired normal contact site of a probe sensing area of the probe sensing pad or may deviate from the desired normal contact site of the probe sensing area of the probe sensing pad. Therefore, a probe contact failure between the probe needle and the probe sensing pad may be effectively detected. Further, a deflection of the probe needle (that is, shifted degree and direction of the probe needle) may be correctly inspected using the measured voltages.

Figure 33:
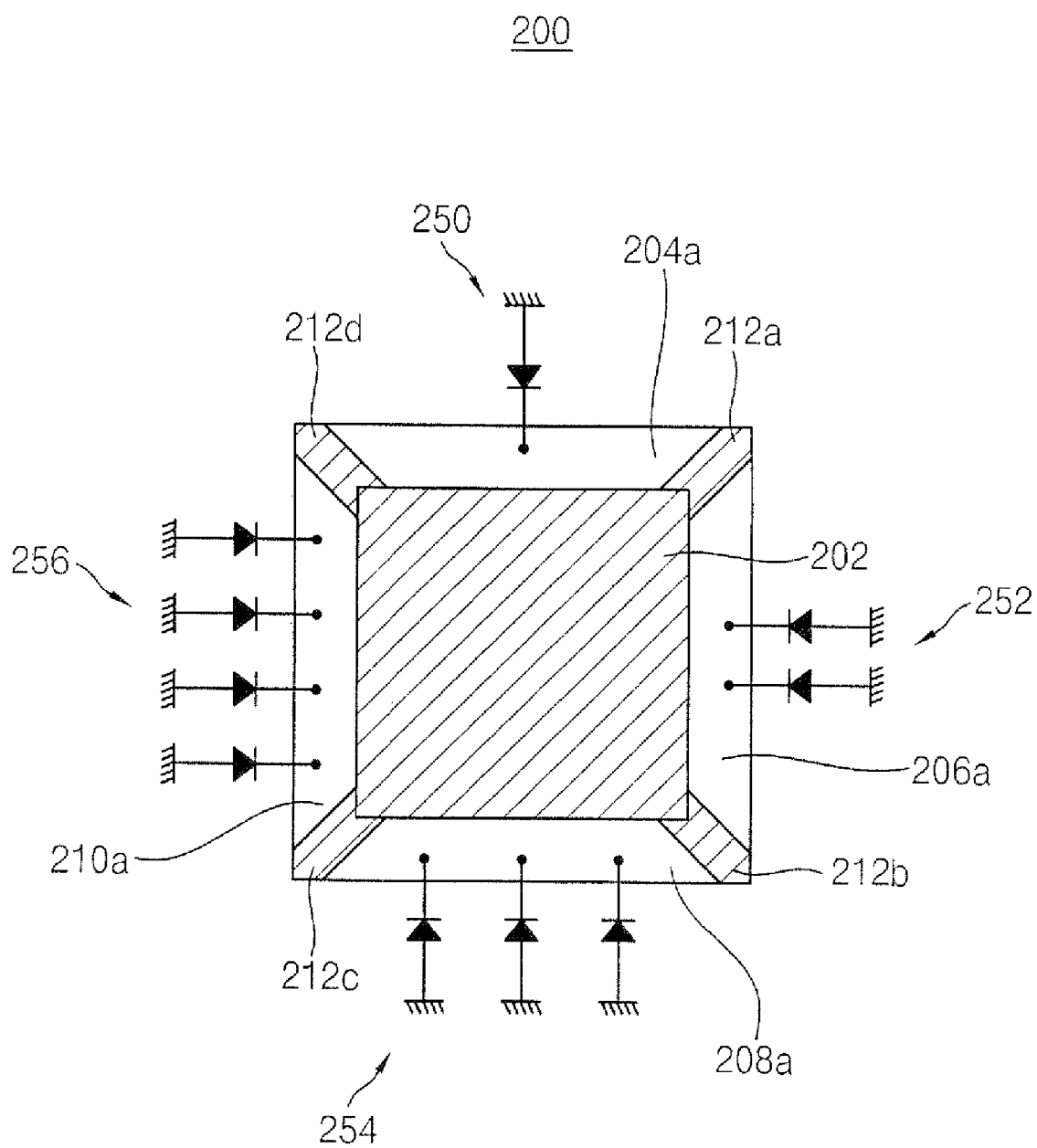
FIG. 33 is a plan view illustrating a probe sensing pad in accordance with example embodiments of the present invention.

FIG. 33 is a plan view illustrating a probe sensing pad 200 in accordance with example embodiments of the present invention. The probe sensing pad 200 in FIG. 33 has a construction substantially the same as that of the probe sensing pad 100 shown in FIG. 32 except for a first sensing element 250, a second sensing element 252, a third sensing element 254 and a fourth sensing element 256.

The probe sensing pad 200 includes a first sensing member to a fourth sensing member making contact with a first side to a fourth side of a probe area 202, respectively. The probe area 202 may have a rectangular shape.

The first sensing member of the probe sensing pad 200 includes a first sensing region 204a and the first sensing element 250. The first sensing element 250 is electrically connected to the first sensing region 204a. The first sensing element 250 may have a backward direction from the first sensing region 204a toward a first grounded end portion of the first sensing element 250. When a forward bias is applied to the first sensing element 250, the first sensing element 250 may a first resistance. For example, the first sensing element 250 may include one diode having the first resistance. The diode may have a grounded end portion.

The second sensing member of the probe sensing pad 200 includes a second sensing region 206a and the second sensing element 252. The second sensing element 252 makes electrically contact with the second sensing region 206a. The second sensing element 252 may include two diodes electrically connected to the second sensing region 206a in parallel. Each of the two diodes may have a backward direction from the second sensing region 206a toward a grounded end portion thereof. When the second sensing element 252 includes the two diodes electrically connected to the second sensing region 206a in parallel, the second sensing element 252 may have a second resistance substantially different from the first resistance of the first sensing element 250.

The third sensing member of the probe sensing pad 200 includes a third sensing region 208a and the third sensing element 254. The third sensing element 254 is electrically coupled to the third sensing region 208a. The third sensing element 254 may include three diodes electrically connected to the third sensing region 208a in parallel. Each of the three diodes may have a backward direction from the third sensing region 208a toward a grounded end portion thereof. When the third sensing element 254 includes the three diodes electrically connected to the third sensing region 208a in parallel, the third sensing element 254 may have a third resistance substantially different from the first resistance of the first sensing element 250 and the second resistance of the second sensing element 252.

The fourth sensing member of the probe sensing pad 200 includes a fourth sensing region 210a and the fourth sensing element 256. The fourth sensing element 256 is electrically connected to the fourth sensing region 210a. The fourth sensing element 256 may include four diodes electrically coupled to the fourth sensing region 210a in parallel. Each of the four diodes may have a backward direction from the fourth sensing region 210a to a grounded end portion thereof. The fourth sensing element 256 may have a fourth resistance substantially different from the first resistance of the first sensing element 250, the second resistance of the second sensing element 252 and the third resistance of the third sensing element 254.

Adjacent sensing regions are electrically separated from each other by an isolation region. Particularly, the first sensing region 204a is electrically isolated from the second sensing region 206a by a first isolation region 212a, and the second sensing region 206a is electrically isolated from the third sensing region 208a by the second isolation region 212b. Further, a third isolation region 212c electrically isolates the third sensing region 208a from the fourth sensing region 210a, and a fourth isolation region 212d electrically isolates the fourth sensing region 210a from the first sensing region 204a.

Figure 34:
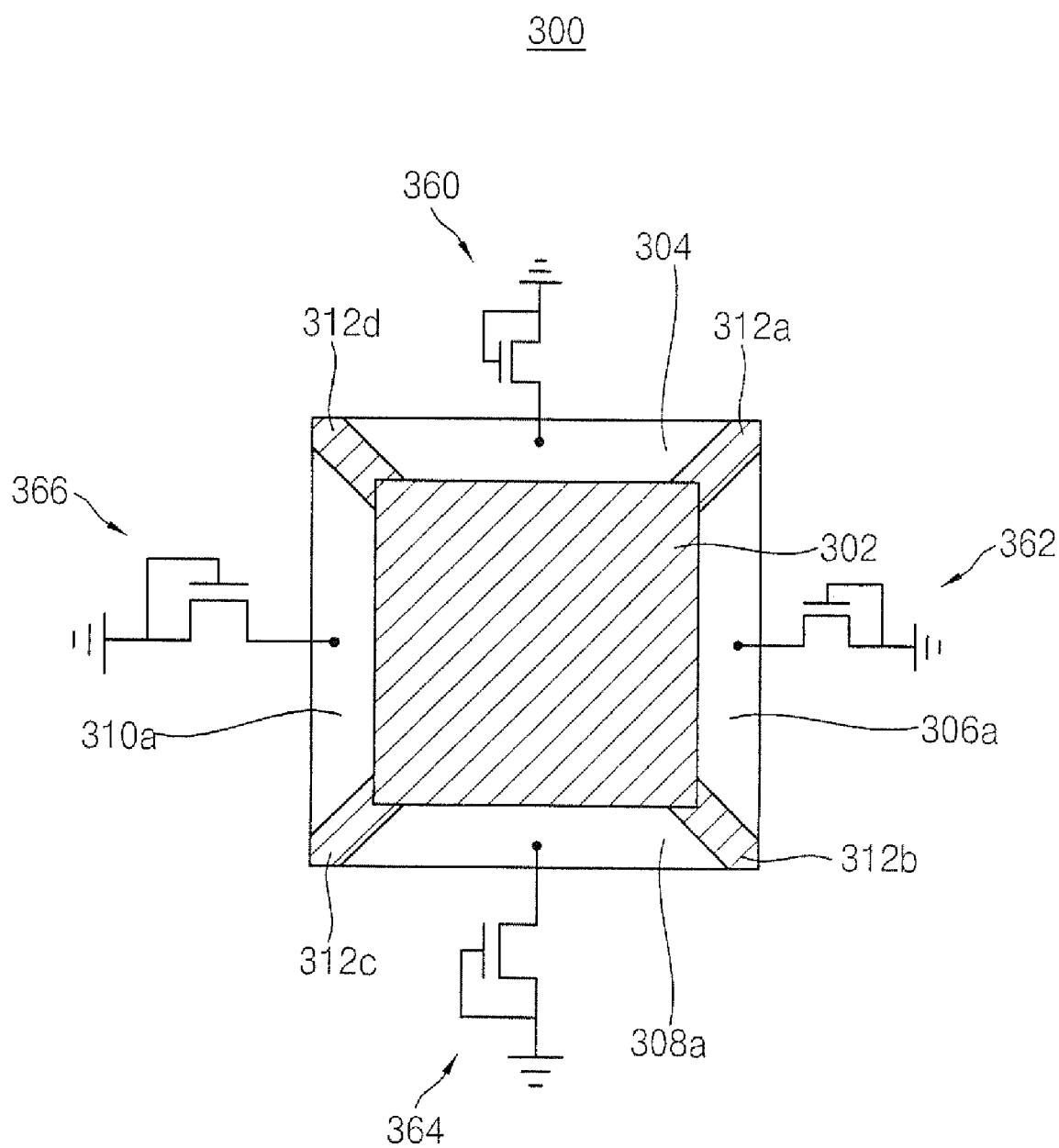
FIG. 34 is a plan view illustrating a probe sensing pad in accordance with example embodiments of the present invention.

FIG. 34 is a plan view illustrating a probe sensing pad 300 in accordance with example embodiments of the present invention. The probe sensing pad 300 in FIG. 34 has a construction substantially the same as that of the probe sensing pad 100 shown in FIG. 32 except for a first sensing element 360, a second sensing element 362, a third sensing element 364 and a fourth sensing element 366. Each of the first to the fourth sensing elements 360, 362, 364 and 366 may include an N type MOS (NMOS) transistor. The probe sensing pad 300 includes a probe area 302 having a first side to a fourth side.

The first sensing element 360 may include a first NMOS transistor having a grounded first gate. Additionally, one of first source/drain regions of the first NMOS transistor may be grounded. Since the first gate of the first NMOS transistor is grounded, the first NMOS transistor may be in a turn-off state. Thus, a current may not flow from a first sensing region 304a toward the grounded first gate of the first sensing element 360. When a backward voltage higher than a threshold voltage of the first NMOS transistor is applied to the grounded first gate, a backward current may flow from the grounded first gate to the first sensing region 304a. Here, a first effective resistance of the first NMOS transistor may vary in accordance with the threshold voltage while maintaining the first source/drain regions of the first NMOS transistor in a turn-on state.

The second sensing member 362 is electrically coupled to a second sensing region 306a. The second sensing element 362 may include a second NMOS transistor having a grounded second gate. Further, one of second source/drain regions of the second NMOS transistor may be grounded. The second NMOS transistor having the second source/drain regions in a turn-on state may have a second effective resistance substantially different from the first effective resistance of the first NMOS transistor. Additionally, the second NMOS transistor may have the second effective resistance substantially different from the first effective resistance of the first NMOS transistor when the second NMOS transistor has a size substantially different from that of the first NMOS transistor. In an example embodiment, the second NMOS transistor may have dimensions substantially different from those of the first NMOS transistor.

The third sensing element 364 is electrically connected to a third sensing region 308a. The third sensing element 364 may include a third NMOS transistor having a grounded third gate. One of the third source/drain regions of the third NMOS transistor may also be grounded. As described above, the third NMOS transistor may have a size or dimensions substantially different from that of the first NMOS transistor and that of the second NMOS transistor. Thus, the third NMOS transistor may have a third effective resistance substantially different from the first effective resistance of the first NMOS transistor and the second effective resistance of the second NMOS transistor.

The fourth sensing element 366 makes electrically contact with a fourth sensing region 310a. The fourth sensing element 366 may include a fourth NMOS transistor having a grounded fourth gate. One of the fourth source/drain regions of the fourth NMOS transistor may be grounded. The fourth NMOS transistor may have a size or dimensions substantially different from that of the first NMOS transistor, that of the second NMOS transistor and that of the third NMOS transistor. Hence, the fourth NMOS transistor may have a fourth effective resistance substantially different from the first effective resistance of the first NMOS transistor, the second effective resistance of the second NMOS transistor and the third effective resistance of the third NMOS transistor.

A first isolation region 312a is provided between the first and the second sensing regions 304a and 306a, and a second isolation region 312b is formed between the second and the third sensing regions 306a and 308a. Further, a third isolation region 312c is positioned between the third and the fourth sensing regions 308a and 310a, and a fourth isolation region 312d is provided between the fourth and the first sensing regions 310a and 304a.

In some example embodiments of the present invention, a probe needle may make contact with a probe sensing pad, and then negative currents may be applied to the probe sensing pad through the probe needle. Then, voltages may be measured relative to a first sensing member to a fourth sensing member of the probe sensing pad as described with reference to FIG. 32, thereby detecting whether the probe needle properly contacts a desired contact site of a probe area of the probe sensing pad or deviates from the desired contact site of the probe area. Further, a deflection of the probe needle along an arbitrary direction may be correctly inspected using the measured voltages.

Figure 35:
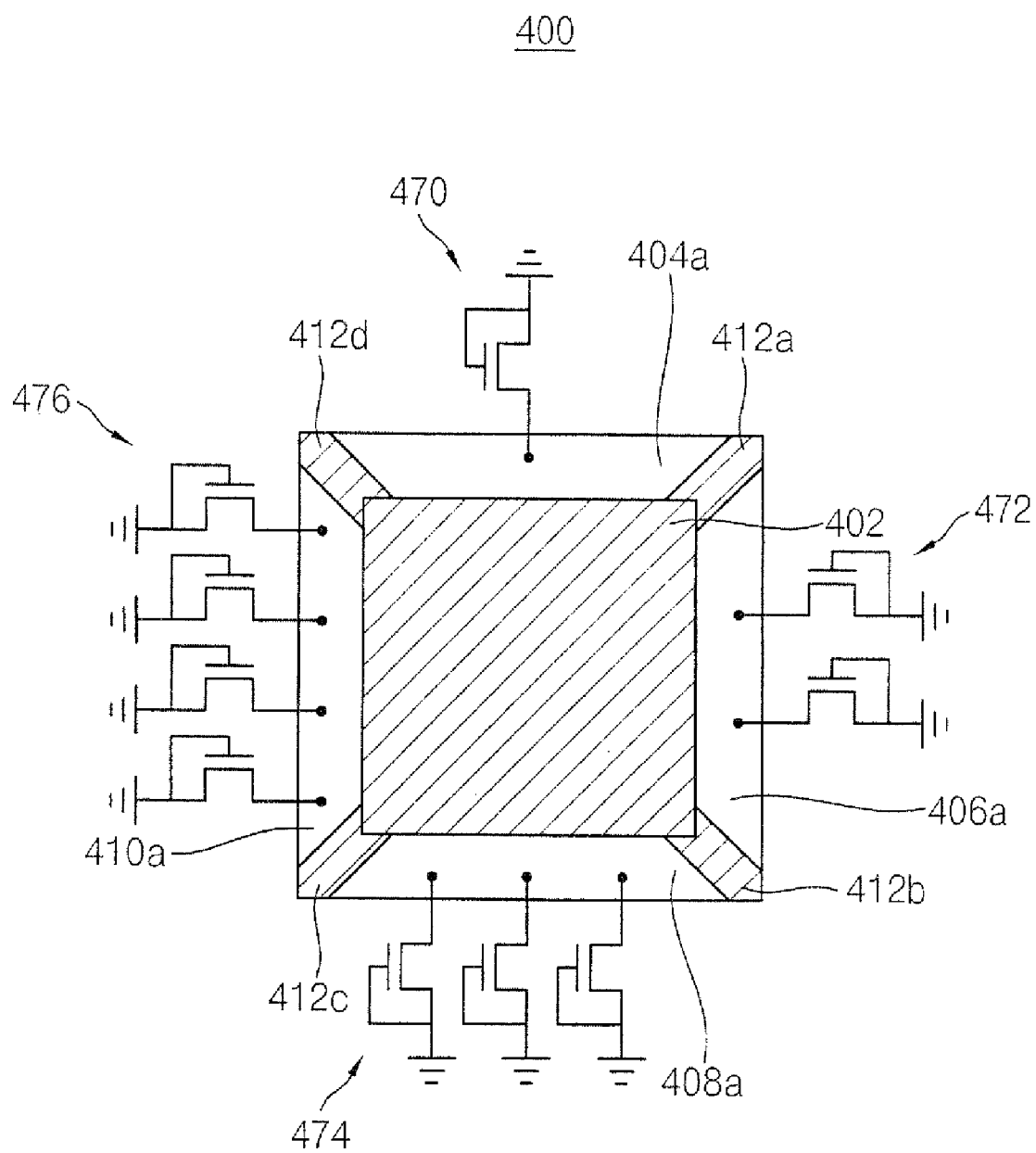
FIG. 35 is a plan view illustrating a probe sensing pad in accordance with example embodiments of the present invention.

FIG. 35 is a plan view illustrating a probe sensing pad 400 in accordance with example embodiments of the present invention. The probe sensing pad 400 in FIG. 35 has a construction substantially the same as that of the probe sensing pad 300 shown in FIG. 34 except for a first sensing element 470, a second sensing element 472, a third sensing element 474 and a fourth sensing element 476. The probe sensing pad 400 includes a probe area 402 having a first side to a fourth side. The first sensing element 470, the second sensing element 472, the third sensing element 474 and the fourth sensing element 476 make electrically contact with a first sensing region 404a, a second sensing region 406a, a third sensing region 408a and a fourth sensing region 410a, respectively. A first to a fourth isolation regions 412a, 412b, 412c and 412d are provided between adjacent two sensing regions.

The first sensing element 470 may include a one NMOS transistor, and the second sensing element 472 may include two NMOS transistors. Further, a third sensing element 474 may include three NMOS transistors, and the fourth sensing element 476 may include four NMOS transistors. The NMOS transistors of the second to the fourth sensing elements 472, 474 and 476 may be electrically connected to the second to the fourth sensing regions 406a, 408a and 410a in parallel, respectively. Each of the NMOS transistors of the first to the fourth sensing elements 470, 472, 474 and 476 may have a construction substantially the same as that of the probe sensing pad 300 shown in FIG. 34. Accordingly, the first to the fourth sensing elements 470, 472, 474 and 476 may have effective resistances substantially different from one another.

Figure 36:
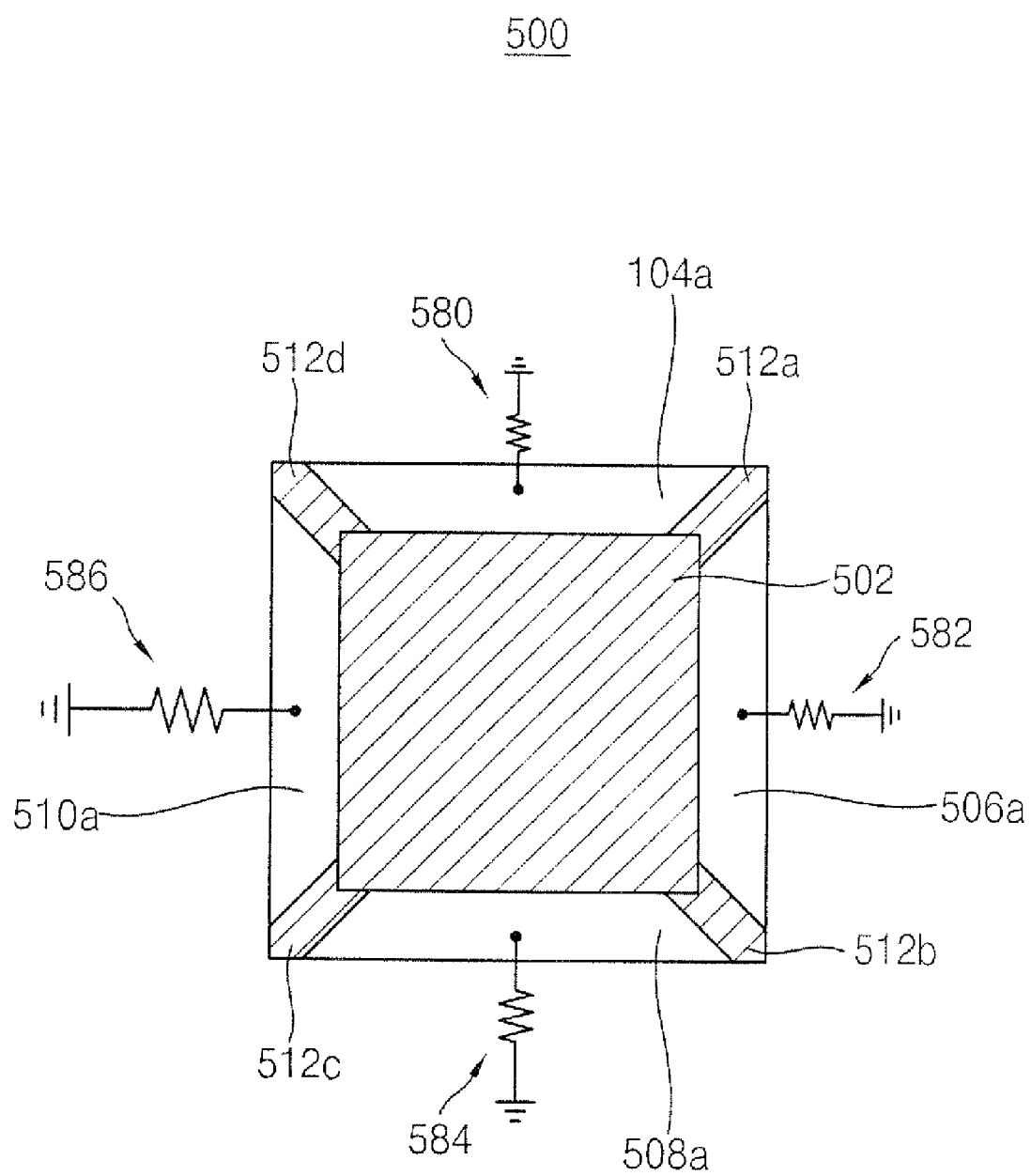
FIG. 36 is a plan view illustrating a probe sensing pad in accordance with example embodiments of the present invention.

FIG. 36 is a plan view illustrating a probe sensing pad 500 in accordance with example embodiments of the present invention. In FIG. 36, the probe sensing pad 500 may have a construction substantially the same as that of the probe sensing pad 100 shown in FIG. 32 except for a first sensing element 580, a second sensing element 582, a third sensing element 584 and a fourth sensing element 586. The probe sensing pad 500 includes a probe area 502. The probe area may have a rectangular shape that includes a first side to a fourth side. The first sensing element 580, the second sensing element 582, the third sensing element 584 and the fourth sensing element 586 are electrically coupled to a first sensing region 504a, a second sensing region 506a, a third sensing region 508a and a fourth sensing region 510a, respectively. Additionally, a first isolation region 512a, a second isolation region 512b, a third isolation region 512c and a fourth isolation region 512d are provided between adjacent sensing regions, respectively.

The first sensing element 580 may include a first resistor having a first resistance. One end portion of the first resistor may be grounded and the other end portion of the first resistor may be electrically connected to the first sensing region 504a.

The second sensing element 582 may include a second resistor having a second resistance substantially different from the first resistance of the first resistor. One end portion of the second resistor may be grounded and the other end portion of the second resistor may be electrically coupled to the second sensing region 506*a*.

The third sensing element 584 may include a third resistor having a third resistance substantially different from the first resistance of the first resistor and the second resistance of the second resistor. One end portion of the third resistor may be grounded and the other end portion of the third resistor may be electrically coupled to the third sensing region 508*a*.

The fourth sensing element 584 may include a fourth resistor having a fourth resistance substantially different from the first resistance of the first resistor, the second resistance of the second resistor and the third resistance of the third resistor. One end portion of the fourth resistor may be grounded and the other end portion of the fourth resistor may be electrically connected to the fourth sensing region 510*a*.

Each of the first to the fourth sensing elements 580, 582, 584 and 586 of the probe sensing pad 500 may not have a forward direction and a backward direction. That is, currents may flow from each of the first to the fourth sensing elements 580, 582, 584 and 586 toward each of the first to the fourth sensing regions 504*a*, 506*a*, 508*a* and 510*a*. Further, the current may also pass from each of the first to the fourth sensing regions 504*a*, 506*a*, 508*a* and 510*a* toward each of the first to the fourth sensing elements 580, 582, 584 and 586.

Hereafter, a method of detecting a position of a probe needle relative to a contact site of probe sensing pad will be described in detail. Particularly, processes of inspecting and correcting the position of the probe needle relative to the contact site of one of the above-described probe sensing pads shown in FIGS. 1 to 5 will be illustrated.

Figure 37:
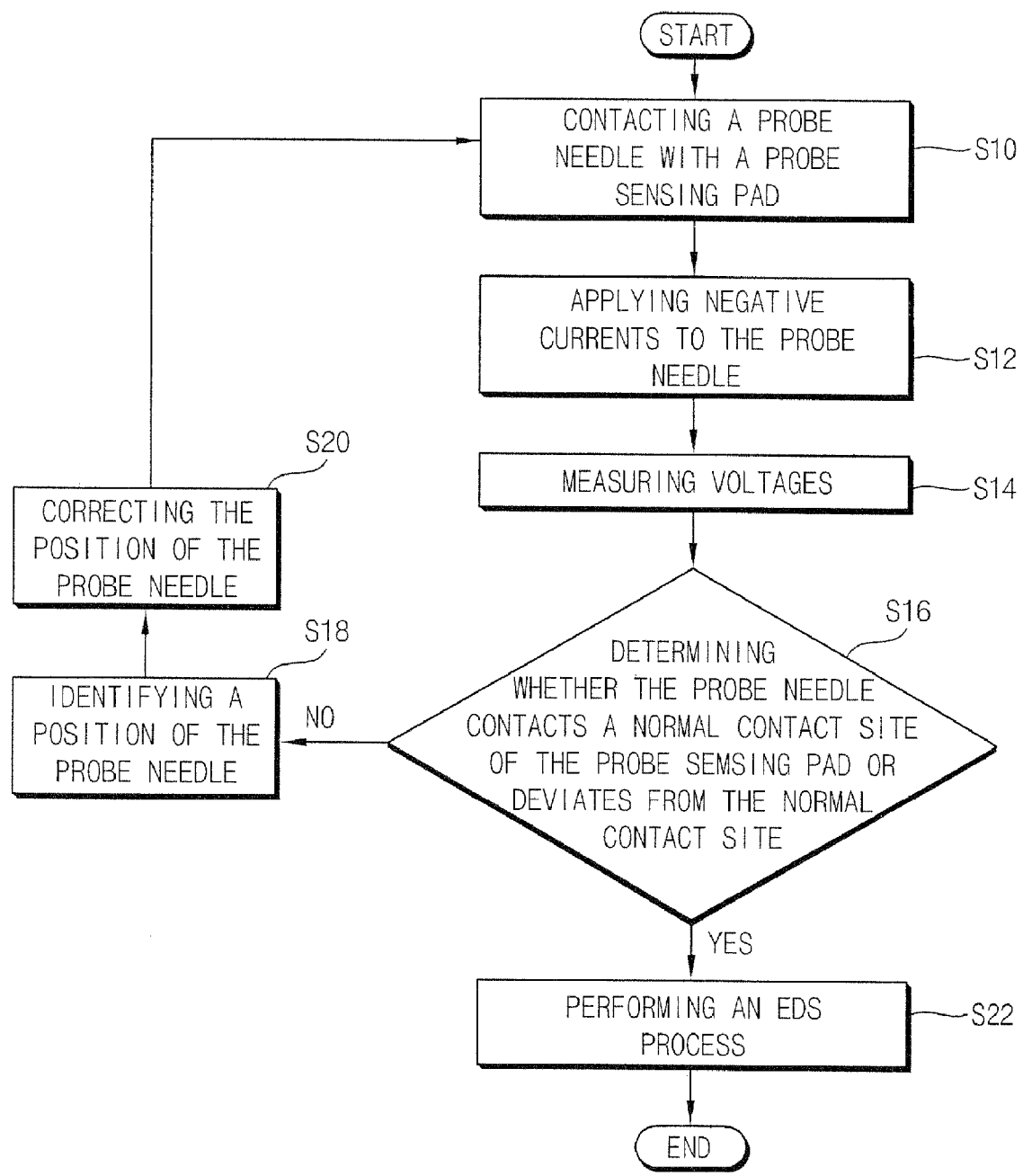
FIG. 37 is a flow chart illustrating a method of detecting a position of a probe needle relative to a contact site of a probe sensing pad in accordance with example embodiments of the present invention.

FIG. 37 is a flow chart illustrating a method of detecting a position of a probe needle relative to a contact site of a probe sensing pad in accordance with example embodiments of the present invention.

Referring to FIG. 37, probe needles of a probe card makes contact with a probe sensing pad in step S10. The probe needles of the probe card may contact the probe sensing pad and other pads for applying electrical signals to the pads from the probe needles.

Negative (−) currents are applied to the probe needles making contact with the probe sensing pad in step S12. When the negative currents are applied to the probe needle, the negative currents may forwardly flow from a probe area of the probe sensing pad toward grounded end portions of sensing elements of the probe sensing pad.

In step S14, voltages among the probe area and the grounded end portions of the sensing element are measured. The measured voltages may substantially different from one another in accordance with a position of the probe needle relative to the probe area of the probe sensing pad.

When the probe needle makes contact with a desired normal contact site of the probe area of the probe sensing pad, an electrical interconnection between the probe needle and the probe area may be in a floating state. Otherwise, when the probe needle makes contact with any one of probe sensing regions of the probe sensing pad, an electrical interconnection between the probe needle and the grounded end portions of the sensing elements may be in a forward bias state. Here, the sensing elements electrically coupled to the sensing regions may have substantially different resistances from one another, so that the measured voltages may be considerably different from one another in accordance with the position of the probe needle relative to the sensing regions even though substantially identical negative currents are applied to the sensing regions through the probe needle. For example, a measured voltage from a sensing region may be relatively small when the probe needle makes contact with the sensing region to which a sensing element having a relatively low resistance is electrically connected. On the other hand, when the probe needle makes contact with a sensing region to which a sensing element having a relatively high resistance, a measured voltage from such a sensing region may be large.

In step S16, using the measured voltages, the position of the probe needle is detected to determine whether the probe needle makes accurately contact with the desired normal contact site of the probe sensing pad or deviates from the normal contact site of the probe sensing pad. If the probe needle deviates from the normal contact site of the probe sensing pad, the position of the probe needle is identified in step S18. That is, a deflection of the probe needle is identified using the measured voltages.

In step S20, the position of the probe needle is corrected so that the probe needle makes accurately contact with the desired normal contact site of the probe sensing pad. In some example embodiments, identifying the deflection of the probe needle and correcting the position of the probe needle may be automatically carried out according to the measured voltages without a manual operation. Therefore, detecting and correcting the position of the probe needle may be rapidly accomplished when the probe needle deviates from the normal contact site of the probe sensing pad.

After correcting the position of the probe needle, the position of the probe needle may be identified again so as to determine whether the probe needle contacts the normal contact site of the probe sensing pad or not.

When the probe needle makes good contact with the normal contact site of the probe sensing pad, an EDS process is performed on chips formed on a substrate in step S22.

In some example embodiments of the present invention, a position of a probe needle relative to a probe sensing pad may be automatically detected and corrected before performing an EDS process for chips formed on a substrate. Accordingly, the EDS process may be properly carried out without damages to the probe needle and the probe sensing pad.

Figure 38:
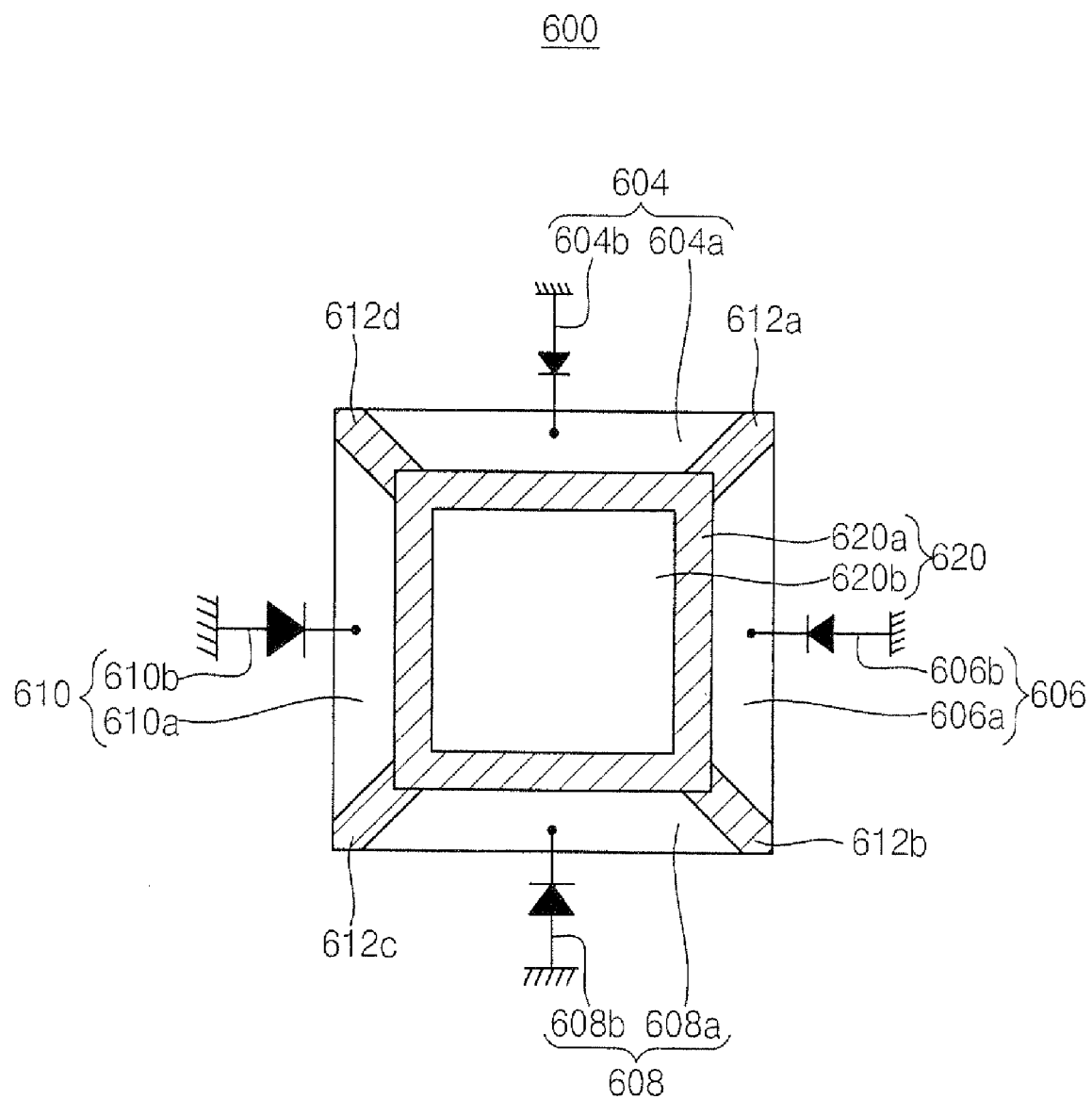
FIG. 38 is a plan view illustrating a probe sensing pad in accordance with example embodiments of the present invention.

FIG. 38 is a plan view illustrating a probe sensing pad 600 in accordance with example embodiments of the present invention. In FIG. 38, the probe sensing pad 600 may have a construction substantially the same as that of the probe sensing pad 100 in FIG. 32 except for a probe area 620.

Referring to FIG. 38, the probe sensing pad 600 includes the probe area 620 having a first region 620*a* and a second region 620*b*. The probe area 620 may have a rectangular shape including a first side, a second side, a third side and a fourth side.

The probe sensing pad 600 includes a first sensing member 604, a second sensing member 606, a third sensing member 606 and a fourth sensing member 610. The first sensing member 604 includes a first sensing region 604*a* and a first sensing element 604*b*, and the second sensing member 606 includes a second sensing region 606*a* and a second sensing element 606*b*. Further, the third sensing member 608 includes a third sensing region 608*a* and a third sensing element 608*b*, and the fourth sensing member 610 includes a fourth sensing region 610*a* and a fourth sensing element 610*b*.

Additionally, the probe sensing pad 600 includes a first isolation region 612*a*, a second isolation region 612*b*, a third isolation region 612*c* and a fourth isolation region 612*d*.

The first region 620*a* of the probe area 620 may have a rectangular ring shape enclosing the second region 620*b* of the probe area 620. Four sides of the first region 620*a* make contact with first to fourth sensing regions 604a, 606a, 608a and 610a. The first region 620a may include insulation material where as the second region 620b may include conductive material such as metal.

The first region 620a may electrically insulate the second region 620b from the first to fourth sensing regions 604a, 606a, 608a and 610a. When a probe needle makes contact with a desired normal contact site of the probe sensing pad 600, the probe needle mat contacts the second region 620b of the probe area 620.

In some example embodiments of the present invention, the second region 620b of the probe area 620 may include a material substantially harder than an insulation material. Thus, elements and/or wirings positioned under the probe sensing pad 600 may not be damaged even though the probe needle makes strong contact with the second region 620b during an EDS process.

In some example embodiments of the present invention, the probe needle may be contacted with the probe sensing pad 600, and then voltages may be measured after applying negative currents to the probe sensing pad 600 through the probe needle. Since a contact failure of the probe needle may be easily detected and also a deflection of the probe needle may be rapidly detected, detecting and correcting a position of the probe needle may be rapidly performed as described above.

Figure 39:
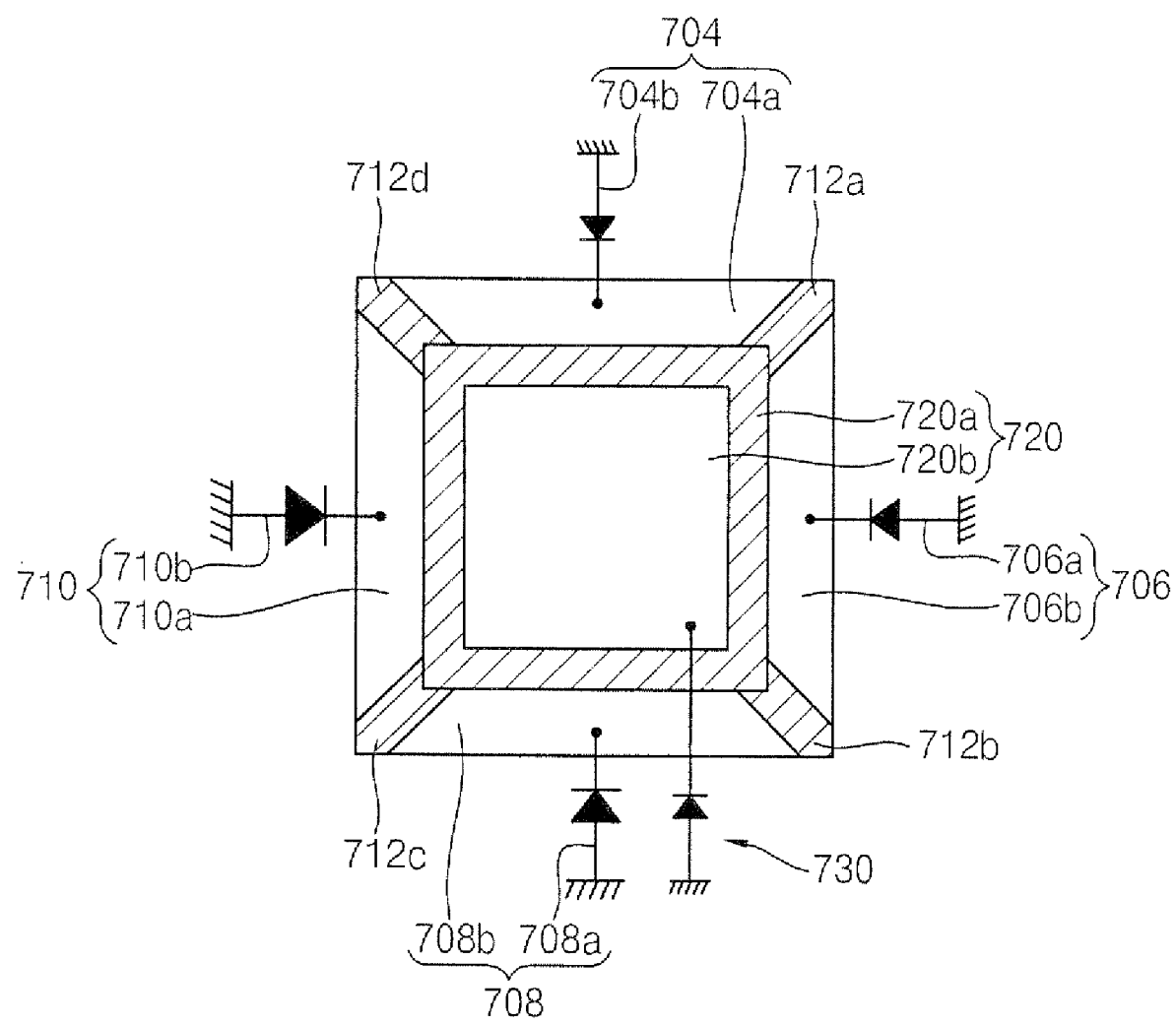
FIG. 39 is a plan view illustrating a probe sensing pad in accordance with example embodiments of the present invention.

FIG. 39 is a plan view illustrating a probe sensing pad 700 in accordance with example embodiments of the present invention. In FIG. 39, the probe sensing pad 700 may have a construction substantially the same as that of the probe sensing pad 100 shown in FIG. 32 except for a probe area 720.

Referring to FIG. 39, the probe sensing pad 700 includes a rectangular probe area 720. The probe area 720 includes a first side to a fourth side. The probe area 720 includes a first region 720a and a second region 720b. The first and the second regions 720a and 720b may include substantially different materials, respectively. The second region 720b may be electrically connected to a protection semiconductor device 730.

The probe sensing pad 700 includes a first sensing member 704, a second sensing member 706, a third sensing member 708 and a fourth sensing member 710. The first sensing member 704 has a first sensing region 704a and a first sensing element 704b, and the second sensing member 706 includes a second sensing region 706a and a second sensing element 706b. Further, the third sensing member 708 includes a third sensing region 708a and a third sensing element 708b, and the fourth sensing member 710 includes a fourth sensing region 710a and a fourth sensing element 710b.

The probe sensing pad 700 further includes a first isolation region 712a, a second isolation region 712b, a third isolation region 712c and a fourth isolation region 712d. Each of the first to the fourth isolation regions 712a, 712b, 712c and 712d is interposed between two adjacent sensing regions.

The first region 720a of the probe area 720 may have a rectangular ring shape making contact with the first to the fourth sensing regions 704a, 706a, 708a and 710a. The first region 720a may include an insulation material. The second region 720b of the probe area 720 may be enclosed by the first region 720a. That is, a central portion of the probe area 720 may correspond to the second region 720a whereas a peripheral portion of the probe area 720 may correspond to a peripheral portion of the probe area 720. The second region 720b of the probe area 720 may include a conductive material such as metal. When a probe needle makes accurately contact with a normal contact site of the probe sensing pad 700, the probe needle may be positioned in the second region 720b of the probe area 720.

When the second region 720b of the probe area 720 includes metal, the second region 720b may sufficiently serve as a normal signal pad for inputting/outputting electrical signals into/from chips formed on a substrate. To effectively utilize the second region 720b of the probe area 720 as the normal signal pad, a protection semiconductor device 730 may be electrically coupled to the second region 720b of the probe area 720.

In some example embodiments of the present invention, a current may pass through the protection semiconductor device 730 or may not flow through the protection semiconductor device 730 in accordance with a polarity of a voltage applied to the protection semiconductor device 730. For example, the current may not pass from the second region 720b toward a grounded end portion through the protection semiconductor device 730, whereas the current may flow from the grounded end portion toward the second region 720b through the protection semiconductor device 730. The protection semiconductor device 730 may include a diode or a MOS transistor having a grounded gate. Additionally, one end portion of the protection semiconductor device 130 may be grounded.

The protection semiconductor device 730 may protect the chips formed on the substrate when a high voltage or a high current is applied to the chips through the normal signal pad from outside. For example, the protection semiconductor device 730 electrically connected to the second region 720b to thereby prevent several failures such as soft errors or electrostatic discharges (ESD) of the chips.

The protection semiconductor device 730 may have electrical characteristics substantially different from those of the first to the fourth sensing elements 704b, 796b, 708b and 710b. When the protection semiconductor device 730 includes a diode, the diode may have a resistance substantially different from resistances of the first to the fourth sensing elements 704b, 796b, 708b and 710b.

To detect contact between a probe needle and the probe sensing pad 700, a negative current is applied to the probe needle after contacting the probe needle with the probe sensing pad 700, and then outputted voltages are measured. When the probe needle makes accurately contact with the second region 720b of the probe area 720, the measured voltage outputted may be quite different from that measured in case that the probe needle contacts the first to fourth sensing regions 704a, 706a, 708a and 710a. Therefore, a contact failure of the probe needle and a deflection of the probe needle along an arbitrary direction may be detected using the measured voltage. Further, a position of the probe needle may be rapidly and automatically corrected in accordance with the measured voltages.

In some example embodiments of the present invention, a probe sensing pad may be employed for detecting whether a probe needle makes accurately contact with a desired contact site of the probe sensing pad. Additionally, the probe sensing pad may be sufficiently employed as a normal signal pad for inputting/outputting electric signals into/from chips formed on a substrate. Therefore, the chips may have reduced areas because the probe sensing pad may be used as the normal signal pad without formation of an additional signal pad.

Figure 40:
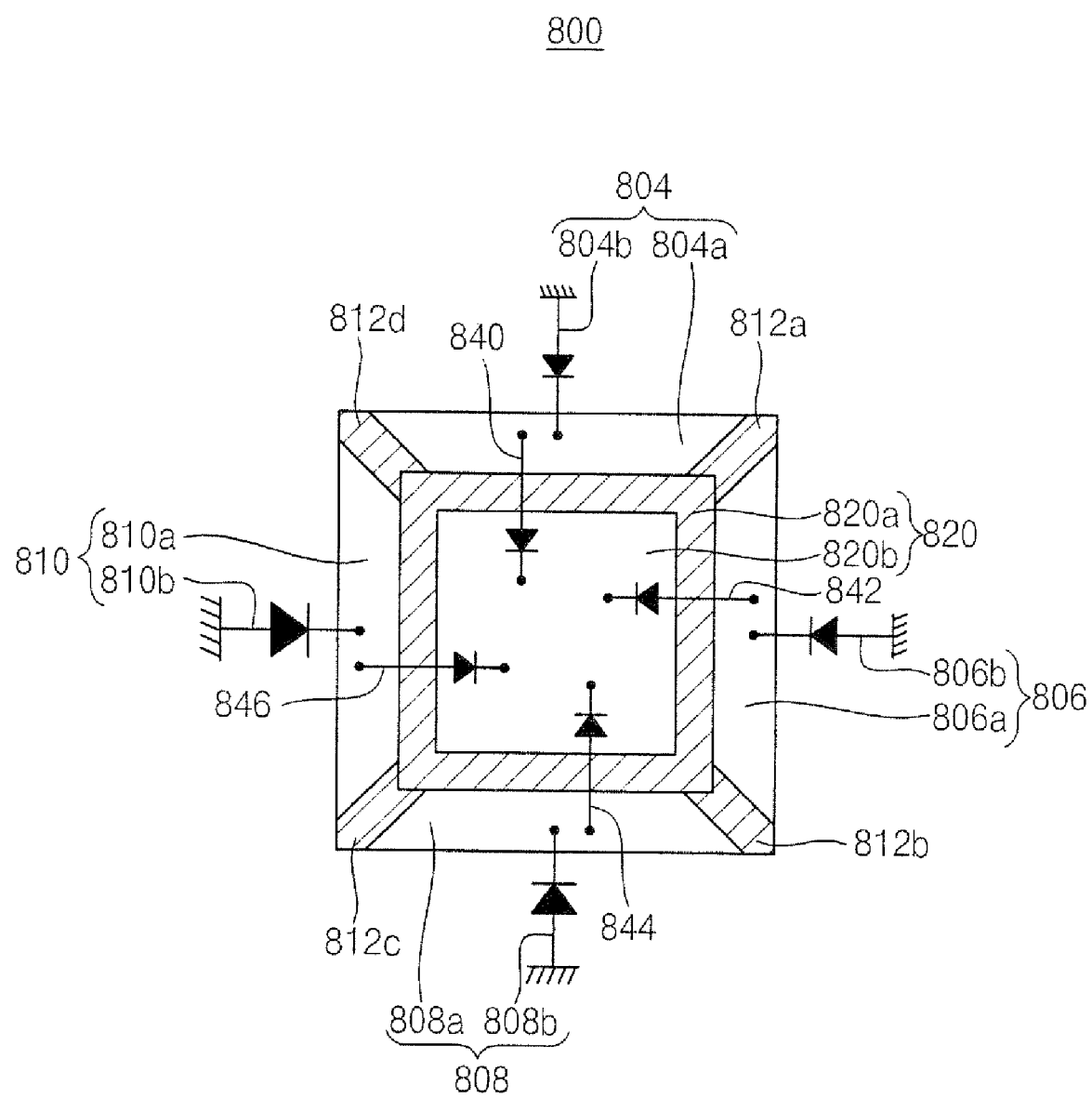
FIG. 40 is a plan view illustrating a probe sensing pad in accordance with example embodiments of the present invention.

FIG. 40 is a plan view illustrating a probe sensing pad 800 in accordance with example embodiments of the present invention. The probe sensing pad 800 in FIG. 40 may have a construction substantially the same as the probe sensing pad shown in FIG. 39 except for protection semiconductor devices.

Referring to FIG. 40, the probe sensing pad 800 includes a rectangular probe area 820 having a first side to a fourth side where a probe needle contacts. The probe area 820 includes a first region 820a and a second region 820b. The first and the second regions 820a and 820b may include different materials, respectively. The first and the second region 820a and 820b are substantially the same as those shown in FIG. 34.

The probe sensing pad 800 includes a first sensing member 804, a second sensing member 806, a third sensing member 808 and a fourth sensing member 810. The first sensing member 804 includes a first sensing region 804a and a first sensing element 804b, and the second sensing member 806 has a second sensing region 806a and a second sensing element 806b. Additionally, the third sensing member 808 has a third sensing region 808a and a third sensing element 808b, and the fourth sensing member 810 includes a fourth sensing region 810a and a fourth sensing element 810b. The probe sensing pad 800 includes a first isolation region 812a, a second isolation region 812b, a third isolation region 812c, and a fourth isolation region 812d. Each of the first to the fourth isolation regions 812a, 812b, 812c, and 812d is interposed between two adjacent sensing regions.

The probe sensing pad 800 further includes a first protection semiconductor device 840, a second protection semiconductor device 842, a third protection semiconductor device 844 and a fourth protection semiconductor device 846. The first to the fourth protection semiconductor devices 840, 842, 844 and 846 are electrically connected to the second region 820b of the probe area 820. Each of the first to the fourth protection semiconductor devices 840, 842, 844 and 846 may include a diode or a MOS transistor having a grounded gate. In an example embodiment, the first to the fourth protection semiconductor devices 840, 842, 844 and 846 includes a fifth diode to a ninth diode, respectively.

The fifth to the ninth diodes may have end portions electrically coupled to the first to the fourth sensing regions 804a, 806a, 808a and 810a. Each of the fifth to the ninth diodes may have a backward direction from the second region 820b toward each of the first to the fourth sensing regions 804a, 806a, 808a and 810a. The fifth diode to the ninth diode may have substantially same electrical characteristics, respectively.

After the probe needle makes contact with the probe sensing pad 800, negative currents are applied to the probe sensing pad 800 through the probe needle. Then, voltages are measured from the probe sensing pad 800 through the probe needle. Hence, a contact failure of the probe needle and a deflection of the probe needle may be accurately detected. Additionally, the deflection of the probe needle and a position of the probe needle may be rapidly and automatically corrected toward a desired normal contact of the probe sensing pad 800.

When a probe needle deviates from a normal contact site of the probe sensing pad 800 along an arbitrary direction, a short failure may frequently occur between the probe area 820 and one of the sensing regions 804a, 806a, 808a, and 810a because of stripped and rubbed conductive material thereof. When the short failure occurs between a probe area 820 and one of the first to the fourth regions 804a, 806a, 808a and 810a, two diodes of the sensing member and the protection semiconductor device may be electrically connected to each other in serial. Accordingly, a position of the probe needle may not be accurately detected. Additionally, when an open/short test process is performed using the probe sensing pad 800, the open/short test process may not output correct results.

In some example embodiments of the present invention, the second region 820b of the probe sensing pad 800 may have an electrical function substantially the same that four unit circuits, respectively including two diodes connected in serial, are grounded. Although the short failure occurs between the probe area 820 and one of the first to the fourth sensing regions 804a, 806a, 808a and 810a due to a contact failure of the probe needle relative to the probe sensing pad 800, each of the sensing elements 804b, 806b, 808b and 810b and the protection semiconductor devices 140, 142, 144 and 146 may be a substantially identical electrical function. Accordingly, a position of the probe needle and a deflection of the probe needle may be accurately detected, and also an open/short test process may be performed to obtain correct results.

Figure 41:
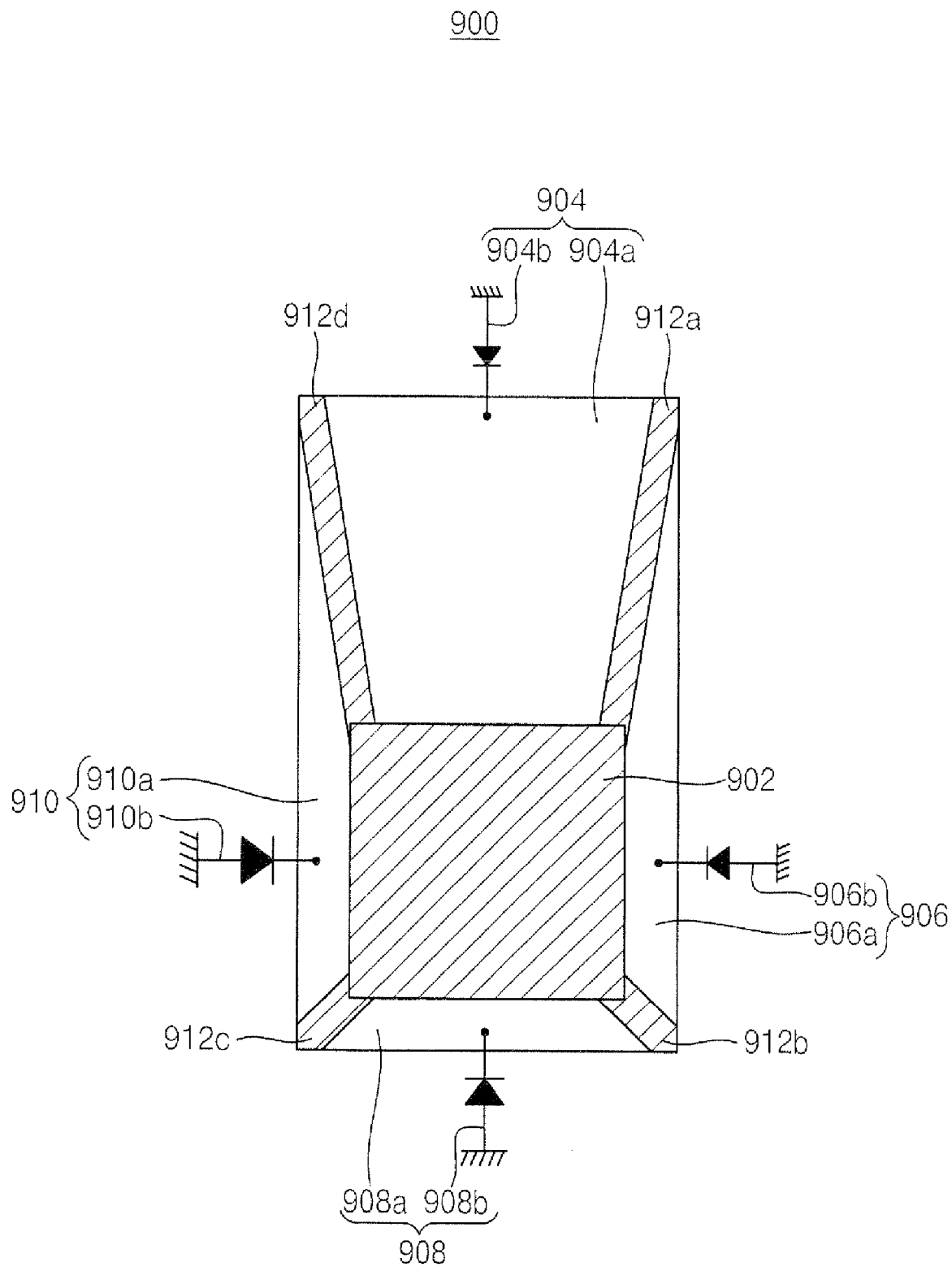
FIG. 41 is a plan view illustrating a probe sensing pad in accordance with example embodiments of the present invention.

FIG. 41 is a plan view illustrating a probe sensing pad 900 in accordance with example embodiments of the present invention. The probe sensing pad 900 in FIG. 41 may be suitable for detecting whether a probe needle makes contact with a predetermined region of the probe sensing pad 900 or deviates from the predetermined region. Particularly, the probe sensing pad 900 may be employed in a multi chip package (MCP) or a wafer biz product for sale on wafer state. The MCP may usually have a contact region and a bonding region. A probe needle may make contact with the contact region during an EDS process whereas wires may be bonded to the bonding region during an assembly process. The wires may not be connected to a damaged portion of the normal signal pad of the MCP or the wafer biz product by the probe needle. When the normal signal pad may have a rectangular shape extending along a predetermined direction, the probe needle may selectively contact with an upper potion or a lower potion of the normal signal pad along the predetermined direction. Thus, the probe sensing pad 900 may be advantageously employed provided for detecting whether the probe needle makes the target area of the normal signal pad or deviates from the target area.

The probe sensing pad 900 in FIG. 41 may have a construction substantially the same as that of the probe sensing pad 100 shown in FIG. 32 except for structures of a first to a fourth sensing regions 904a, 906a, 908a and 910a.

Referring to FIG. 41, the probe sensing pad 900 includes a probe area 902 having a rectangular shape substantially the same as that of the probe sensing pad 100 in FIG. 32. The probe area 902 may have a first side, a second side, a third side and a fourth side. The probe area 902 may correspond to a predetermined target area of a normal signal pad where a probe needle contacts. In contacting a probe card having the probe needle with the probe sensing pad 900 in a chip, the probe needle may make accurately contact with the predetermined target area of the normal signal pad when the probe needle contacts the probe area 902 of the probe sensing pad 900.

The probe sensing pad 900 includes a first sensing member 904, a second sensing member 906, a third sensing member 908 and a fourth sensing member 910.

The first sensing member 904 is provided for detecting whether the probe needle makes good contact with a desired normal contact site of the probe area 902 or deviates from the normal contact site along a first direction. The first sensing member 904 includes a first sensing region 904a and a first sensing element 904b. The first sensing region 904a borders the first side of the probe area 902 and the first sensing element 904b is electrically connected to the first sensing region 904a.

The second sensing member 906 is provided for detecting whether the probe needle makes good contact with the desired normal contact site of the probe area 902 or deviates from the normal contact site along a second direction. The second sensing member 906 includes a second sensing region 906a bordering the second side of the probe area 902, and a second sensing element 906b electrically connected to the second sensing region 906a.

The third sensing member 908 is provided for detecting whether the probe needle makes good contact with the desired normal contact site of the probe area 902 or deviates from the normal contact site along a third direction. The third sensing member 908 includes a third sensing region 908a bordering the third side of the probe area 902, and a third sensing element 908b electrically coupled to the third sensing region 908a.

The fourth sensing member 910 is provided for detecting whether the probe needle makes good contact with the desired normal contact site of the probe area 902 or deviates from the normal contact site along a fourth direction. The fourth sensing member 910 includes a fourth sensing region 910a bordering the fourth side of the probe area 902, and a fourth sensing element 910b electrically connected to the fourth sensing region 910a.

In some example embodiments of the present invention, at least one of the first to the fourth sensing regions 904a, 906a, 908a and 910a may be wider than the probe area 902. For example, the first sensing region 904a may be wider than the probe area 902. Thus, the first sensing region 904a may correspond to a bonding region of a normal signal pad where a wire is connected.

The probe sensing pad 900 further includes a first isolation region 912a, a second isolation region 912b, a third isolation region 912c and a fourth isolation region 912d. Each of the first to the fourth isolation regions 912a, 912b, 912c and 912d electrically insulates adjacent two sensing regions.

A probe needle makes contact with the probe sensing pad 900, and then a voltage is measured from the probe sensing pad 900 through the probe needle after a negative current is applied to the probe sensing pad 900 through the probe needle. A contact failure between the probe needle and the probe sensing pad 900 may be easily detected, and also a deflection of the probe needle may be rapidly detected. Thus, a position of the probe needle may be rapidly and automatically corrected when the probe needle deviates from a desired contact site of the probe sensing pad 900.

In some example embodiments of the present invention, two opposite sensing regions among the first to the fourth sensing regions 904a, 906a, 908a and 910a may be enlarged so as to have areas wider than the probe area 902.

Figure 42:
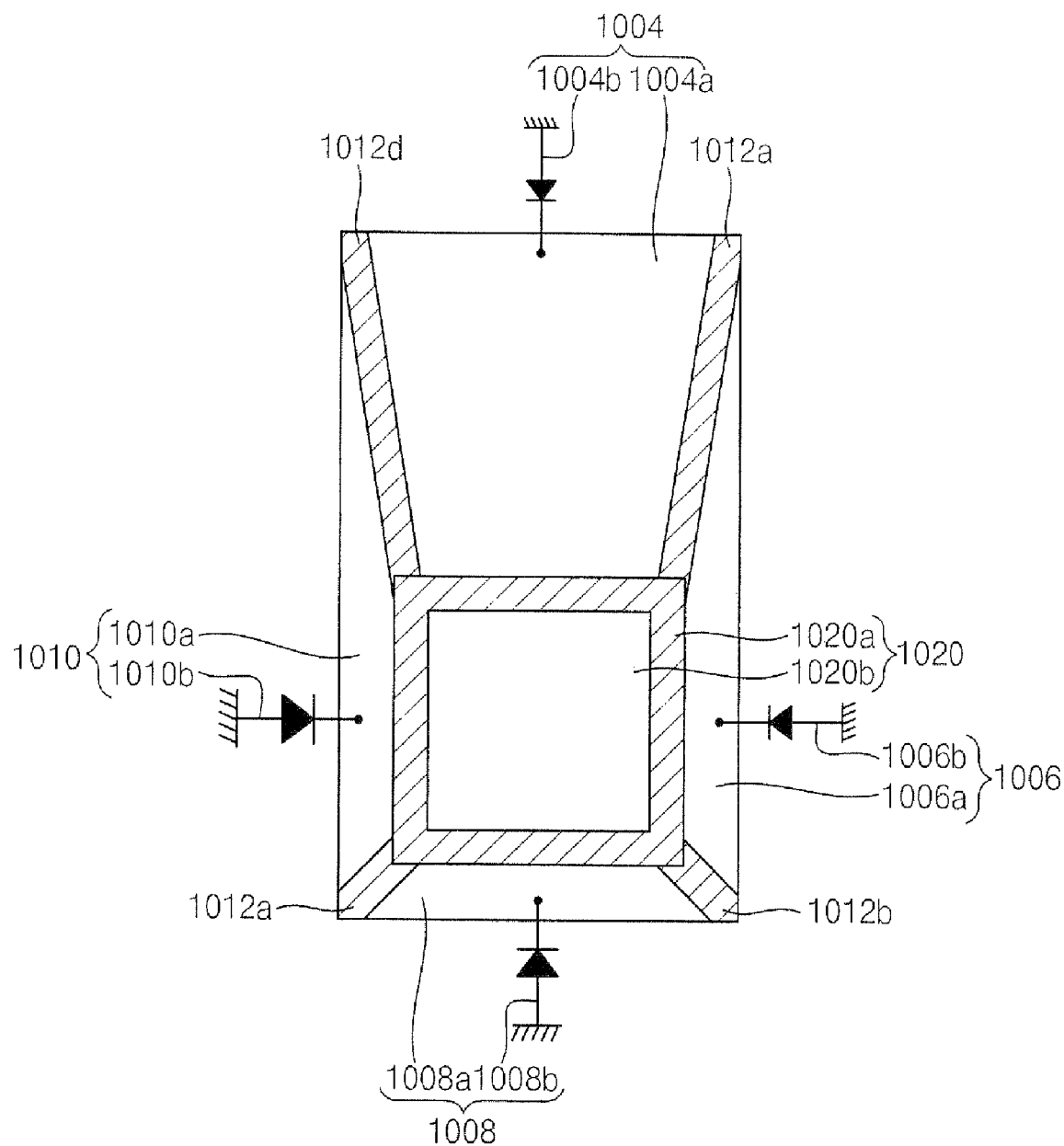
FIG. 42 is a plan view illustrating a probe sensing pad in accordance with example embodiments of the present invention.

FIG. 42 is a plan view illustrating a probe sensing pad 1000 in accordance with example embodiments of the present invention. The probe sensing pad 1000 in FIG. 42 may have a construction substantially the same as the probe sensing pad 700 shown in FIG. 39 except for sensing regions.

Referring to FIG. 42, the probe sensing pad 1000 includes a probe area 1020 having a first region 1020a and a second region 1020b. The first region 1020a may enclose the second region 1020b. The first region 1020a may include an insulation material and the second region 1020b may include a conductive material such as metal.

The probe sensing pad 1000 includes a first sensing member 1004, a second sensing member 1006, a third sensing member 1008 and a fourth sensing member 1010.

The first sensing member 1004 is provided for detecting whether a probe needle makes good contact with a desired normal contact site of the probe area 1020 or deviates from the normal contact site along a first direction. The first sensing member 1004 includes a first sensing region 1004a and a first sensing element 1004b. The first sensing region 1004a borders a first side of the first region 1020a of the probe area 1020 and the first sensing element 1004b is electrically connected to the first sensing region 1004a.

The second sensing member 1006 is provided for detecting whether the probe needle makes good contact with the desired normal contact site of the probe area 1020 or deviates from the normal contact site along a second direction. The second sensing member 1006 includes a second sensing region 1006a bordering a second side of the first region 1020a of the probe area 1002, and a second sensing element 1006b electrically connected to the second sensing region 1006a.

The third sensing member 1008 is provided for detecting whether the probe needle makes good contact with the desired normal contact site of the probe area 1020 or deviates from the normal contact site along a third direction. The third sensing member 1008 includes a third sensing region 1008a bordering a third side of the first region 1020a of the probe area 902, and a third sensing element 1008b electrically coupled to the third sensing region 1008a.

The fourth sensing member 1010 is provided for detecting whether the probe needle makes good contact with the desired normal contact site of the probe area 1020 or deviates from the normal contact site along a fourth direction. The fourth sensing member 1010 includes a fourth sensing region 1010a bordering a fourth side of the first region 1020a of the probe area 1020, and a fourth sensing element 1010b electrically connected to the fourth sensing region 1010a.

In some example embodiments of the present invention, at least one of the first to the fourth sensing regions 1004a, 1006a, 1008a and 1010a may be wider than the probe area 1020. For example, the first sensing region 1004a may be wider than the probe area 1020.

In some example embodiments of the present invention, two opposite sensing regions among the first to the fourth sensing regions 1004a, 1006a, 1008a and 1010a may be enlarged so as to have areas wider than the probe area 1020.

The probe sensing pad 1000 further includes a first isolation region 1012a, a second isolation region 1012b, a third isolation region 1012c and a fourth isolation region 1012d. Each of the first to the fourth isolation regions 1012a, 1012b, 1012c and 1012d electrically insulates adjacent two sensing regions.

After a probe needle makes contact with the probe sensing pad 1000, a negative current is applied to the probe sensing pad 1000 through the probe needle. Then, a voltage is measured from the probe sensing pad 1000 through the probe needle so that a contact failure between the probe needle and the probe sensing pad 1000 may be easily detected, and also a deflection of the probe needle may be rapidly detected. Hence, a position of the probe needle may be rapidly and automatically corrected when the probe needle deviates from a desired contact site of the probe sensing pad 1000.

In some example embodiments of the present invention, the second region 1020b of the probe area 1020 may include a material substantially harder than that of the first region 1020a so that elements and/or wirings under the probe sensing pad 1000 may be effectively protected even though the probe needle makes strong contact with the probe sensing pad 1000.

Figure 43:
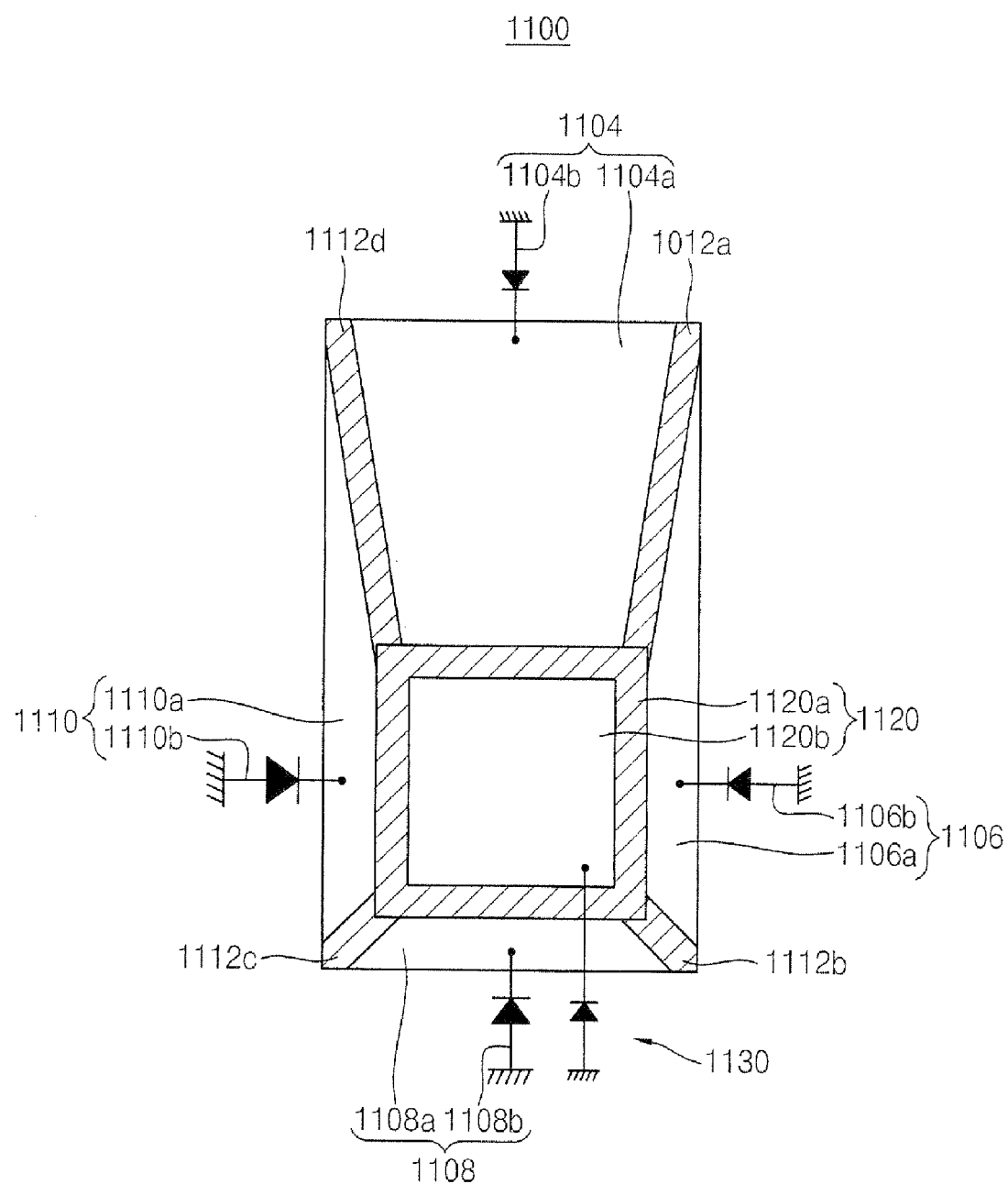
FIG. 43 is a plan view illustrating a probe sensing pad in accordance with example embodiments of the present invention.

FIG. 43 is a plan view illustrating a probe sensing pad 1100 in accordance with example embodiments of the present invention. The probe sensing pad 1100 illustrated in FIG. 43 may have a construction substantially the same as that of the probe sensing pad 800 shown in FIG. 40 except for sensing regions.

Referring to FIG. 43, the probe sensing pad 1100 includes a probe area 1120 having a first region 1120a and a second region 1120b. The probe sensing pad 1100 additionally includes a first sensing member 1104, a second sensing member 1106, a third sensing member 1108 and a fourth sensing member 1110.

The first sensing member 1104 includes a first sensing region 1104a and a first sensing element 1104b, and the second sensing member 1106 has a second sensing region 1106a and a second sensing element 1106. Further, the third sensing member 1108 includes a third sensing region 1108a and a third sensing element 1108b, and the fourth sensing member 1110 has a fourth sensing region 1110a and a fourth sensing element 110b.

In one example embodiment of the present invention, at least one of the first to the fourth sensing regions 1104a, 1106a, 1108a and 1110a may be wider than the probe area 1120. For example, the first sensing region 1104a may be wider than the probe area 1120. In another example embodiment of the present invention, two opposite sensing regions among the first to the fourth sensing regions 1104a, 1106a, 1108a and 1110a may be enlarged so as to have areas wider than the probe area 1020.

The probe sensing pad 1100 further includes four isolation regions 1112a, 1112b, 1112c and 1112d for electrically insulating adjacent sensing regions, respectively.

The probe sensing pad 1100 in FIG. 43 may be employed for detecting a contact failure of a probe needle relative to the probe sensing pad 1100. Further, the probe sensing pad 1100 may be advantageously employed as a normal signal pad for inputting/outputting electrical signals into/from a chip. Therefore, the chip may have a reduced area without any additional normal signal pad because of the probe sensing pad 1100.

Figure 44:
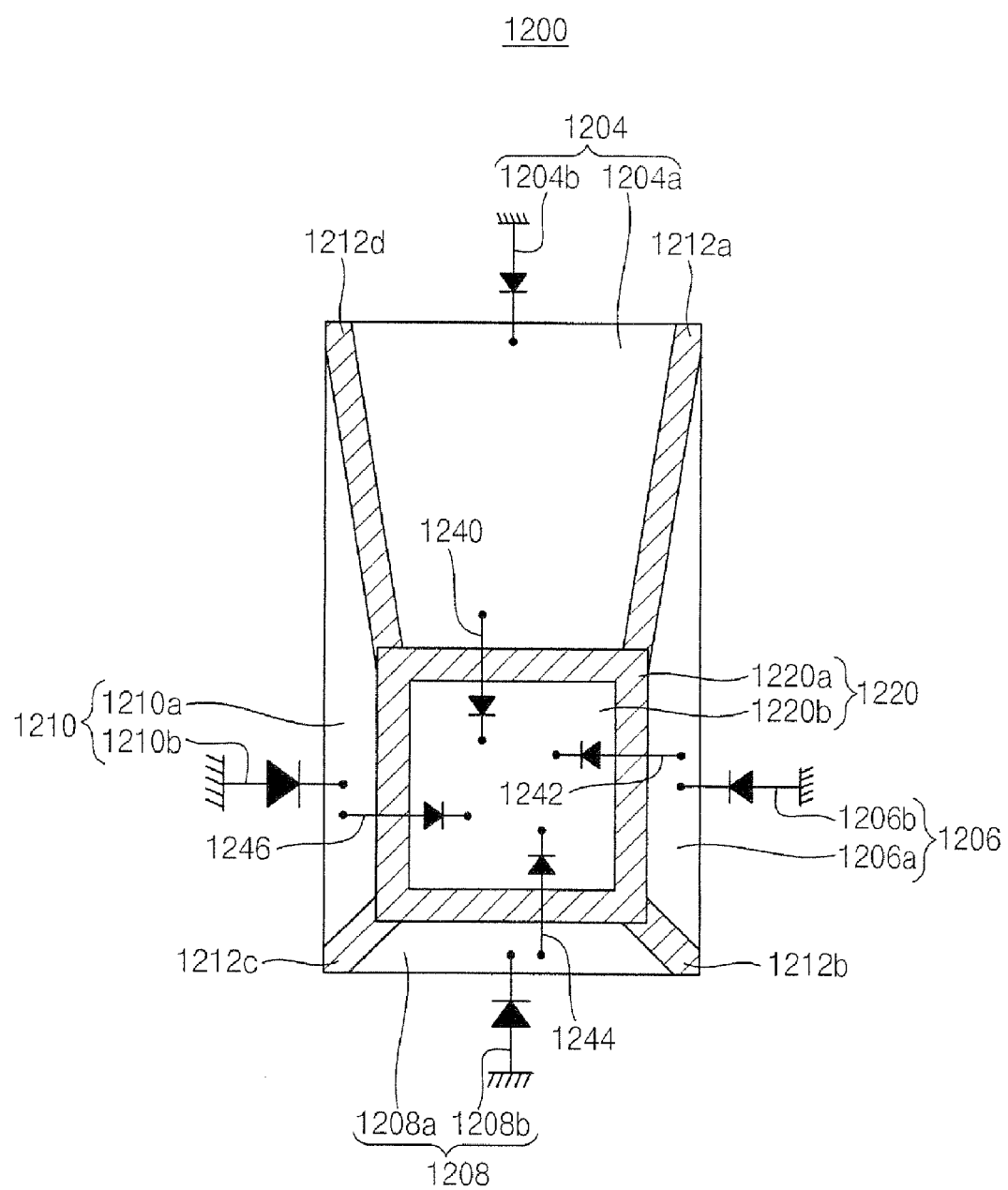
FIG. 44 is a plan view illustrating a probe sensing pad in accordance with example embodiments of the present invention.

FIG. 44 is a plan view illustrating a probe sensing pad 1200 in accordance with example embodiments of the present invention. The probe sensing pad 1200 illustrated in FIG. 44 may have a construction substantially the same as that of the probe sensing pad 1000 shown in FIG. 42 except for a protection member including protection semiconductor devices.

Referring to FIG. 44, the probe sensing pad 1200 includes a probe area 1220 having a first region 1220a and a second region 1220b enclosed by the first region 1220a.

A first sensing member 1204 includes a first sensing region 1204a and a first sensing element 1204b, and a second sensing member 1206 includes a second sensing region 1206a and a second sensing element 1206b. Additionally, a third sensing member 1208 has a third sensing region 1208a and a third sensing element 1208b, and a fourth sensing member 1210 includes a fourth sensing region 1210a and a fourth sensing element 1210b. The probe sensing pad 1200 includes four isolation regions 1212a, 1212b, 1212c and 1212d for electrically insulating adjacent sensing regions.

The probe sensing pad 1200 further includes a first protection semiconductor device 1240, a second protection semiconductor device 1242, a third protection semiconductor device 1244 and a fourth protection semiconductor device 1246. Each of the first to the fourth protection semiconductor devices 1240, 1242, 1244 and 1246 is electrically connected to the second region 1220b of the probe area 1220.

Although a short failure occurs between the probe area 1220 and one of the first to fourth sensing regions 1204a, 1206a, 1208a and 1220a due to a deflection the probe needle along an arbitrary direction, an open/short test process may be performed using the probe sensing pad 1200 to thereby obtain accurate result.

Figure 45:
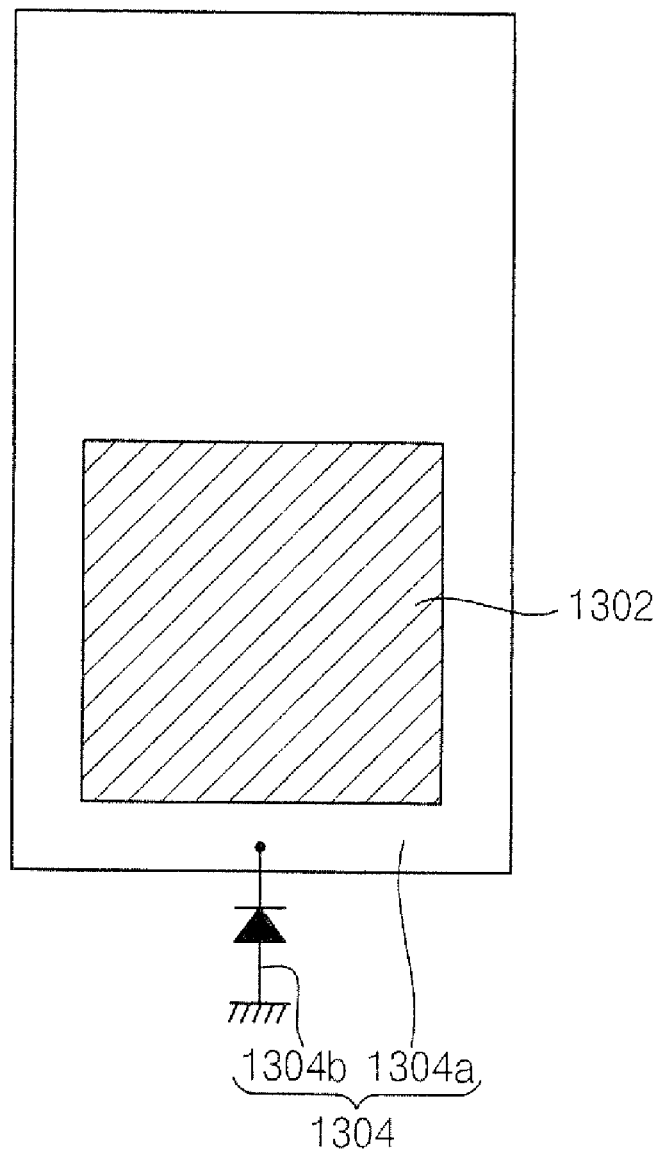
FIG. 45 is a plan view illustrating a probe sensing pad in accordance with example embodiments of the present invention.

FIG. 45 is a plan view illustrating a probe sensing pad 1300 in accordance with example embodiment of the present invention.

Referring to FIG. 45, the probe sensing pad 1300 includes a rectangular probe area 1302 having a first side, a second side, a third side and a fourth side. When a probe needle makes contact with a desired normal contact site of the probe sensing pad 1300, the probe needle may contact the probe area 1302 of the probe sensing pad 1300.

The probe sensing pad 1300 includes a sensing member 1304 having a sensing region 1304a and a sensing element 1304b. The sensing region 1304a may have a rectangular ring shape enclosing the probe area 1302. That is, the sensing region 1304a contacts peripheral portions of the probe area 1302. The sensing region 1304a may include a conductive material. At least one portion of the sensing region 1304a bordering the probe area 1302 may have an area substantially wider than that of the probe area 1302. For example, a portion of the sensing region 1304a contacting the first side of the probe area 1302 may be substantially wider than the probe area 1302. The sensing element 1304b is electrically coupled to the sensing region 1304a.

The sensing region 1304a of the sensing member 1304 may include metal. Opposite portions of the sensing region 1304a may have substantially same sizes and shapes. Additionally, one end portion of the sensing element 1304b is grounded.

The sensing element 1304b may include a semiconductor device in which a current may flow or may not pass through the sensing element 1304b in accordance with a direction of an applied voltage. For example, the sensing element 1304b may include a diode and a MOS transistor having a grounded gate.

The probe sensing pad 1300 having the above-described construction, may easily detect whether a probe needle makes accurately contact with a predetermined contact site of the probe sensing pad 1300 or deviates from the predetermined contact site.

Figure 46:
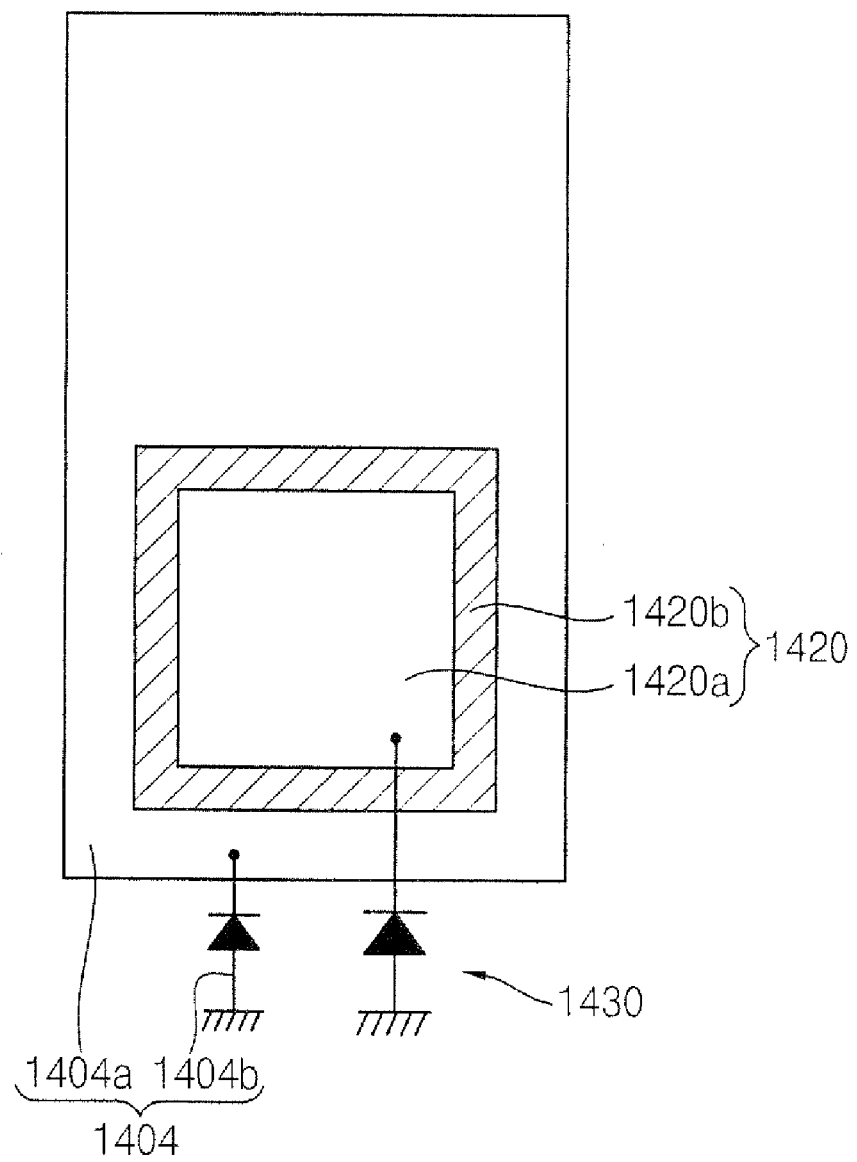
FIG. 46 is a plan view illustrating a probe sensing pad in accordance with example embodiments of the present invention.

FIG. 46 is a plan view illustrating a probe sensing pad 1400 in accordance with example embodiments of the present invention. In FIG. 46, the probe sensing pad 1400 may have a construction substantially the same as that of the probe sensing pad 1300 shown in FIG. 45 except for a probe area 1420.

Referring to FIG. 46, the probe sensing pad 1400 includes a rectangular probe area 1420 having a first region 1420b and a second region 1420a. The first region 1420a has a first side to a fourth side. The first and the second regions 1420b and 1420a may include different materials, respectively.

The probe sensing pad 1400 includes a sensing member 1404 substantially the same that of the probe sensing pad 1300 shown in FIG. 45. The sensing member 1404 includes a sensing region 1404a and a sensing element 1404b.

The first region 1420b of the probe area 1420 may have a rectangular ring shape and may enclose the second region 1420a. That is, a central portion of the probe area 1420 may correspond to the second region 1420a whereas a peripheral portion of the probe area 1420 may correspond to the first region 1420b. The first region 1420b may include an insulation material whereas the second region 1420a may include a conductive material such as metal.

The first region 1420b may electrically insulate the second region 1420a from the sensing region 1404a. When a probe needle makes contact with a desired normal contact site of the probe sensing pad 1400, the probe needle may contact the second region 1420a of the probe area 1420.

In some example embodiments of the present invention, an additional sensing element 1430 may be electrically coupled to the second region 1420a of the probe area 1420. The additional sensing element 1430 may have electric characteristics substantially different from the sensing element 1404b of the sensing member 1404. The additional sensing element 1430 includes a grounded end portion. The additional sensing element 1430 may include a diode and a MOS transistor having a grounded gate. For example, the additional sensing element 1430 may include a diode.

The additional sensing element 1430 may have a forward direction from the second region 1420*a* toward the grounded end portion thereof. When a forward bias is applied to the additional sensing element 1430, the additional sensing element 1430 may have a resistance substantially different from that of the sensing element 1404*b*.

After a probe needle makes contact with the probe sensing pad 1400, a negative current is applied to the probe sensing pad 1400 through the probe needle. Then, a voltage is measured from the probe sensing pad 1400 through the probe needle so that a contact failure of the probe needle relative to the probe sensing pad 1400 may be easily detected, and also a position and a direction of the probe needle may be easily detected.

Figure 47:
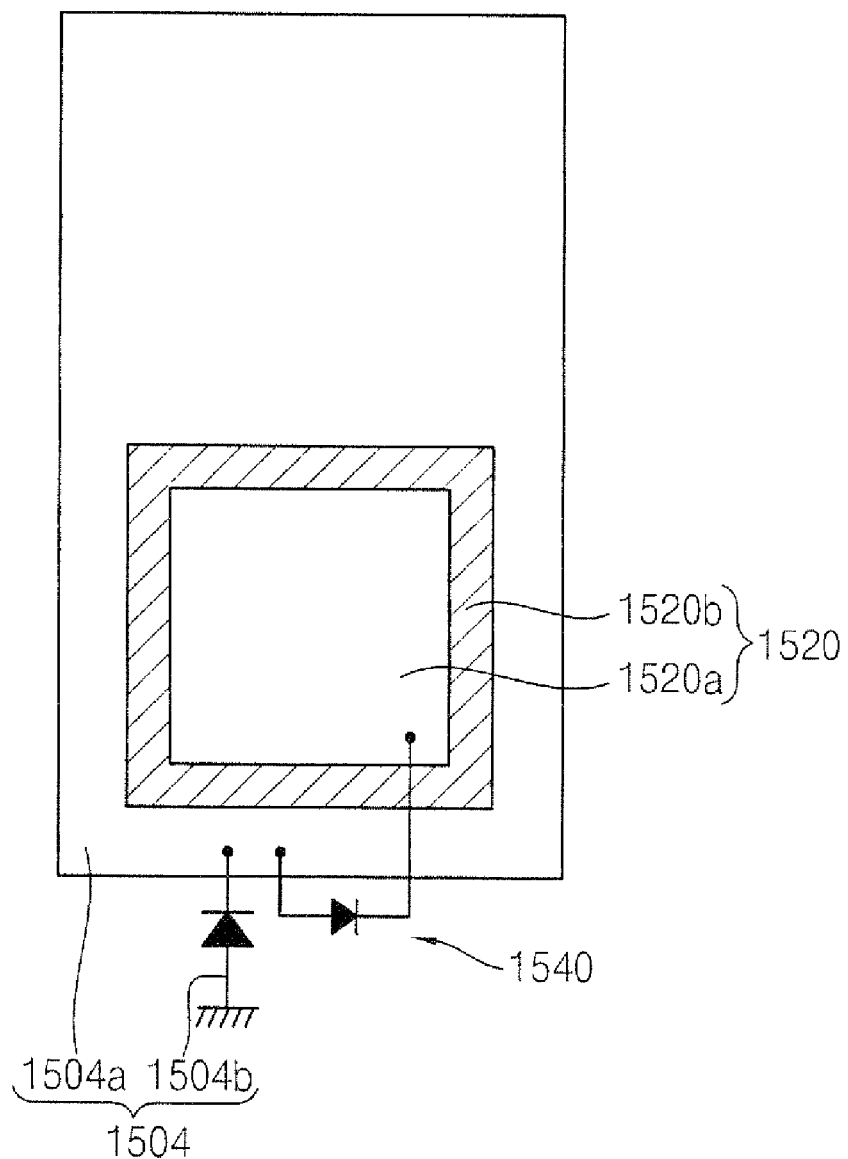
FIG. 47 is a plan view illustrating a probe sensing pad in accordance with example embodiments of the present invention.

FIG. 47 is a plan view illustrating a probe sensing pad 1500 in accordance with example embodiments of the present invention. The probe sensing pad 1500 in FIG. 47 may have a construction substantially the same as that of the probe sensing pad 1400 shown in FIG. 46 except for an additional sensing element 1540.

Referring to FIG. 47, the probe sensing pad 1500 includes a probe area 1520 and a sensing member 1504. The probe area 1520 and the sensing member 1504 may be substantially the same as those of the probe sensing pad 1400 shown in FIG. 46. That is, the probe area 1520 includes a first region 1520*b* and a second region 1520*a*. In addition, the sensing member 1504 includes a sensing region 1504*a* and a sensing element 1504*b*.

The additional sensing element 1540 is electrically connected to the sensing region 1504*a* and a second region 1520*a*. The additional sensing element 1540 may include a diode and a MOS transistor having a grounded gate. The additional sensing element 1540 may have electrical characteristics substantially the same as or different from those of the sensing element 1504*b* of the sensing member 1504. For example, the additional sensing element 1540 may have a diode having electric characteristics substantially the same as that of the sensing element 1504*b*. The diode may have a backward direction from the second region 1520*a* of the probe area 1520 toward the sensing region 1504*a* of the sensing member 1504.

A probe needle makes contact with the probe sensing pad 1500, and then a voltage is measured from the probe sensing pad 1500 through the probe needle after applying a negative current to the probe sensing pad 1500 through the probe needle. Thus, a contact failure of the probe needle and a deflection of the probe needle may be easily are detected. Further, a position of the probe needle may be rapidly corrected toward a desired normal contact site of the probe sensing pad with reference to the deflection of the probe needle.

According to example embodiments of the present invention, after detecting whether a probe needle contacts a desired normal contact site of a probe sensing pad or deviates from the normal contact site, operations and electrical characteristics of chips on a substrate may be advantageously checked in an EDS process. When the probe needle is deflected from the normal contact site of the probe sensing pad along an arbitrary direction, a direction of the probe needle may be detected and may be automatically corrected. Thus, damage to an edge portion of the probe sensing pad caused by the probe needle may be effectively prevented, thereby reducing a failure of the probe sensing pad.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A probe sensing pad comprising:
   a probe area;
   a first sensing region contiguous with a first peripheral portion of the probe area;
   a first sensing element electrically coupled to the first sensing region;
   a second sensing region continuous with a second peripheral portion of the probe area;
   a second sensing element electrically coupled to the second sensing region, the second sensing element having different electrical characteristics than the first sensing element; and
   a first isolation region positioned between the first and the second sensing regions adapted to electrically separate the first sensing region from the second sensing region.

2. The probe sensing pad of claim 1, wherein the first sensing element includes a first diode having a first resistance, and the second sensing element includes a second diode having a second resistance different from the first resistance.

3. The probe sensing pad of claim 1, wherein the first sensing element includes a first number of diodes and the second sensing element includes a second number of diodes, wherein the second number is different than the first number.

4. The probe sensing pad of claim 1, wherein the first sensing element includes a first MOS transistor having a first effective resistance, and the second sensing element includes a second MOS transistor having a second effective resistance different from the first effective resistance.

5. The probe sensing pad of claim 1, wherein the first sensing element includes a first number of MOS transistors and the second sensing element includes a second number of MOS transistors, wherein the second number is different than the first number.

6. The probe sensing pad of claim 1, wherein the first sensing element includes a first resistor having a first resistance, and the second sensing element includes a second resistor having a second resistance different from the first resistance.

7. The probe sensing pad of claim 1, wherein the first sensing element includes a first number of MOS transistors and the second sensing element includes a second number of MOS transistors, wherein the second number is different than the first number.

8. The probe sensing pad of claim 1, wherein the probe region includes an inner region formed of a conductive material and an outer region of an insulation material, including first and second peripheral portions, enclosing the inner region.

9. The probe sensing pad of claim 8, further including a protection semiconductor device electrically coupled to the inner region of the probe region.

10. The probe sensing pad of claim 9, wherein the protection semiconductor device includes a diode or a MOS transistor having a grounded gate electrically coupled between the inner region of the probe region and a ground.

11. The probe sensing pad of claim 8, further including:
a first protection semiconductor device electrically coupled between the inner region of the probe region and the first sensing region; and
a second protection semiconductor device electrically coupled between the inner region of the probe and the second sensing region.

12. The probe sensing pad of claim 11, wherein the first and the second protection semiconductor devices each include a diode or a MOS transistor having a grounded gate.

13. The probe sensing pad of claim 1, wherein one of the sensing regions is substantially wider than the probe area.

14. The probe sensing pad of claim 1, further including:
a third sensing region contiguous with a third peripheral portion of the probe area;
a third sensing element electrically coupled to the third sensing region and having different electrical characteristics than the first and the second sensing elements;
a fourth sensing region continuous with a fourth peripheral portion of the probe area;
a fourth sensing element electrically coupled to the fourth sensing region, the fourth sensing element having different electrical characteristics than the first, the second, and the third sensing elements;
a second isolation region positioned between the second and the third sensing regions;
a third isolation region positioned between the third and the fourth sensing regions; and
a fourth isolation region positioned between the fourth and the first sensing regions, each of said sensing regions being adapted to electrically separate adjacent sensing regions from one another.

15. The probe sensing pad of claim 14, wherein the first through the fourth peripheral regions correspond to first through the fourth sides of a rectangular probe area.

16. The probe sensing pad of claim 15, wherein two opposite sensing regions among the first to the fourth sensing regions have areas substantially wider than the probe area.

17. The probe sensing pad of claim 14, wherein the first through the fourth sensing elements include semiconductor devices through which currents may uni-directionally pass.

18. The probe sensing pad of claim 17, wherein the semiconductor devices of the first through the fourth sensing elements are diodes or MOS transistors having a grounded gate.

19. The probe sensing pad of claim 18, wherein the first sensing element includes one diode, the second sensing element includes two diodes electrically coupled in parallel to the second sensing region, the third sensing element includes three diodes electrically coupled in parallel to the third sensing region, and the fourth sensing element includes four diodes electrically coupled in parallel to the fourth sensing region.

20. The probe sensing pad of claim 18, wherein the first sensing element includes one MOS transistor, the second sensing element includes two MOS transistors electrically coupled in parallel to the second sensing region, the third sensing element includes three MOS transistors electrically coupled in parallel to the third sensing region, and the fourth sensing element includes four MOS transistors electrically coupled in parallel to the fourth sensing region.

21. The probe sensing pad of claim 1, wherein the probe region includes an inner region and outer region enclosing the inner region, the inner region being formed of a material substantially harder than that of the outer region.

22. A probe sensing pad comprising:
a probe area making contact with a probe needle, wherein the probe area having a rectangular shape including a first side, a second side, a third side and a forth side;
a first sensing member for detecting whether the probe needle contacts a desired contact site of the probe area or deviates from the desired contact site along a first direction, wherein the first sensing member includes a first sensing region making contact with the first side of the probe area, and a first sensing element electrically connected to the first sensing region;
a second sensing member for detecting whether the probe needle contacts the desired contact site of the probe area or deviates from the desired contact site along a second direction, wherein the second sensing member includes a second sensing region making contact with the second side of the probe area, and a second sensing element electrically connected to the second sensing region;
a third sensing member for detecting whether the probe needle contacts the desired contact site of the probe area or deviates from the desired contact site along a third direction, wherein the third sensing member includes a third sensing region making contact with the third side of the probe area, and a third sensing element electrically connected to the third sensing region;
a fourth sensing member for detecting whether the probe needle contacts the desired contact site of the probe area or deviates from the desired contact site along a fourth direction, wherein the fourth sensing member includes a fourth sensing region making contact with the fourth side of the probe area, and a fourth sensing element electrically connected to the fourth sensing region; and
an isolation member for electrically insulating adjacent sensing regions.

23. The probe sensing pad of claim 22, wherein the isolation member comprises:
a first isolation region between the first and the second sensing regions;
a second isolation region between the second and the third sensing regions;
a third isolation region between the third and the fourth sensing regions; and
a fourth isolation region between the fourth and the first sensing regions.

24. The probe sensing pad of claim 22, wherein the first to the fourth sensing regions comprise conductive materials, respectively.

25. The probe sensing pad of claim 22, wherein the probe area comprises an insulation material.

26. The probe sensing pad of claim 25, further comprising at least one protection semiconductor device electrically connected to the second region of the probe area.

27. The probe sensing pad of claim 25, wherein the probe sensing pad comprises four protection semiconductor devices including diodes or MOS transistors having grounded gates, respectively,
wherein each of the four protection semiconductor devices is electrically connected to the first to the fourth sensing regions, and wherein each of the four protection semiconductor devices has a backward direction from the second region of the probe area toward each of the first to the fourth sensing regions.

28. The probe sensing pad of claim 27, wherein the four protection semiconductors have substantially the same resistances.

29. The probe sensing pad of claim 22, wherein the probe area comprises:
   a first region making contact with the first sensing region to the fourth sensing region, the first region including an insulation material; and
   a second region enclosed by the first region, the second region including a metal.

30. The probe sensing pad of claim 29, wherein the protection semiconductor device comprises a diode or a MOS transistor having a grounded gate, and
   wherein the protection semiconductor device has a backward direction from the second region of the probe area toward a grounded end portion of the protection semiconductor device.

31. The probe sensing pad of claim 22, wherein the first to the fourth sensing elements have different resistances.

32. The probe sensing pad of claim 31, wherein the first to the fourth sensing elements comprise diodes having substantially the same resistances or MOS transistors including grounded gates,
   wherein the number of the diodes or the MOS transistor is different from one another, and
   wherein each of the first to the fourth sensing elements has a backward direction from each of the first to the fourth sensing regions toward each of grounded end portions of the first to the fourth sensing elements.

33. The probe sensing pad of claim 31, wherein the first to the fourth sensing elements comprise diodes having different sizes or MOS transistors including grounded gates, and
   wherein each of the first to the fourth sensing elements has a backward direction from each of the first to the fourth sensing regions toward each of grounded end portions of the first to the fourth sensing elements.

34. The probe sensing pad of claim 31, wherein the first to the fourth sensing elements comprise resistors having different resistances, and
   wherein the resistors including grounded end portions, respectively.

35. The probe sensing pad of claim 22, wherein at least one of the first to the fourth sensing regions is substantially wider than an opposite sensing region.

36. The probe sensing pad of claim 35, wherein at least one of the first to the fourth sensing regions is substantially wider than the probe area.

37. A probe sensing pad in a semiconductor device comprising:
   a probe area adapted for contact with a probe needle, wherein the probe area has a rectangular shape including a first side, a second side, a third side and a forth side;
   a sensing region contacting peripheral portions of the probe area, at least one portion of the sensing region having an area substantially wider than that of the probe area; and
   a sensing element electrically coupled to the sensing region for detecting contact of the probe needle on the sensing region as opposed to the probe area.

38. The probe sensing pad of claim 37, further including a sensing member comprising sensing regions making contact with the first to the fourth sides of the probe area, and sensing elements electrically connected to the sensing regions, the sensing regions including conductive materials,
   wherein one of the sensing regions contacting one of the first to the fourth sides is substantially wider than the probe area.

39. The probe sensing pad of claim 38, wherein the sensing elements independently comprise a diode, a MOS transistor having a grounded gate or a resistor, and
   wherein each of the sensing elements has a grounded end portion.

40. The probe sensing pad of claim 37, wherein the sensing regions comprise metals.

41. The probe sensing pad of claim 37, wherein the probe area comprises an insulation material.

42. The probe sensing pad of claim 40, further comprising a protection semiconductor device electrically connected to the second region of the probe area.

43. The probe sensing pad of claim 37, wherein the probe area comprises:
   a first region making contact with the sensing regions, the first region including an insulation material; and
   a second region enclosed by the first region, the second region including a metal.

44. The probe sensing pad of claim 43, wherein the protection semiconductor device comprises a diode or a MOS transistor having a grounded gate, and
   wherein the protection semiconductor device has a backward direction from the second region toward a grounded end portion of the protection semiconductor device.

45. The method of claim 43, wherein the protection semiconductor device comprises a diode or a MOS transistor having a grounded gate, and
   wherein the protection semiconductor device has a backward direction from an grounded end portion of the protection semiconductor device toward the sensing regions.

46. A method of detecting a position of a probe needle relative to a probe sensing pad in a semiconductor device, comprising:
   contacting a probe needle with the probe sensing pad that comprises a probe area, at least two sensing regions making contact with peripheral portions of the probe area, sensing elements having different electrical characteristics and being connected to corresponding sensing regions, and an isolation member for electrically insulating adjacent sensing regions;
   applying an electrical signal to the probe needle along a forward direction from the probe needle toward a grounded end portion of the probe sensing pad;
   measuring a voltage between the probe needle and the grounded end portion of the probe sensing pad; and
   determining a position of the probe needle using the measured voltage.

47. The method of claim 46, wherein the sensing elements have different resistances, respectively.

48. The method of claim 46, after determining the position of the probe needle, further comprising;
   correcting the position of the probe needle toward a desired contact site of the probe sensing pad with reference to a deflection of the probe needle.

* * * * *

UNITED STATES PATENT AND TRADEMARK OFFICE
CERTIFICATE OF CORRECTION

PATENT NO. : 7,612,573 B2 Page 1 of 1
APPLICATION NO. : 11/565471
DATED : November 3, 2009
INVENTOR(S) : Kun-Up Kim et al.

It is certified that error appears in the above-identified patent and that said Letters Patent is hereby corrected as shown below:

Column 9, line 25, the word "cm" should read -- $\mu m$ --;
Column 35, line 11, the word "110b" should read -- 1110b --;
Column 42, line 16, the words "claim 40," should read -- claim 41, --.

Signed and Sealed this

Thirtieth Day of March, 2010

David J. Kappos
*Director of the United States Patent and Trademark Office*